US011725928B2

(12) United States Patent
Döring et al.

(10) Patent No.: US 11,725,928 B2
(45) Date of Patent: Aug. 15, 2023

(54) HANDHELD THREE-DIMENSIONAL COORDINATE MEASURING DEVICE OPERATIVELY COUPLED TO A MOBILE COMPUTING DEVICE

(71) Applicant: FARO Technologies, Inc., Lake Mary, FL (US)

(72) Inventors: Daniel Döring, Ditzingen (DE); Rolf Heidemann, Stuttgart (DE); Martin Ossig, Tamm (DE); Gerrit Hillebrand, Waiblingen (DE)

(73) Assignee: FARO Technologies, Inc., Lake Mary, FL (US)

( * ) Notice: Subject to any disclaimer, the term of this patent is extended or adjusted under 35 U.S.C. 154(b) by 0 days.

(21) Appl. No.: 17/717,683

(22) Filed: Apr. 11, 2022

(65) Prior Publication Data
US 2022/0236048 A1 Jul. 28, 2022

Related U.S. Application Data

(63) Continuation of application No. 17/147,925, filed on Jan. 13, 2021, now Pat. No. 11,300,400, which is a (Continued)

(51) Int. Cl.
*G01B 11/00* (2006.01)
*G01K 3/00* (2006.01)
(Continued)

(52) U.S. Cl.
CPC ............ *G01B 11/002* (2013.01); *G01K 3/005* (2013.01); *G01K 13/00* (2013.01); *H10N 10/13* (2023.02); *H10N 10/80* (2023.02)

(58) Field of Classification Search
CPC . G01B 11/25; G01B 11/2545; G01B 11/2513; G01B 11/002; G01B 11/245;
(Continued)

(56) References Cited

U.S. PATENT DOCUMENTS 4,760,269 A 7/1988 McKenna
7,912,673 B2 3/2011 Hébert et al.
(Continued)

FOREIGN PATENT DOCUMENTS

CA 2364888 C * 9/2010 ........... G01B 11/245
CN 106127796 B 3/2019
(Continued)

OTHER PUBLICATIONS

European Search Report Issued in European Application No. 20161788.3-1010 dated Aug. 12, 2020; 8 Pages.

*Primary Examiner* — Michael P Stafira
(74) *Attorney, Agent, or Firm* — McCarter & English, LLP; Dave Christensen; David K. Kincaid

(57) ABSTRACT

A handheld device has a projector that projects a pattern of light onto an object, a first camera that captures the projected pattern of light in first images, a second camera that captures the projected pattern of light in second images, a registration camera that captures a succession of third images, one or more processors that determines three-dimensional (3D) coordinates of points on the object based at least in part on the projected pattern, the first images, and the second images, the one or more processors being further operable to register the determined 3D coordinates based at least in part on common features extracted from the succession of third images, and a mobile computing device operably connected to the handheld device and cooperating with the one or more processors, the mobile computing device operable to display the registered 3D coordinates of points.

16 Claims, 45 Drawing Sheets

Related U.S. Application Data continuation of application No. 16/806,548, filed on Mar. 2, 2020, now abandoned.

(60) Provisional application No. 62/818,923, filed on Mar. 15, 2019.

(51) Int. Cl.
    *G01K 13/00*     (2021.01)
    *H10N 10/13*     (2023.01)
    *H10N 10/80*     (2023.01)

(58) Field of Classification Search
CPC .. G01B 21/042; G01B 11/24; G01B 11/2504; G01B 11/2518; G01B 11/2531; G01B 11/005; G01B 5/004; G01B 11/00; G01B 11/14; G01B 2210/54; G01B 3/30; G01B 11/0641; G01B 11/022; G01B 11/254; G01B 11/26; G01B 5/0014; G01B 11/02; G01B 21/045; G01B 2210/52; G01B 5/008; G01B 9/02092; G01B 11/22; G01B 11/03; G01B 2210/58; G01B 11/026; G01B 11/2522; G01B 11/06; G01B 15/00; G01B 5/0035; G01B 5/08; G01B 7/004; G01B 7/008; G01B 11/16; G01B 11/2527; G01B 3/004; G01B 3/04; G01B 3/1003; G01B 3/1041; G01B 3/1046; G01B 3/1061; G01B 3/1069; G01B 5/0021; G01B 5/061; G01B 11/105; G01B 11/303; G01B 21/02; G01B 21/32; G01B 9/04; G01B 11/04; G01B 11/08; G01B 11/2433; G01B 11/272; G01B 11/306; G01B 17/08; G01B 21/00; G01B 5/0002; G01B 5/0004; G01B 5/0025; G01B 7/18; H10N 10/13; H10N 10/80; G01K 13/00; G01K 3/005; G01K 13/02; G01K 13/026
See application file for complete search history.

(56) References Cited

U.S. PATENT DOCUMENTS

| | | | |
|---|---|---|---|
| 8,082,120 B2 | 12/2011 | St-Pierre et al. | |
| 8,284,240 B2 | 10/2012 | Saint-Pierre et al. | |
| 8,786,682 B2 * | 7/2014 | Shpunt | H04N 13/218 353/70 |
| 8,832,954 B2 | 9/2014 | Atwell et al. | |
| 9,046,360 B2 | 6/2015 | Atwell et al. | |
| 9,188,430 B2 | 11/2015 | Atwell et al. | |
| 9,217,637 B2 | 12/2015 | Heidemann et al. | |
| 9,654,761 B1 | 5/2017 | Esteban et al. | |
| 10,200,670 B2 | 2/2019 | Steinbichler et al. | |
| 10,271,039 B2 | 4/2019 | Tubic et al. | |
| 10,408,606 B1 | 9/2019 | Raab et al. | |
| 10,540,757 B1 | 1/2020 | Bouhnik et al. | |
| 2006/0062449 A1 * | 3/2006 | Pratt | A61B 5/107 700/118 |
| 2012/0300040 A1 | 11/2012 | McEldowney | |
| 2014/0104416 A1 | 4/2014 | Giordano et al. | |
| 2014/0307057 A1 * | 10/2014 | Kang | H04N 5/2256 348/47 |
| 2016/0004920 A1 | 1/2016 | Armstrong-Crews et al. | |
| 2016/0073091 A1 * | 3/2016 | Hillebrand | G06T 7/62 348/48 |
| 2016/0073104 A1 * | 3/2016 | Hillebrand | G01B 11/2513 348/47 |
| 2017/0186183 A1 | 6/2017 | Armstrong et al. | |
| 2017/0188015 A1 | 6/2017 | Heidemann et al. | |
| 2017/0194768 A1 | 7/2017 | Powers et al. | |
| 2018/0124378 A1 | 5/2018 | Forutanpour et al. | |
| 2019/0128666 A1 * | 5/2019 | Lau | G01B 11/2545 |
| 2019/0236798 A1 | 8/2019 | Rochette et al. | |
| 2019/0285404 A1 | 9/2019 | Wohlfed | |
| 2020/0109937 A1 | 4/2020 | Zweigle et al. | |
| 2020/0191555 A1 | 6/2020 | Zweigle et al. | |
| 2020/0292297 A1 | 9/2020 | Atala et al. | |
| 2021/0131788 A1 | 5/2021 | Doring et al. | |

FOREIGN PATENT DOCUMENTS

| | | | | |
|---|---|---|---|---|
| DE | 112016001888 T5 | | 1/2018 | |
| DE | 112016002057 T5 | | 1/2018 | |
| DE | 102016221325 A1 * | | 5/2018 | ......... G01B 11/2513 |
| EP | 2439576 A1 | | 4/2012 | |
| EP | 3232153 A1 * | | 10/2017 | ......... G01B 11/2513 |
| JP | 2013124985 A | | 6/2013 | |
| WO | WO-2013058710 A1 * | | 4/2013 | .......... G01B 11/245 |
| WO | WO-2014068406 A2 * | | 5/2014 | ............. B25J 13/08 |
| WO | 2016040229 A1 | | 3/2016 | |
| WO | WO-2016039955 A1 * | | 3/2016 | .......... G01B 11/002 |
| WO | WO-2017187163 A1 * | | 11/2017 | ............ B60C 11/243 |
| WO | WO-2018063989 A1 * | | 4/2018 | ........... A61B 5/1123 |
| WO | WO-2019084544 A1 * | | 5/2019 | ......... G01B 11/2513 |

\* cited by examiner

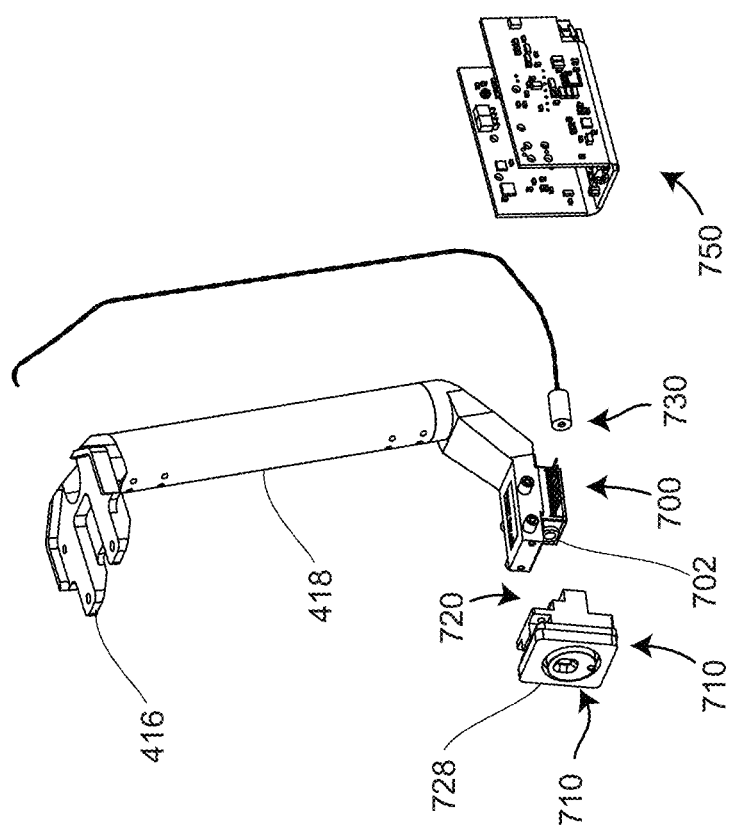
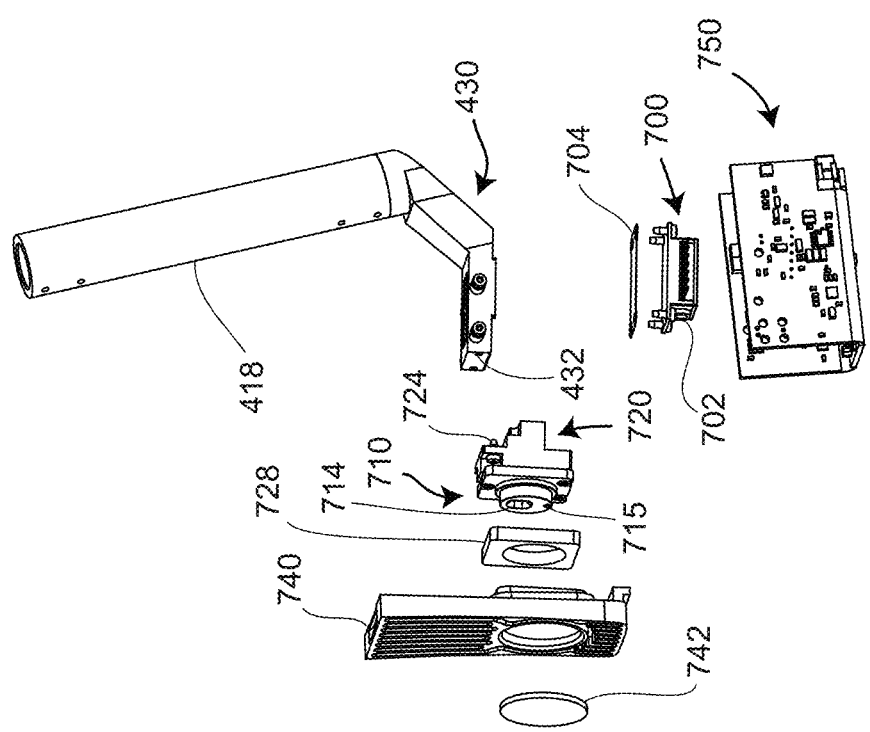
FIG. 7B
FIG. 7A

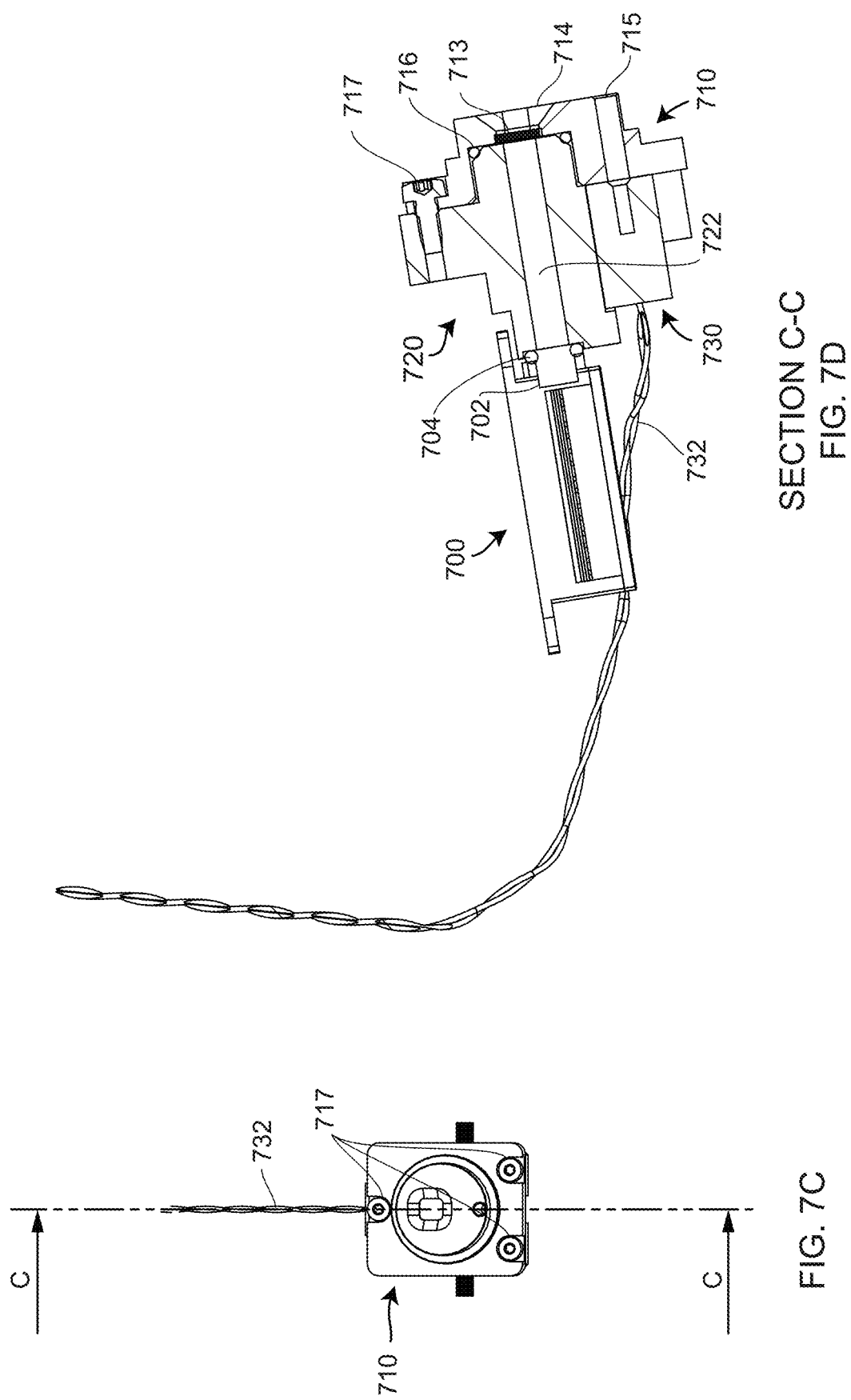

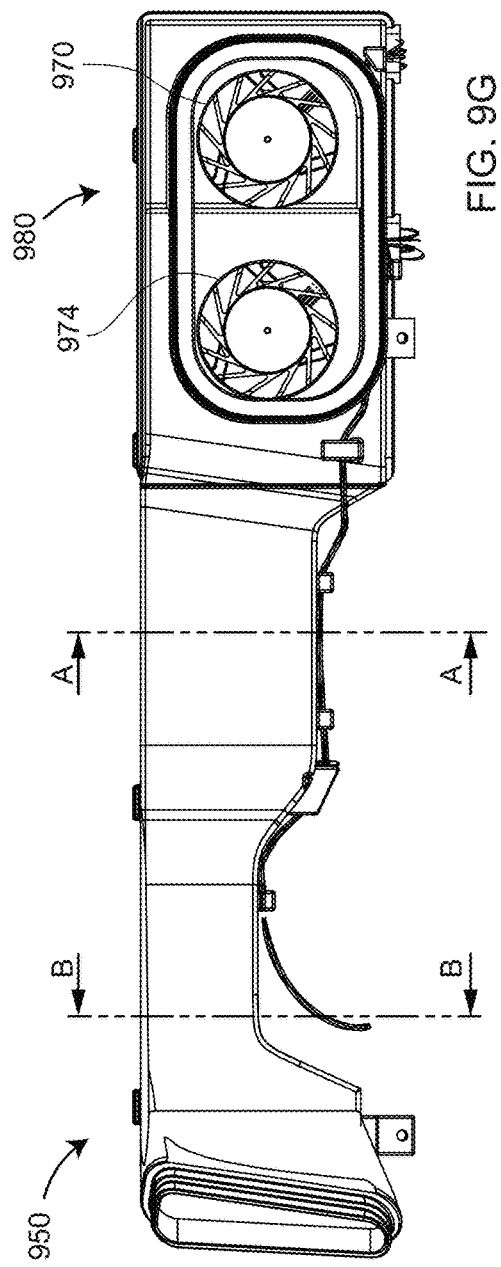
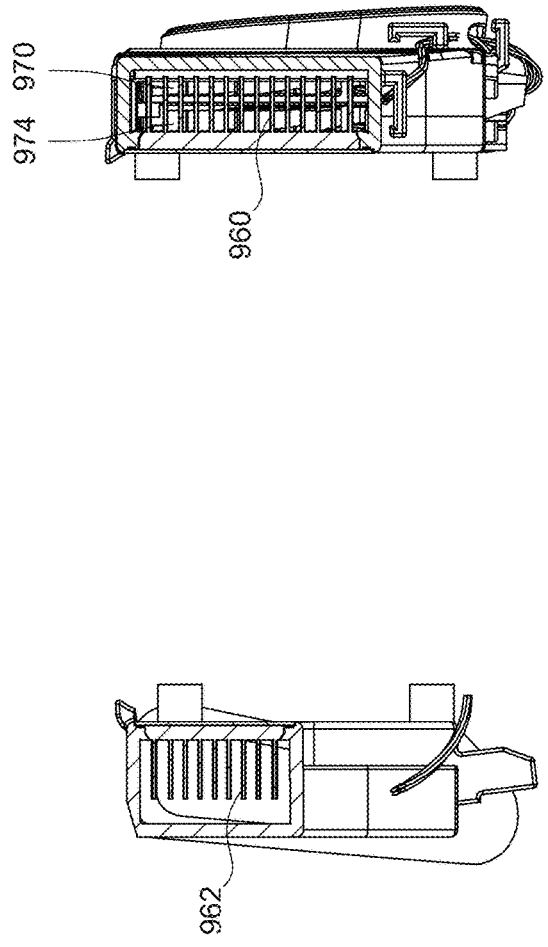
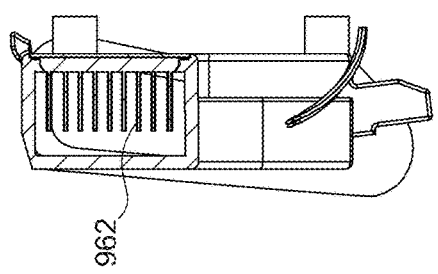
FIG. 9G
SECTION A-A
FIG. 9I
SECTION B-B
FIG. 9H

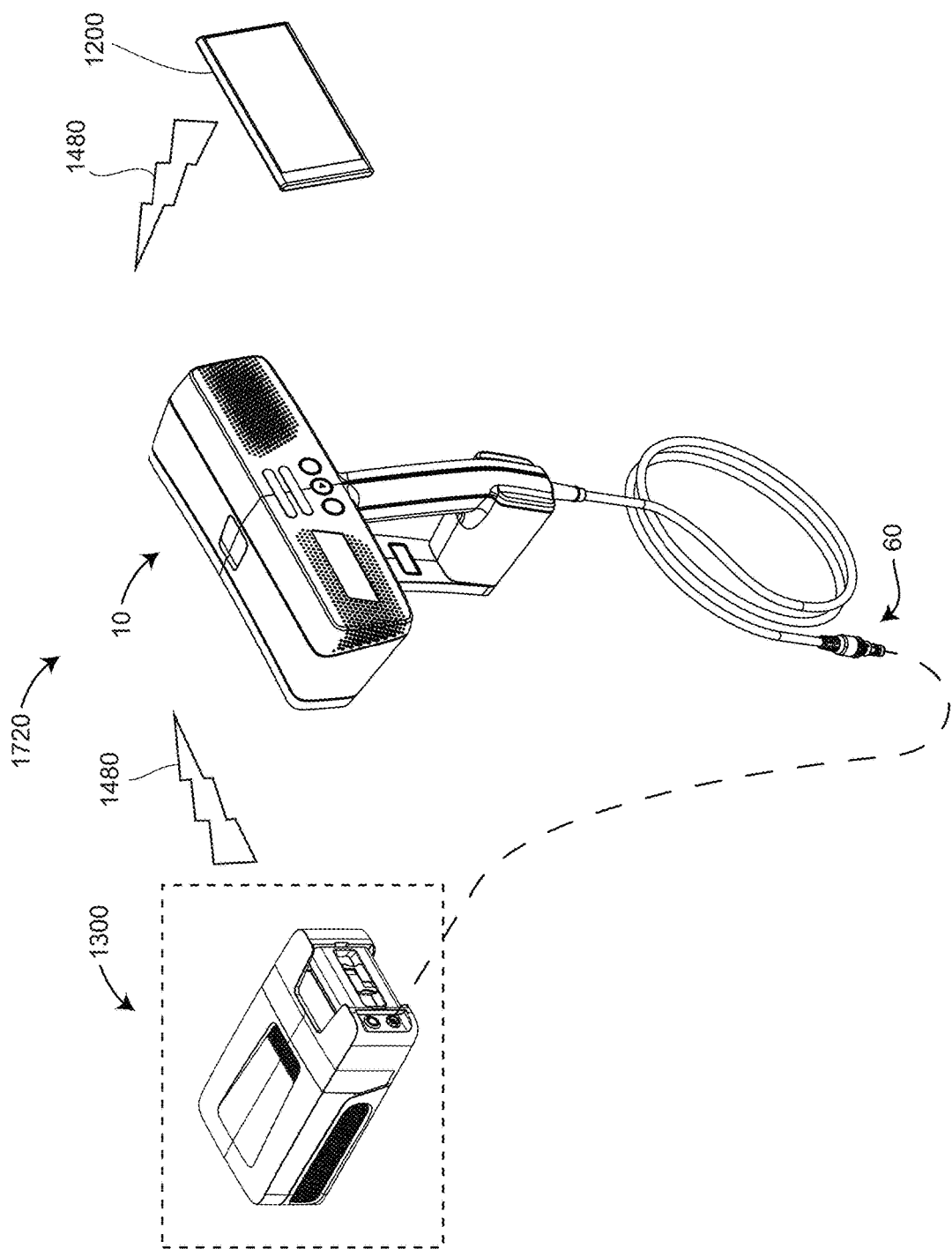

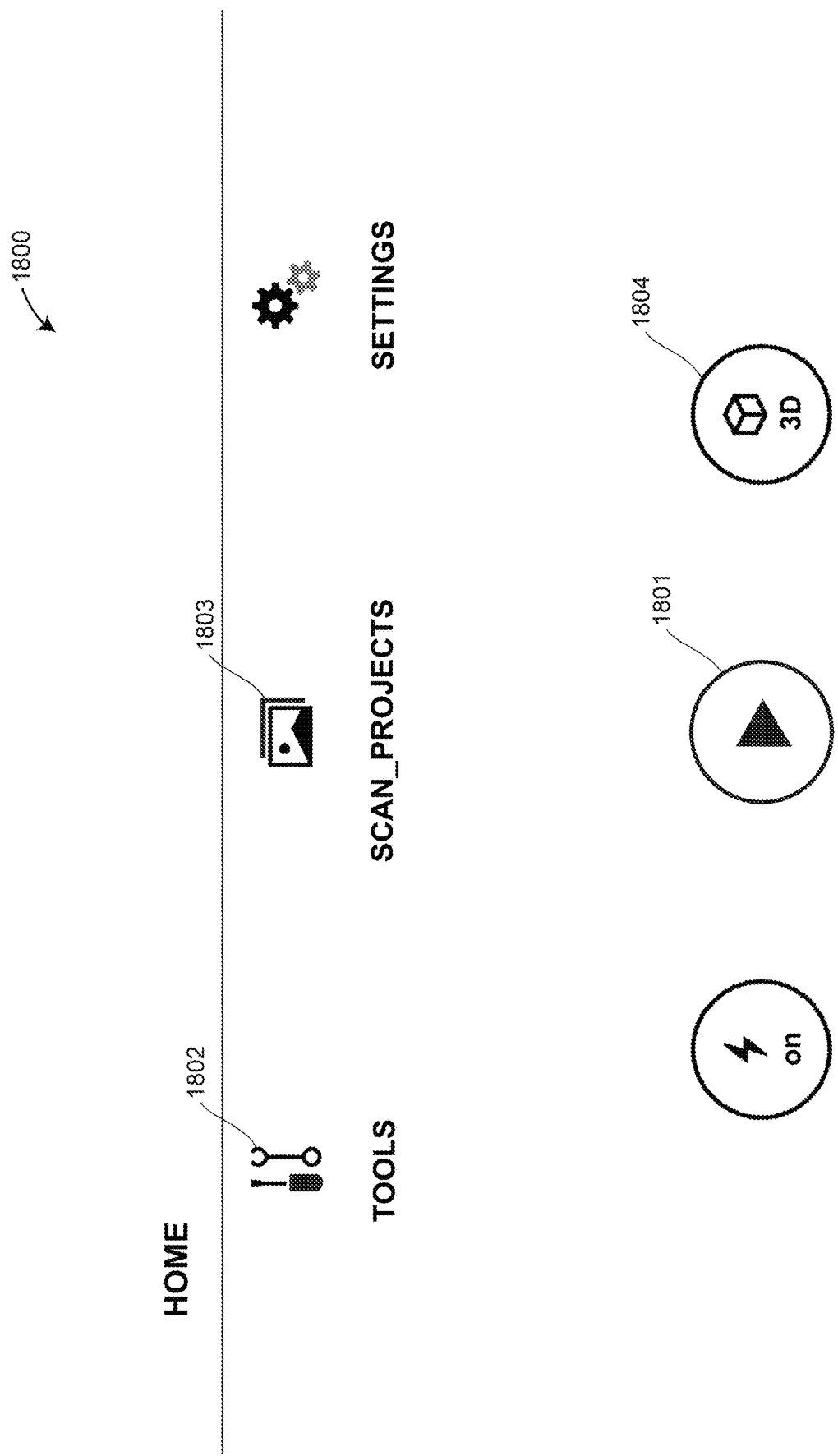

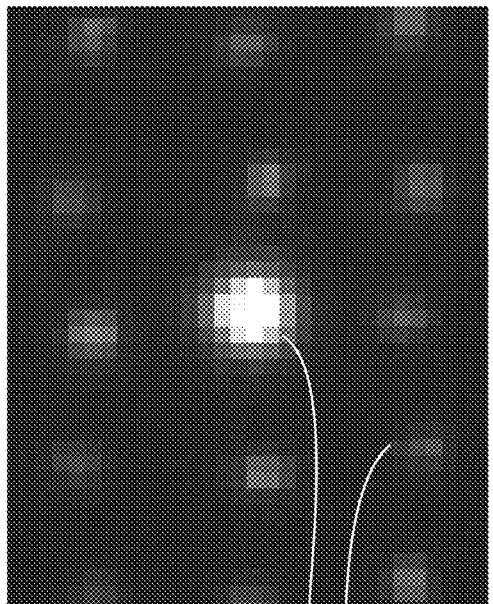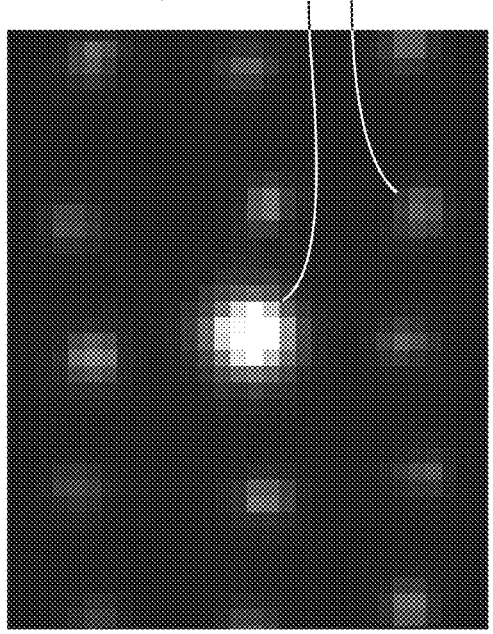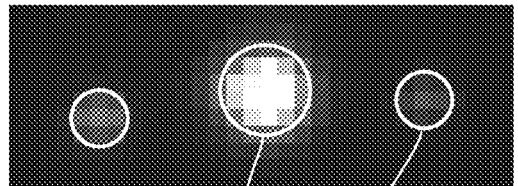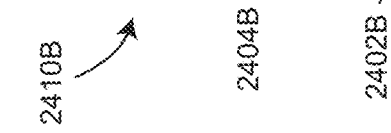
FIG. 24A, FIG. 24B, FIG. 24C, FIG. 24D

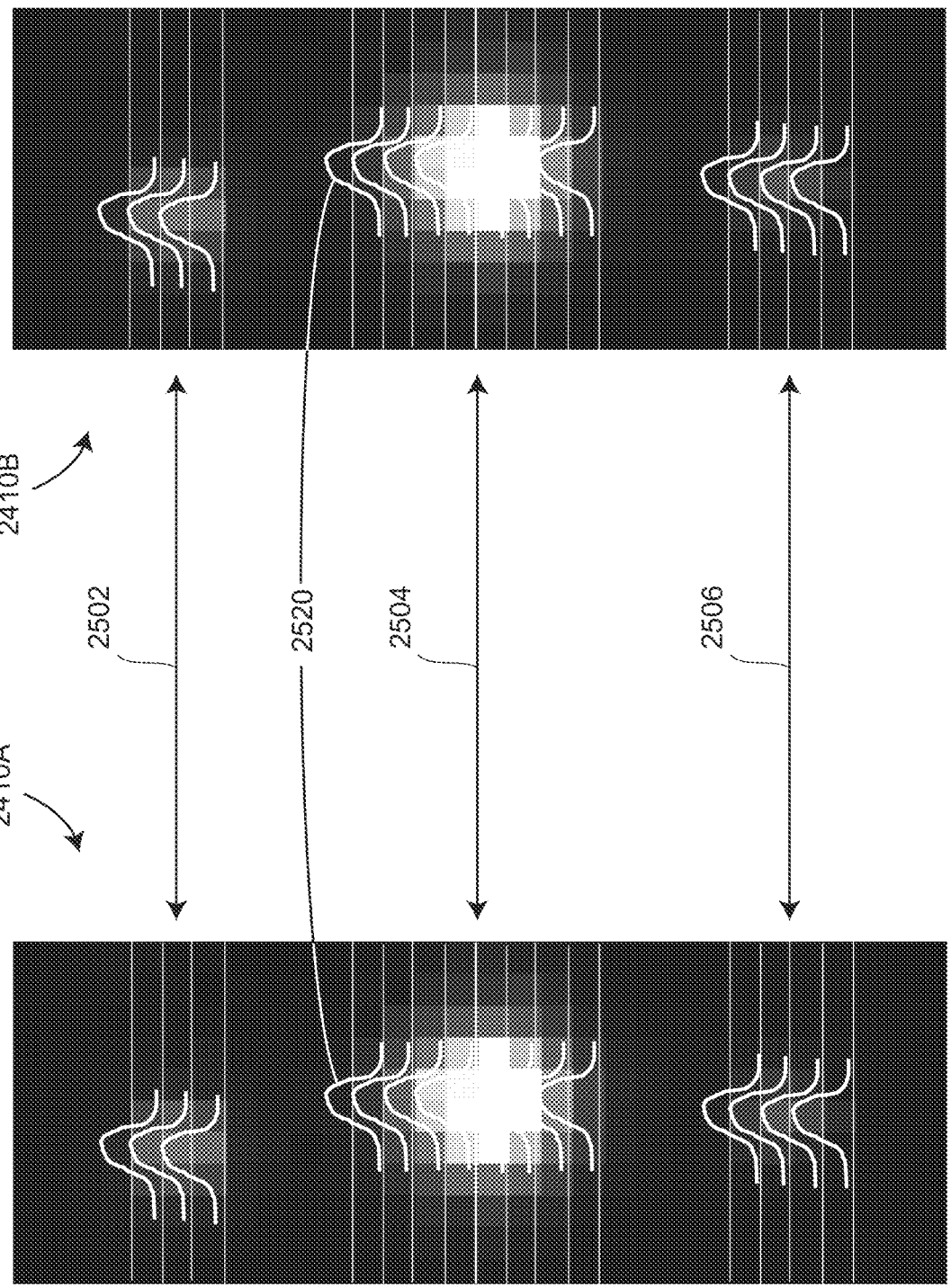

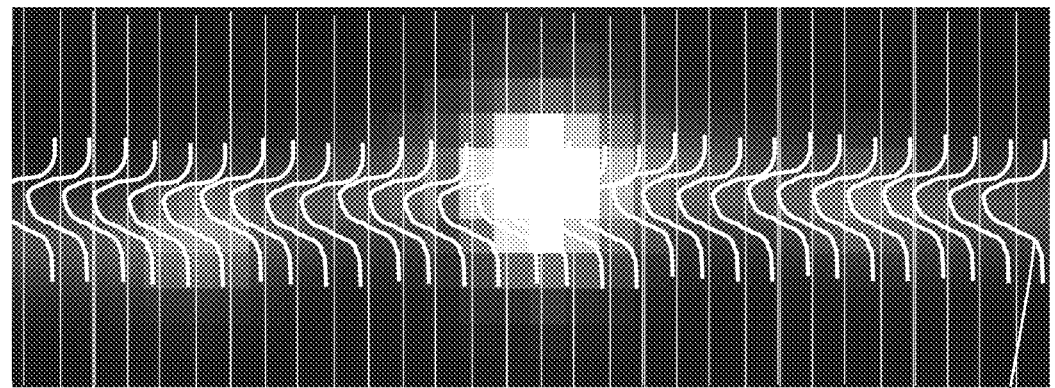
FIG. 27B
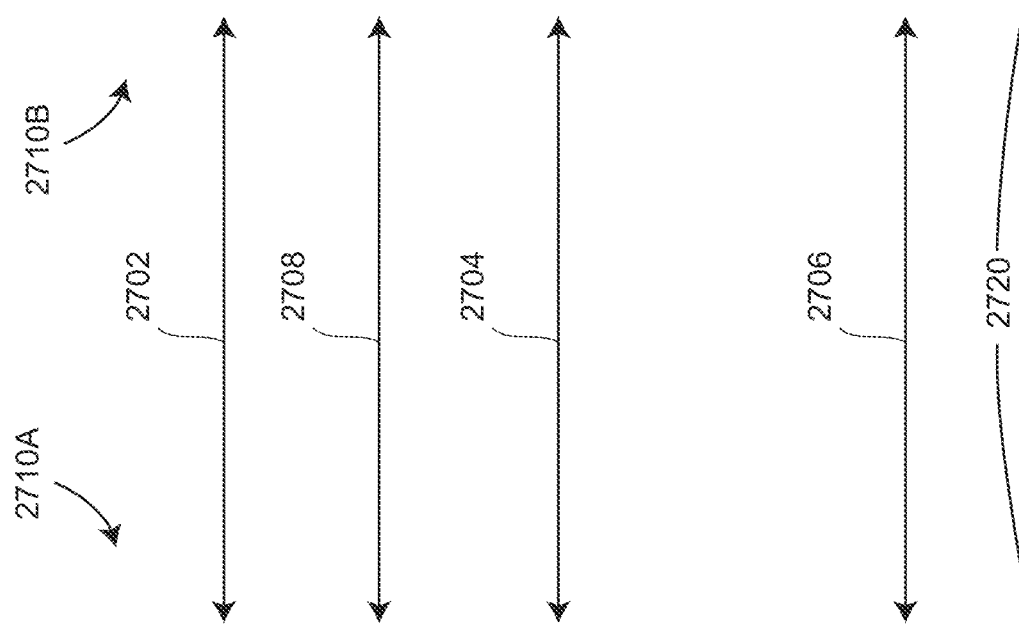
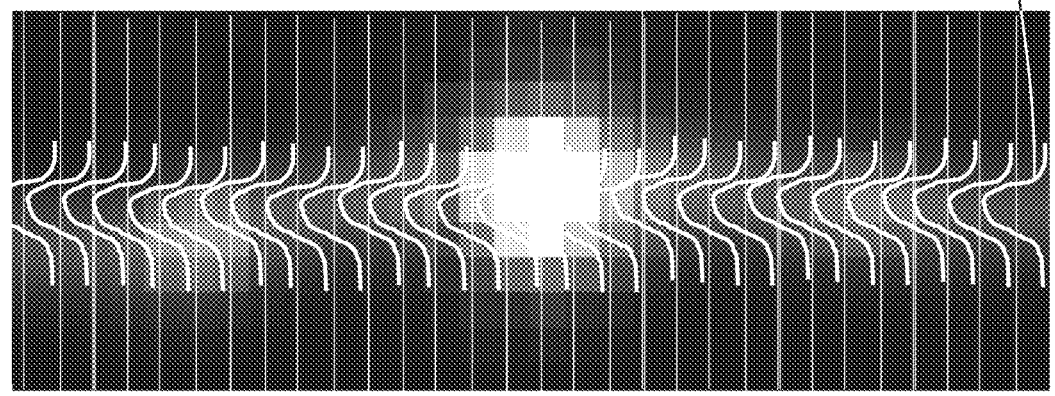
FIG. 27A

HANDHELD THREE-DIMENSIONAL COORDINATE MEASURING DEVICE OPERATIVELY COUPLED TO A MOBILE COMPUTING DEVICE

CROSS-REFERENCE TO RELATED APPLICATIONS

The present application is a Continuation of U.S. Non-Provisional patent application Ser. No. 17/147,925 filed Jan. 13, 2021, which is a Continuation of U.S. Non-Provisional patent application Ser. No. 16/806,548 filed Mar. 2, 2020, which claims the benefit of U.S. Provisional Patent Application No. 62/818,923 filed Mar. 15, 2019, the contents of which are incorporated by reference herein in its entirety.

BACKGROUND

The subject matter disclosed herein relates to a handheld three-dimensional (3D) measurement device, and particularly to a handheld 3D triangulation scanner.

A 3D triangulation scanner, also referred to as a 3D imager, is a portable device having a projector that projects light patterns on the surface of an object to be scanned. One (or more) cameras, having a predetermined positions and alignment relative to the projector, records images of the light pattern on the surface of an object. The three-dimensional coordinates of elements in the light pattern can be determined by trigonometric methods, such as by using triangulation. Other types of 3D measuring devices may also be used to measure 3D coordinates, such as those that use time of flight techniques (e.g., laser trackers, laser scanners or time of flight cameras) for measuring the amount of time it takes for light to travel to the surface and return to the device.

Today, processing capability of a handheld scanner is limited by the capability of processors within the handheld scanner. Faster processing of scan data would be desirable. Greater flexibility and speed in post-processing scan data would also be desirable. Another limitation today is inability of handheld 3D measurement devices today to conveniently and removably attach to a mobile phone for displaying test results and providing user interface information.

Another limitation in devices for 3D measurement today is they do not conveniently interface with mobile computing devices such as mobile phones for displaying results and providing a user interface.

Accordingly, while existing handheld 3D triangulation scanners are suitable for their intended purpose, the need for improvement remains, particularly in providing ability to scan in sunlight, ability to cool the scanner while protecting against water and dust, ability to obtain increased density of measured 3D points, and ability to obtain faster and simpler post-processing of scan data.

BRIEF DESCRIPTION

According to one aspect of the disclosure, a handheld device comprises: a projector operable to project a pattern of light onto an object at a plurality of different times; a first camera operable to capture at the plurality of different times the projected pattern of light in first images; a second camera operable to capture at the plurality of different times the projected pattern of light in second images; a registration camera operable to capture a succession of third images; one or more processors operable to determine three-dimensional (3D) coordinates of points on the object based at least in part on the projected pattern, the first images, and the second images, the one or more processors being further operable to register the determined 3D coordinates based at least in part on common features extracted from the succession of third images; and a mobile computing device operably connected to the handheld device and in communication with the one or more processors, the mobile computing device being operable to display the determined registered 3D coordinates of points.

These and other advantages and features will become more apparent from the following description taken in conjunction with the drawings.

BRIEF DESCRIPTION OF DRAWINGS

The subject matter, which is regarded as the disclosure, is particularly pointed out and distinctly claimed in the claims at the conclusion of the specification. The foregoing and other features, and advantages of the disclosure are apparent from the following detailed description taken in conjunction with the accompanying drawings in which:

FIGS. 7A, 7B are first and second perspective exploded views of a projector assembly according to an embodiment of the present invention;

FIGS. 7C, 7D are front and sectional views of a projector assembly according to an embodiment of the present invention;

FIGS. 9G, 9H, 9I are rear, first sectional, and second sectional views, respectively, of the electronics and cooling assembly according to an embodiment of the present invention;

FIG. 17B illustrates a method of interconnecting a mobile PC with a mobile display using a Wi-Fi access point according to an embodiment of the present invention;

FIG. 18A illustrates a top level menu provided on a display according to an embodiment of the present invention;

FIGS. 24A, 24B are views captured by a left camera and a right camera, respectively, of a scanner that projects a grid pattern according to an embodiment of the present invention;

FIGS. 24C, 24D are columns of grid spots extracted from FIGS. 24A, 24B, respectively, according to an embodiment of the present invention;

FIGS. 25A, 25B illustrate increasing the density of scan data by evaluating 3D coordinates of pixel rows for each spot according to an embodiment of the present invention;

FIGS. 27A, 27B illustrate a method for increasing the density of scan data by evaluating 3D coordinates of pixel rows for each spot and for interconnecting curves according to an embodiment of the present invention;

The detailed description explains embodiments of the disclosure, together with advantages and features, by way of example with reference to the drawings.

DETAILED DESCRIPTION

Embodiments of the invention provide for improved interfacing and display with a 3D handheld scanner.

Figure 1:
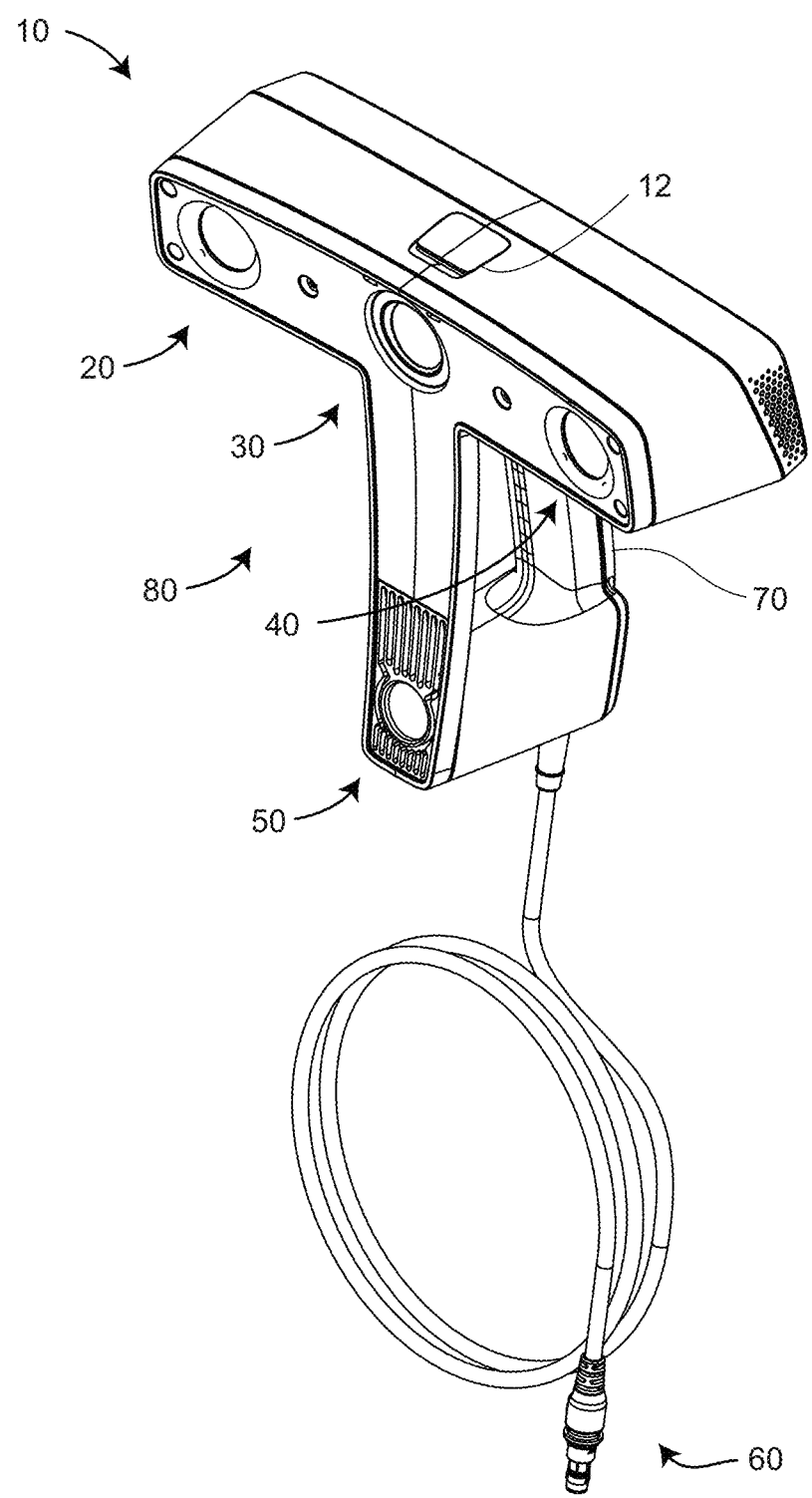
FIG. 1 is a front perspective view of a 3D triangulation scanner according to an embodiment of the present invention.
Figure 2:
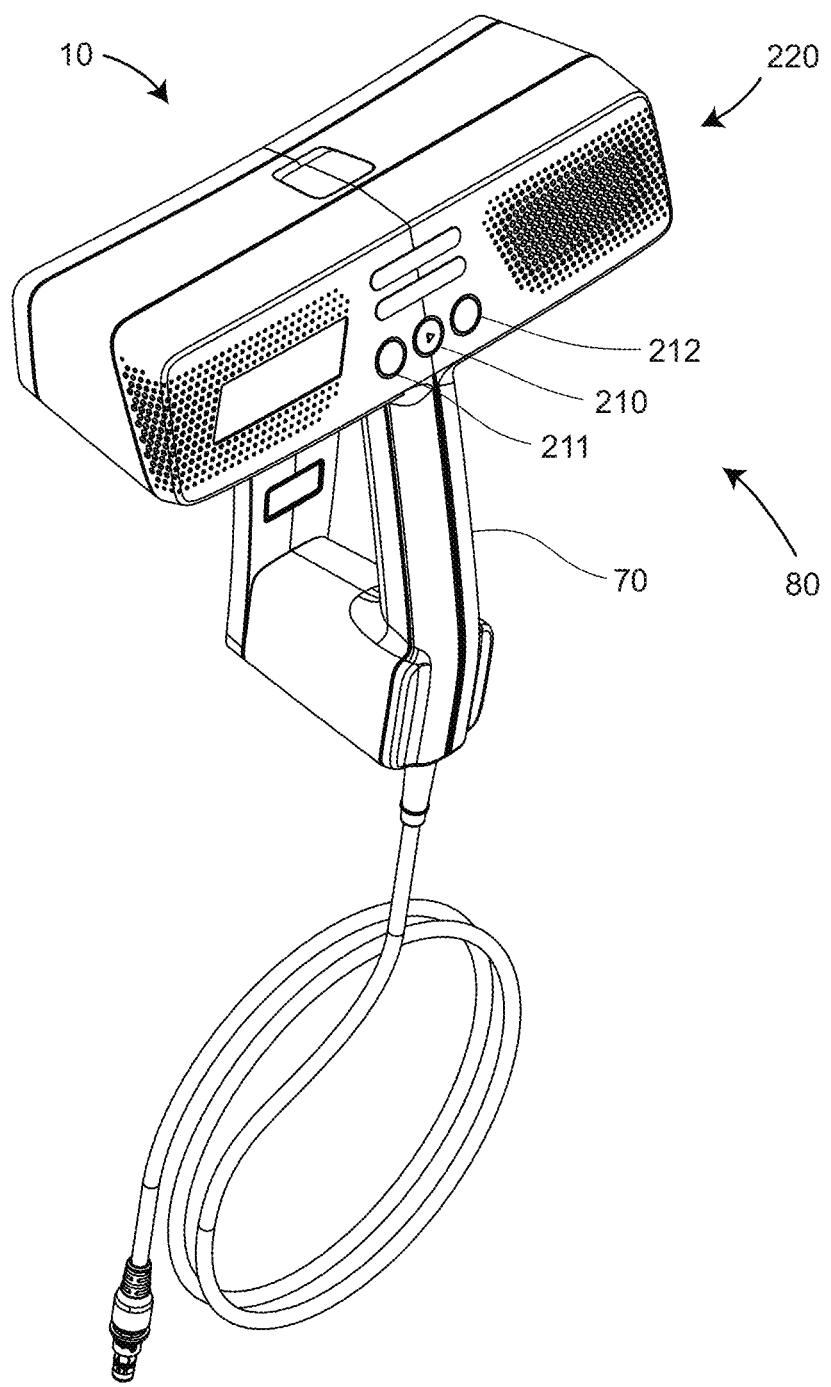
FIG. 2 is a rear perspective view of the 3D triangulation scanner according to an embodiment of the present invention.

FIG. 1 is a front isometric view of a handheld 3D triangulation scanner 10, also referred to as a handheld 3D imager. In an embodiment, the scanner 10 includes a first infrared (IR) camera 20, a second IR camera 40, a registration camera 30, a projector 50, an Ethernet cable 60 and a handle 70. In an embodiment, the registration camera 30 is a color camera. Ethernet is a family of computer networking technologies standardized under IEEE 802.3. The enclosure 80 includes the outmost enclosing elements of the scanner 10, as explained in more detail herein below. FIG. 2 is a rear perspective view of the scanner 10 further showing an exemplary perforated rear cover 220 and a scan start/stop button 210. In an embodiment, buttons 211, 212 may be programmed to perform functions according to the instructions of a computer program, the computer program either stored internally within the scanner 10 or externally in an external computer. In an embodiment, each of the buttons 210, 211, 212 includes at its periphery a ring illuminated by a light emitting diode (LED).

Figure 3:
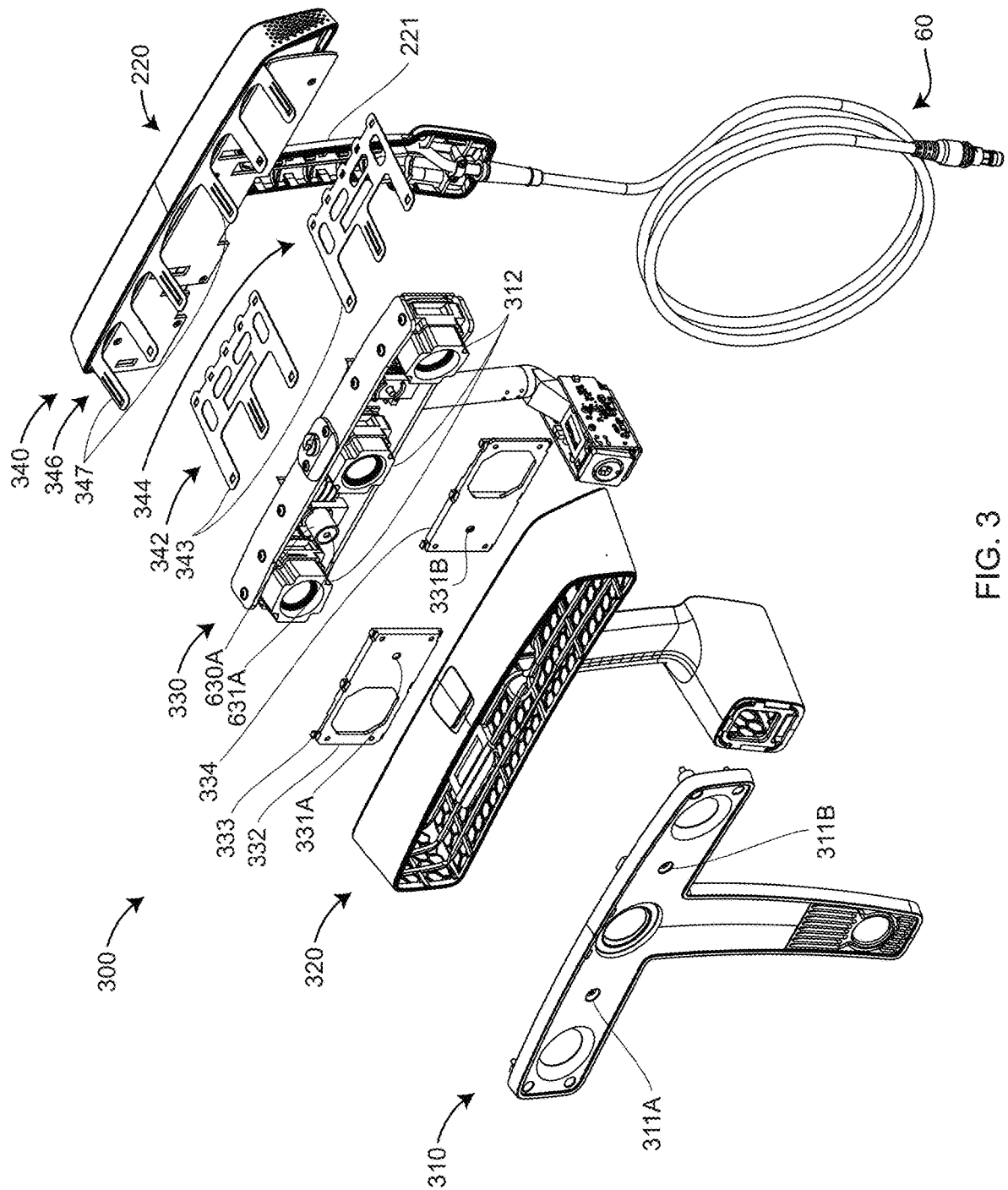
FIG. 3 is an exploded view of the 3D triangulation scanner according to an embodiment of the present invention.

FIG. 3 is an exploded perspective view 300 of the scanner 10. In an embodiment, the scanner 10 includes faceplate assembly 310, handle cover assembly 320, carrying structure assembly 330, left cover plate 332, right cover plate 334, interlocking finger plates 342, 344, 346, rear assembly 340, and Ethernet cable 60.

Figure 4B:
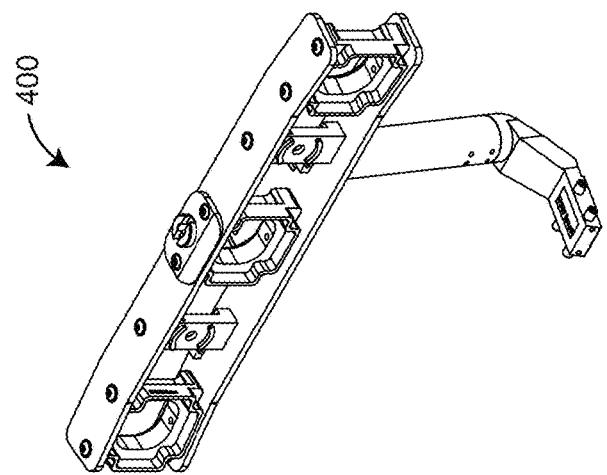
FIGS. 4A, 4B are an exploded perspective view and an assembled isometric view, respectively, of a carrying structure according to an embodiment of the present invention.
Figure 4A:
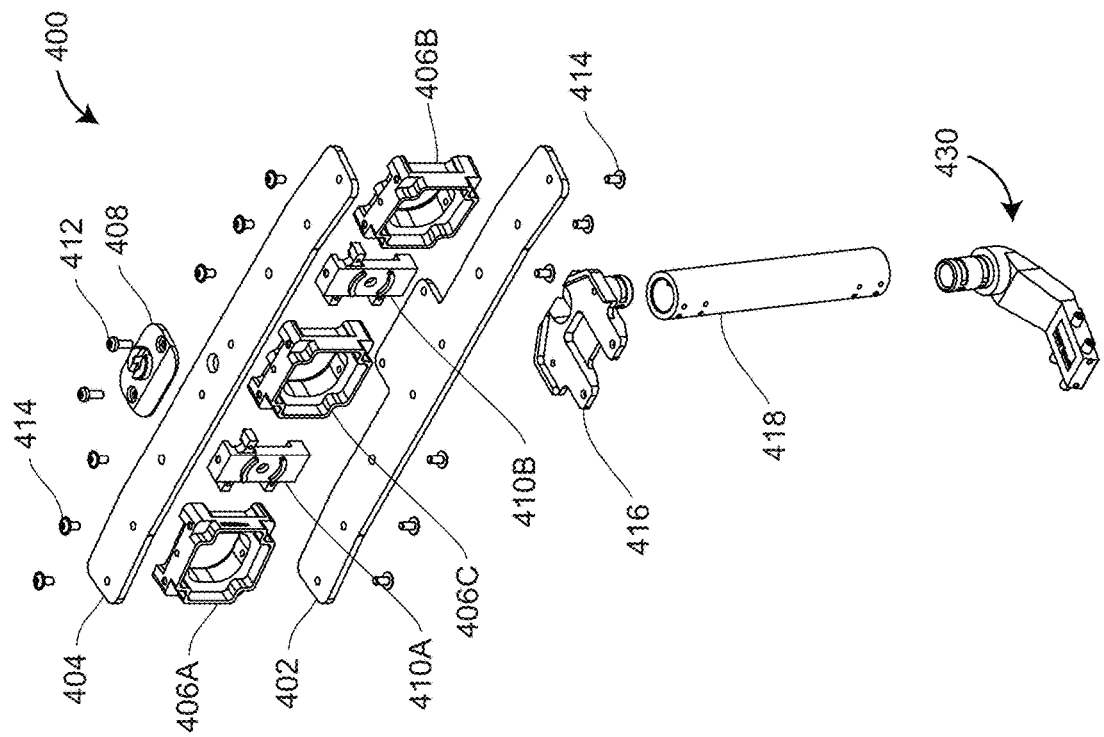

FIGS. 4A, 4B are exploded perspective and assembled perspective views, respectively, of the carrying structure assembly 400. In an embodiment, the carrying structure 400 includes top plate 404, bottom plate 402, camera holders 406A, 406B, 406C, spacer brackets 410A, 410B, tripod thread adapter 408, base plate 416, a structural tube 418, and a projector holder 430. In an embodiment, the structural tube 418 is joined to the base plate 416 and projector holder 430 by adhesive. In an embodiment, the structural tube 418 is made of carbon-fiber composite material.

Figure 4C:
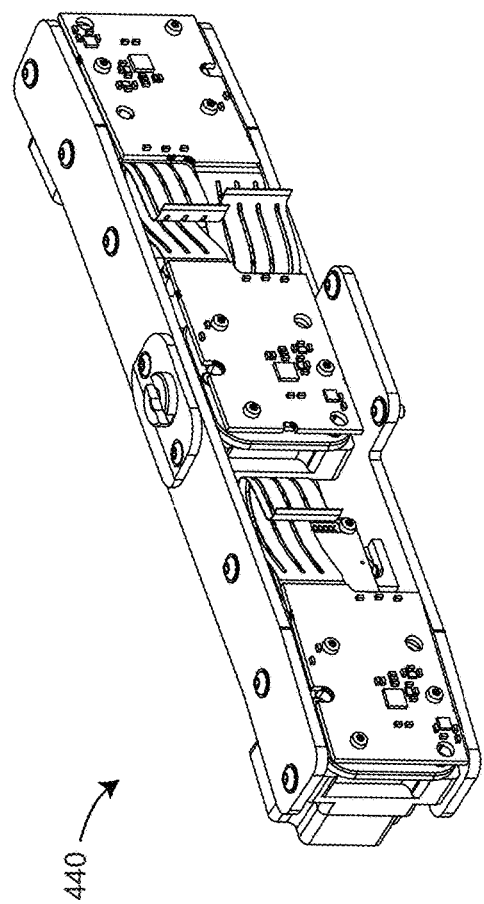
FIGS. 4C, 4D are an assembled perspective view and an exploded isometric view, respectively, of a carrying structure integrated with camera assemblies according to an embodiment of the present invention.
Figure 4D:
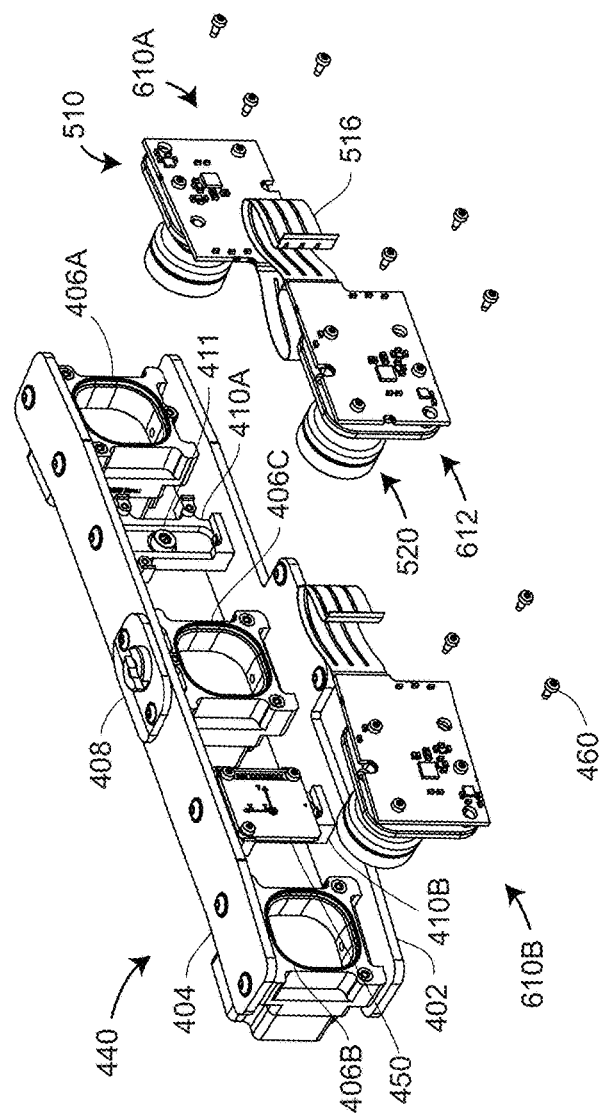
Figure 5B:
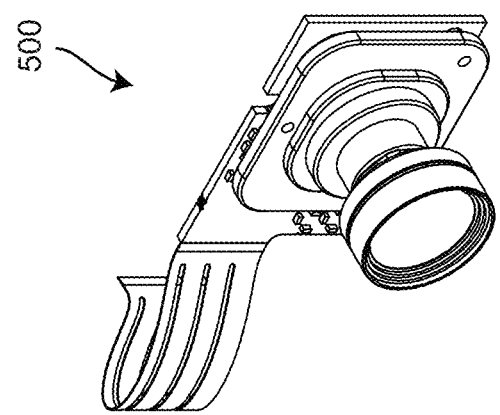
FIGS. 5A, 5B are a front exploded perspective view and a front assembled isometric view, respectively, of a camera assembly according to an embodiment of the present invention.
Figure 5A:
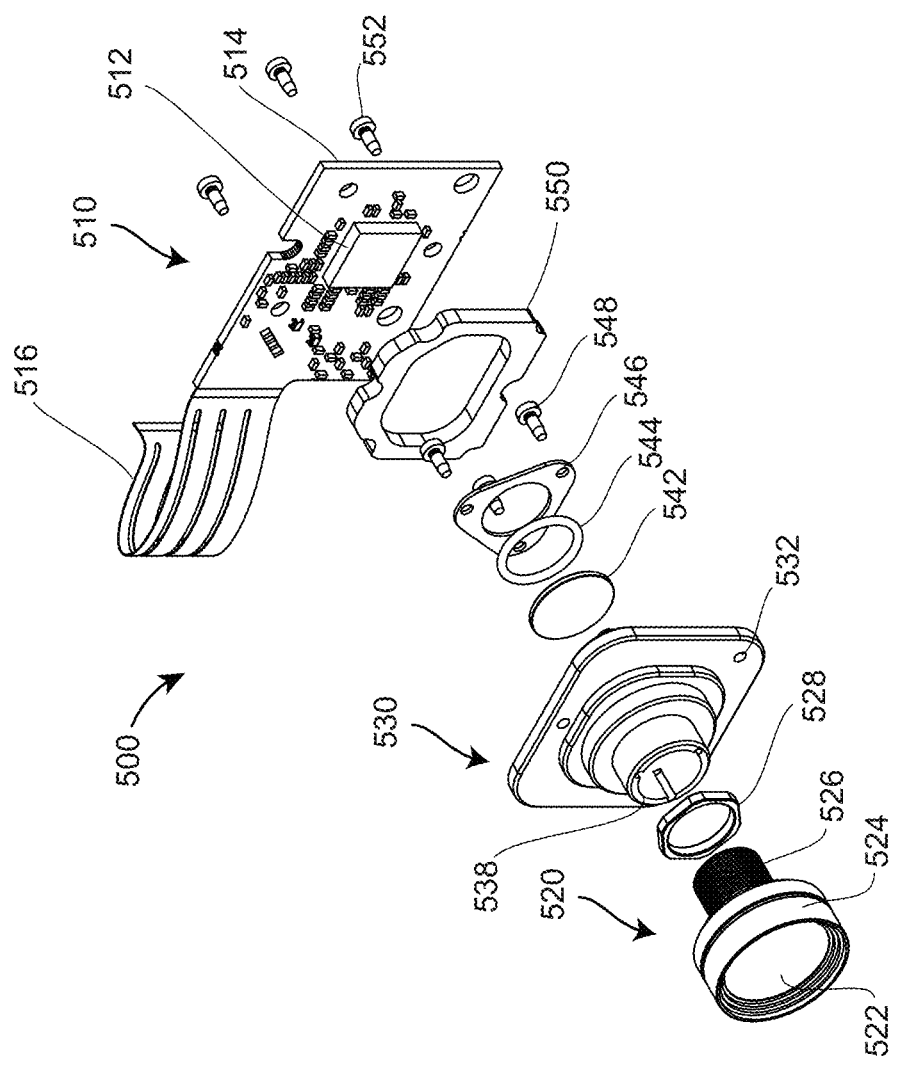
Figure 5C:
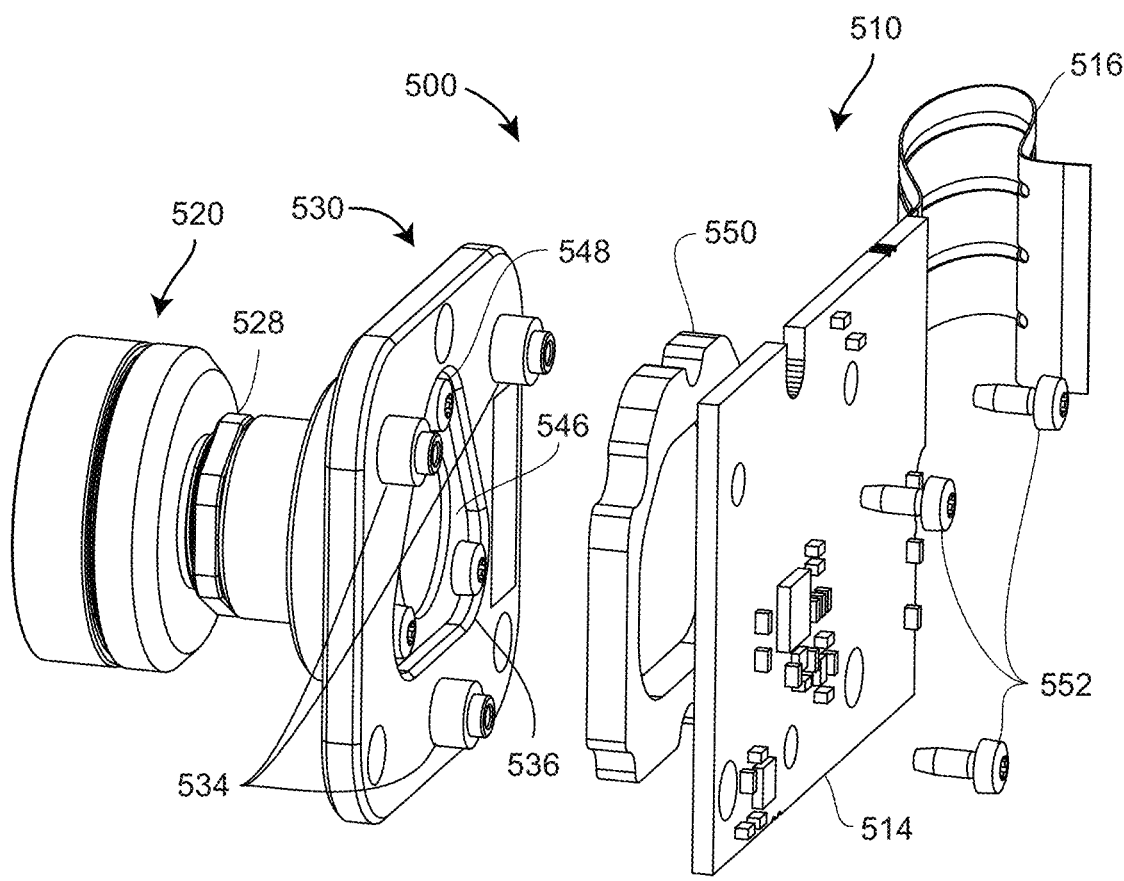
FIGS. 5C, 5D are rear perspective exploded and partial cutaway views, respectively, of a camera assembly according to an embodiment of the present invention.
Figure 5D:
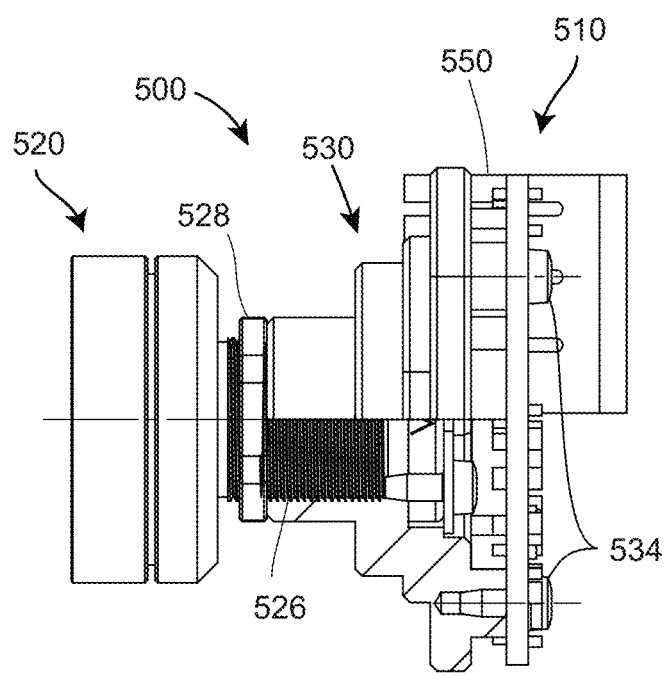

FIGS. 4C, 4D are assembled and exploded rear perspective views, respectively, of an upper subassembly 440 of the carrying structure assembly 400. In an embodiment, the upper subassembly 440 includes the top plate 404, the bottom plate 402, the camera holders 406A, 406B, 406C, the spacer brackets 410A, 410B, the tripod thread adapter 408, an inertial measurement unit (IMU) board 450, cameras 610A, 610B, 612, and screws 460. The cameras 610A, 610B, 612 include lens assemblies 520, camera circuit boards 510, and ribbon cables 516. The lens assemblies 520 of the cameras 610A, 610B, 612 are inserted through openings in the camera holders 406A, 406B, 406C, and the cameras 610A, 610B, 612 are secured in place with screws 460 that pass through the circuit boards 510 into the camera holders 406A, 406B, 406C.

FIGS. 5A, 5B, 5C, 5D are exploded front perspective, assembled front perspective, exploded rear perspective, and cutaway side views, respectively, of camera 500 according to an embodiment. The camera 500 includes a camera board 510 having a photosensitive array 512, a circuit board with supporting electrical components 514, and a ribbon cable 516. The camera 500 further includes lens assembly 520, lock washer 528, lens holder 530, optical filter 542, O-ring 544, filter clamp 546, screws 548, and gasket 550. Lens assembly 520 includes lens 522, lens housing 524, and lens threads 526. If the camera 500 is an IR camera such as the cameras 20, 40, the optical filter 542 is a relatively narrow optical passband filter selected to pass light emitted by the projector 50. In an embodiment, an IR camera includes a photosensitive array having more than one million pixels, a frame rate of 60 Hz, a bit depth of 10 bits, and a global shutter. If the camera 500 is the registration camera 30, then in an embodiment the photosensitive array 512 is a color array having red-green-blue (RGB) subpixel elements, and the optical filter 542 passes at least a portion of the visible spectrum. The lens holder 530 includes threaded screw holes 532, threaded standoffs 534, recess 536, and threaded sleeve 538. The filter 542 is held in place by O-ring 544 and filter clamp 546, which sit in recess 536 and are held in place with screws 548. Gasket 550, which sits between the circuit board 514 and the lens holder 530, is held in place by the threaded standoffs 534. The circuit board 514 is held in place by the screws 552. The gasket 550 keeps dirt from reaching the surface of the photosensitive array 512. The lens threads screw into the threaded sleeve 538 and is locked in place by the lock washer 528. The position of the lock washer 526 on the lens thread 526 is set by a factory procedure in according to the position at which the lens assembly 520 brings a target into focus at a predetermined distance from the camera 500.

Figure 6A:
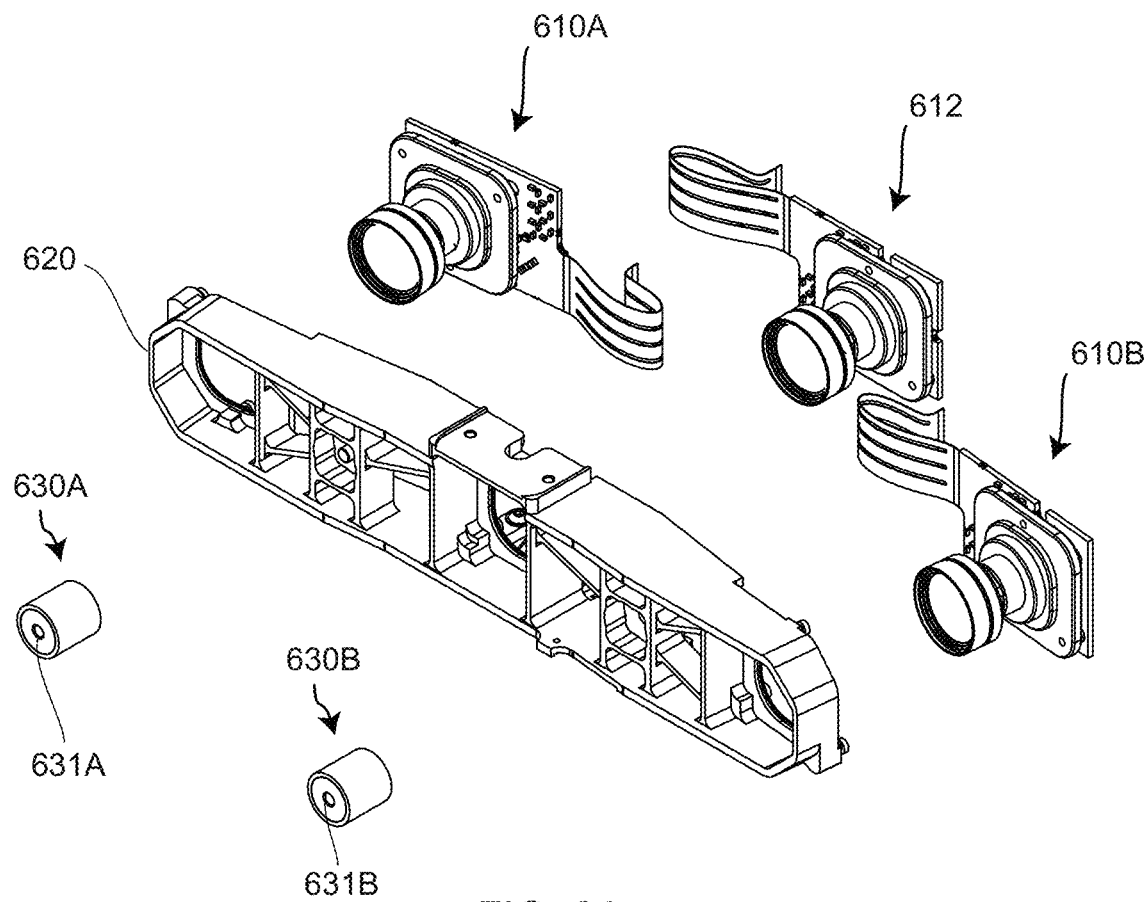
FIGS. 6A, 6B are exploded perspective and assembled perspective views, respectively, of an aluminum integral carrying structure subassembly according to an embodiment of the present invention.
Figure 6B:
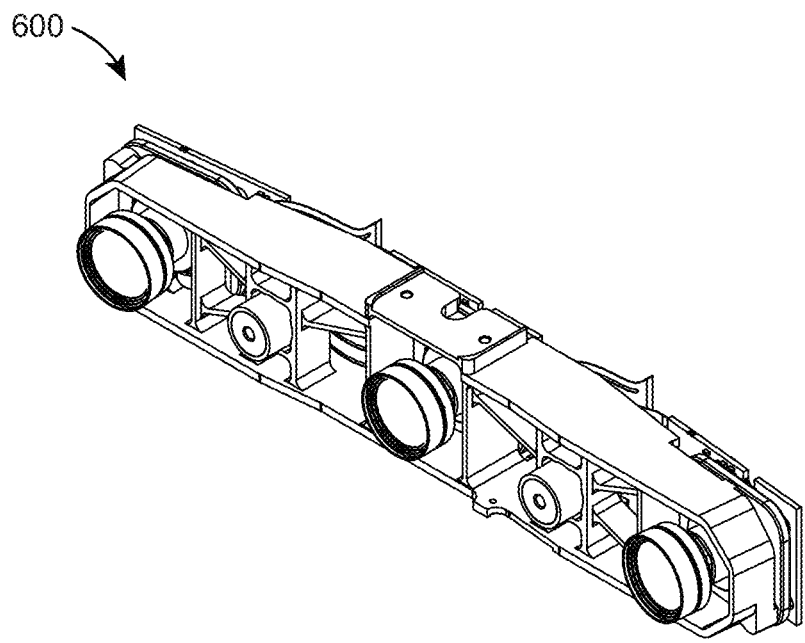

FIGS. 6A, 6B are exploded and assembled front perspective views of an aluminum upper subassembly 600 that is an alternative embodiment to the upper subassembly 440 of FIGS. 4C, 4D. The aluminum upper subassembly 600 replaces the top plate 404, the bottom plate 402, the camera holders 406A, 406B, 406C, and the spacer brackets 410A, 410B with a single aluminum structural component 620. The aluminum upper subassembly has the advantage of being quickly assembled but the may also have a relatively higher coefficient of thermal expansion (CTE). However, the aluminum upper subassembly is used in combination with a user compensation procedure, sometimes referred to as a user calibration procedure, that is routinely performed during measurements by the triangulation scanner 10 and that may also be performed whenever desired by the user by making use of a special calibration plate. An exemplary calibration plate for this purpose is described in U.S. Published Patent Application No. 2017/0188015 to Heidemann, et al., the contents of which are incorporated by reference. FIG. 6A also shows bumpers 630A, 630B, which attach to the back of spacer brackets 410A, 410B with screws such as the screw 411 (FIG. 4D).

In an embodiment, software run on a processor coupled to the triangulation scanner 10 provides a signal or alert (such as a warning message) when a compensation procedure may be performed. In one embodiment, the software determines that a compensation procedure is to be performed whenever there is a predetermined change (e.g. 5 degrees Celsius) in the temperature of the scanner 10 following the last scanner calibration. In an embodiment, the scanner temperature is measured by temperature sensors within the scanner 10. In another embodiment, the software determines that a compensation procedure is to be performed whenever there is a predetermined inconsistency in measured results as determined using at least one method described herein. Such inconsistencies may be found, for example, by using two cameras and a projector mounted in a triangular pattern, as in FIG. 1, based on epipolar geometry. The self-consistency requirements of epipolar geometry are described below in reference to FIGS. 22, 23.

FIGS. 7A, 7B are exploded perspective views of a lower portion of the carrying structure 330 attached to additional components of the projector 50. FIGS. 7C, 7D are a front and an expanded cross sectional view C-C, respectively, of a projector subassembly. Exemplary base plate 416, structural tube 418 and projector holder 430 were shown in FIG. 4A. Additional exemplary components shown in FIGS. 7A, 7B, 7C, 7D include laser control electrical board 750, infrared laser 700, heat conduction pad 704, diffractive optical element (DOE) sealing block 720, DOE holder 710, thermal gap filler 728, laser pointer 730, projector heat-sink cover 740, and projector window 742. In an embodiment, the infrared laser 700 is Fabry-Perot laser that generates laser wavelengths between 798 and 816 nm. In an embodiment, for background temperatures of 0 to 40 degrees Celsius, a thermoelectric (TE) cooler built into the infrared laser 700 stabilizes the laser temperature to +/−1 degree Celsius, resulting in the predetermined laser wavelength being stabilized to better than +/−1 nanometer. A TE cooler is also referred to as a Peltier cooler. It should be appreciated that the present embodiment may refer to the TE cooler as being integral with or built into the laser 700, this is for example purposes and the claims should not be so limited. In other embodiments, the TE cooler may be separate from, but thermally coupled to, the laser 700.

A TE control circuit on the electrical board 750 provides the electrical signals to the TE cooler in the laser 700 to control the temperature of the laser active area and the resulting wavelength of the laser 700. In an embodiment, the infrared laser 700 produces a collimated circular beam having a single transverse mode. In an embodiment, the laser produces a wavelength of 810 nm and produces a beam having a single transverse mode having a power of 800 mW. The laser 700 and heat conduction pad 704 are fastened onto the projector holder 430. The TE cooler in the laser 700 may dump heat into the projector holder 430 or remove heat from the projector holder to hold the laser at the desired constant temperature. The DOE sealing block 720 is attached with fasteners 724 to holes 432 in the projector holder 430.

Collimated light from the laser 700 passes from the laser output 702 through an opening 722 before reaching a DOE 713 adhesively bonded to a recess in the DOE holder 710 and passing out the opening 714 in the DOE holder 710. An O-ring 704 is positioned between the laser 700 and DOE sealing block 720. Another O-ring 716 is positioned between the DOE sealing block 720 and the DOE holder 710. Fasteners 717 attach the DOE sealing block 720 to the DOE holder 710. A red pointer beam source 730 attaches to DOE holder 710 and is held in place by the DOE sealing block 720. The red light from the red pointer beam source 730 passes through a hole 715 and is emitted out the front face of the DOE holder 710. The red beam propagates out of the projector 50 parallel to the infrared beam from the laser 700. Electrical power is provided to the red pointer beam source 730 over the cable 732, which is connected to the FPGA-electronics board assembly 938 shown in FIGS. 9A, 9B, 9C. The leads from the butterfly package of the infrared laser 700 likewise connect to the electrical board 750. The thermal gap filler 728 is sandwiched between the DOE holder 710 and the projector heat-sink cover 730. The excess heat dumped to the projector holder 430 passes through the DOE sealing block 720, DOE holder 710, and thermal gap filler 728 to enter the heat sink 740, which includes thermal fins and a relatively large thermal capacity to dissipate heat generated by the infrared laser 700. The thermal gap filler 728 conducts heat from the DOE holder 710 to the heat-sink cover 740. The thermal gap filler 728 and window 742 protect the DOE 713 from exposure to dirt and other contaminants.

The DOE generates a pattern, which in an embodiment is a collection of spots and in another embodiment further includes a collection of lines, as discussed herein below in reference to FIGS. 23, 24A, 24B, 24C, 24D, 25A, 25B, 26A, 26B, 27A, 27B. A correspondence between projected and imaged patterns is evaluated to determine 3D coordinates of an object under test, as further discussed herein below in reference to FIGS. 19, 20A, 20B, 21, 22, 23. In an embodiment, the pattern includes a rectilinear grid of 11000 spots.

The use of a TE cooler in the laser 700 and a TE control circuit on the electrical board 750 stabilizes the laser wavelength, preventing the wavelength from drifting over a range of different values. By providing each of the IR cameras 610A, 610B with a relatively narrow optical passband filter having a passband selected to pass light emitted by the laser 700, the amount of background IR light that reaches the photosensitive arrays 512 of the cameras is greatly reduced. As a result, in most cases, the scanner 10 is able to make measurements in full sunlight.

Referring back to FIG. 3, a method for attaching the carrying structure 330 within the overall structure of the triangulation scanner 10 is now described. In an embodiment, the carrying structure 330 in FIG. 3 rigidly supports the camera and projector elements. In an embodiment, elements that surround the carrying structure are designed to minimize forces applied to the carrying structure 330. In this way, stability of the carrying structure 330 is improved when there are changes in ambient temperature or changes in forces such as gravitational forces on the triangulation scanner 10. Gravitational forces may result from a change in direction of the 3D triangulation scanner 10, for example, when the triangulation scanner is turned upside down or turned on its side.

In an embodiment, the left cover plate 332 and the right cover plate 334 in FIG. 3 each have six connection features 333. The bottom three connection features of the left cover plate 332 each attach to one of the fingers 343 of the finger plate 342, and the bottom three connection features of the right cover plate 334 each attach to one of the fingers 343 of the finger plate 344. The finger plates 342, 343 attach to the perforated rear cover 220, one on each side of the rear cover extension 221. In an embodiment, the top three connection features of the left cover plate 332 each attach to one of the fingers 347 of the finger plate 346, and the top three connection features of the right cover plate 334 each attach to one of the fingers 347 of the finger plate 346. The fingerplate 346 is attached to the perforated rear cover 220.

The combination of the cover plates 332, 334, the finger plates 342, 344, 346, and the perforated rear cover 220 form a box-like structure, three sides of which are formed of thin sheet metal. The cover plates 332, 334 are attached to bumpers 630A, 630B (FIGS. 3, 6A) with fasteners that pass-through holes 311A, 311B, 331A, 331B and screw into tapped holes 631A, 631B.

The enclosure 80 includes the outermost components of the scanner 10 such as the perforated rear cover 220, the handle cover assembly 320, and the faceplate assembly 310. Within the enclosure are a number of elements such as cover plates 332, 334 and bumpers 630A, 630B that hold the carrying structure 330 in a manner that allows the carrying structure 330 to "float" within the enclosure 80, thereby reducing or minimizing changes among the relative positions and orientations of the cameras 20, 30, 40 and projector 50. It has been found that this loose coupling of the rigid carrying structure and other components thereby provides more stable measurements.

Figure 8:
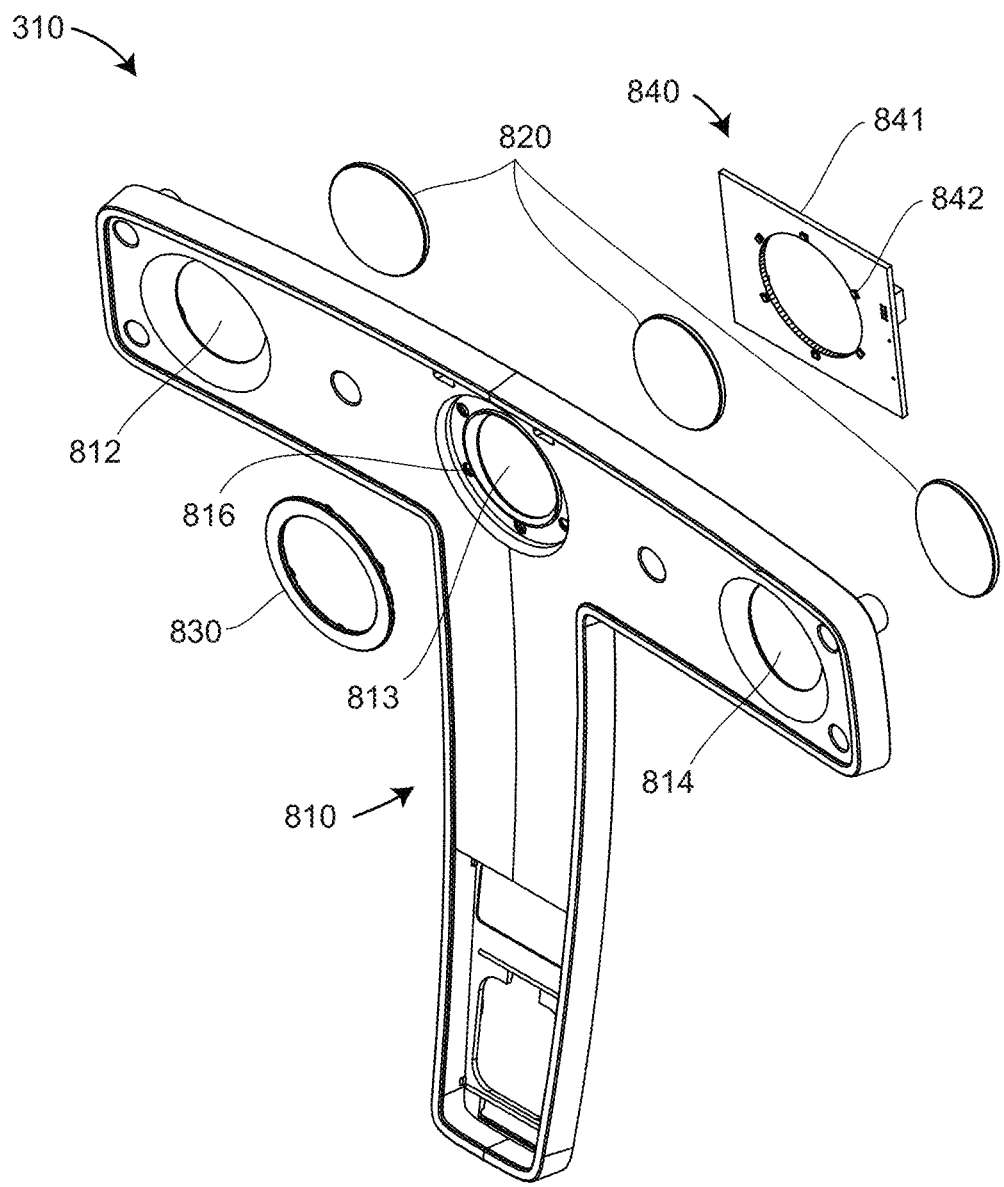
FIG. 8 is an exploded perspective view of faceplate and illumination assembly according to an embodiment of the present invention.

FIG. 8 is a perspective view of an exemplary faceplate assembly 310. The faceplate assembly 310 includes a face panel 810, camera windows 820, light guide 830, and illumination assembly 840. The face panel 810 includes openings 812, 813, 814 for light passing to the cameras 20, 30, 40, respectively. Around the edges of the opening 813 are a collection of holes 816. The holes 816 are covered by the light guide 830. The illumination assembly 840 includes circuit board 841 on which surface-mount white LEDs 842 are positioned to project light into the holes 816. Foam gaskets 312 (FIG. 3) fit over camera holders 406A, 406B, 406C, pressing against the face panel 810 to seal the camera assemblies 610A, 610B, 612 from dirt and dust.

Figure 9B:
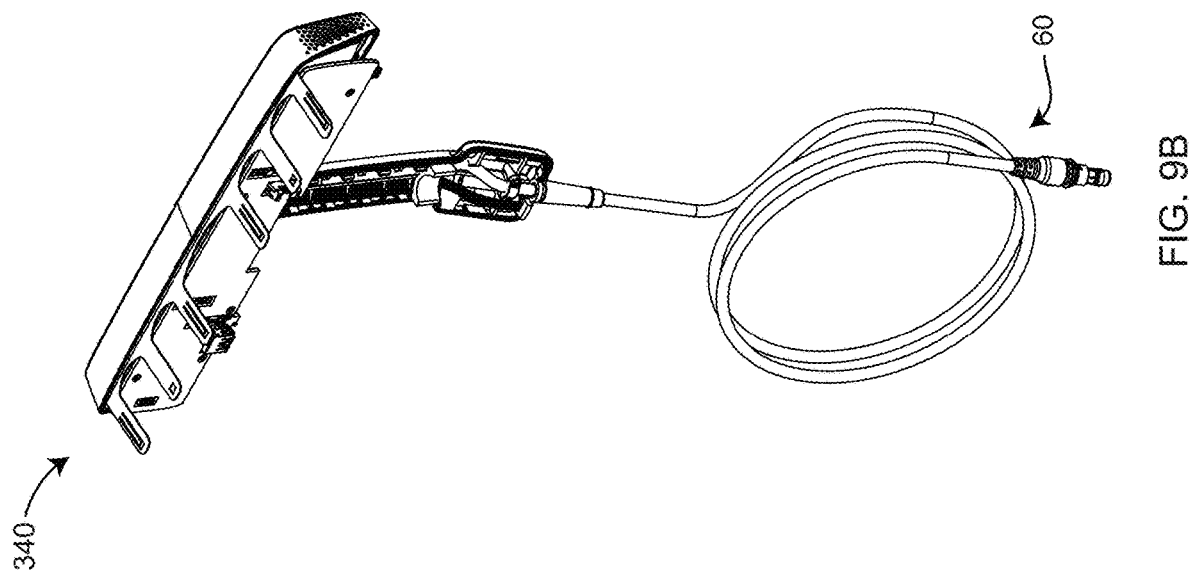
FIGS. 9A, 9B include a housing cover, cooling assembly, and electronics assembly exploded to two different levels according to an embodiment of the present invention.
Figure 9A:
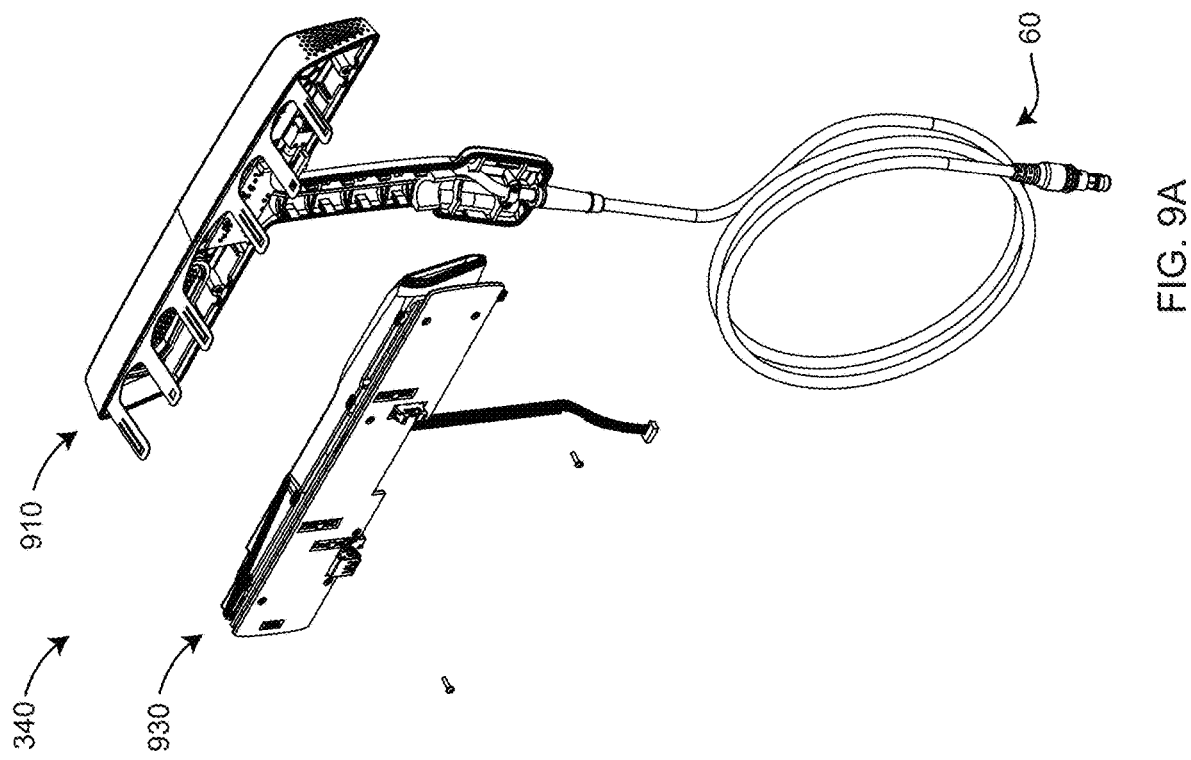
Figure 9C:
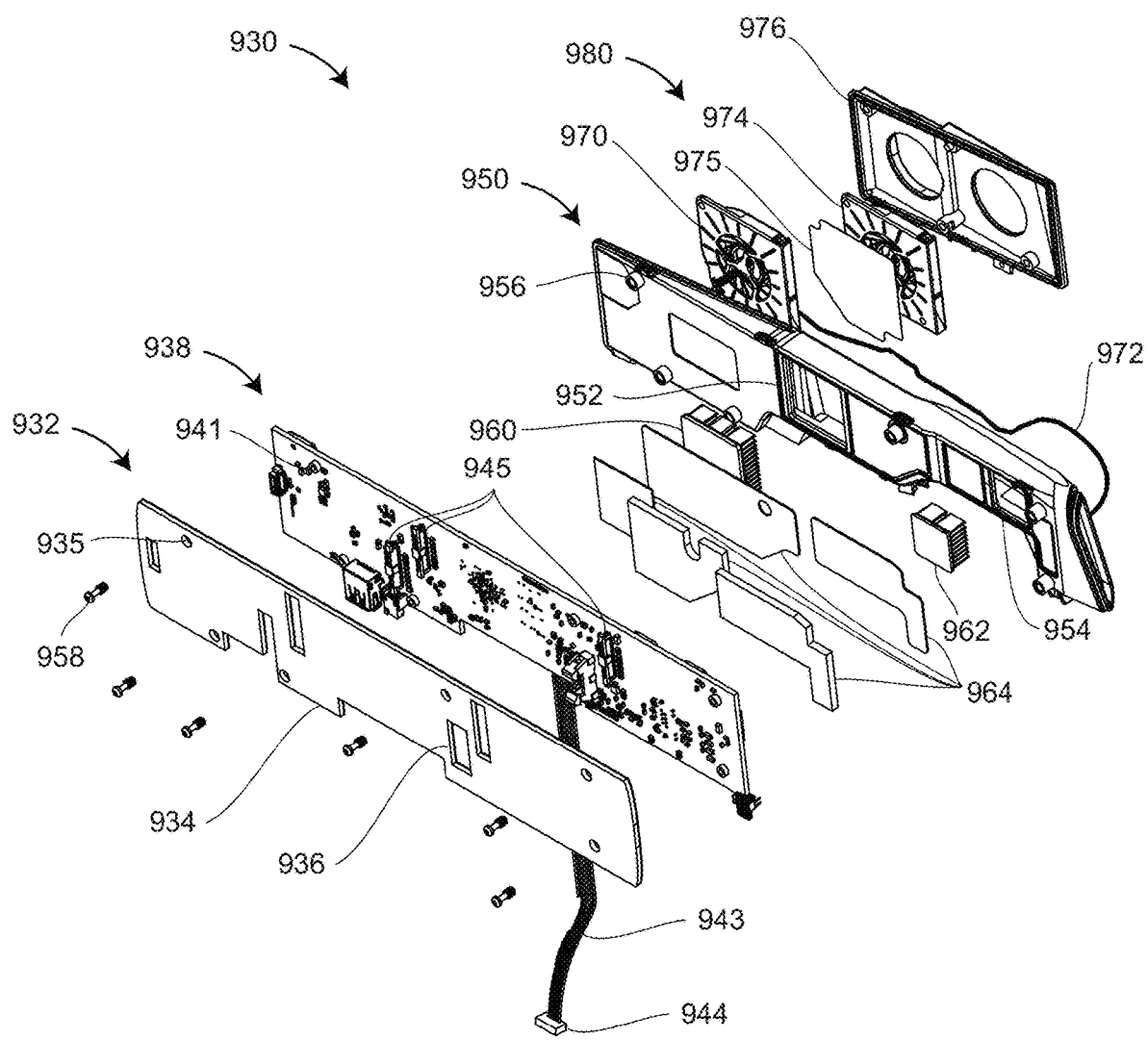
FIGS. 9C, 9D are front and rear exploded perspective views of an electronics and cooling assembly according to an embodiment of the present invention.
Figure 9D:
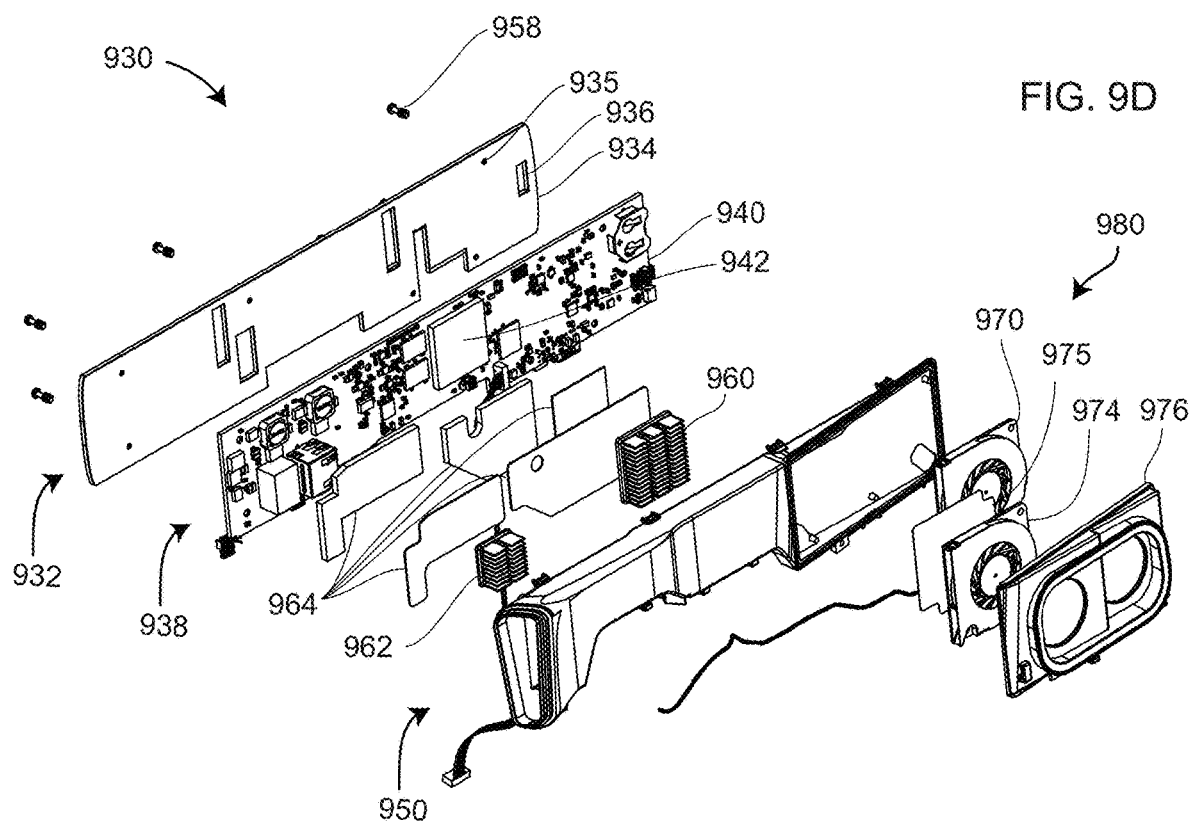
Figure 9E:
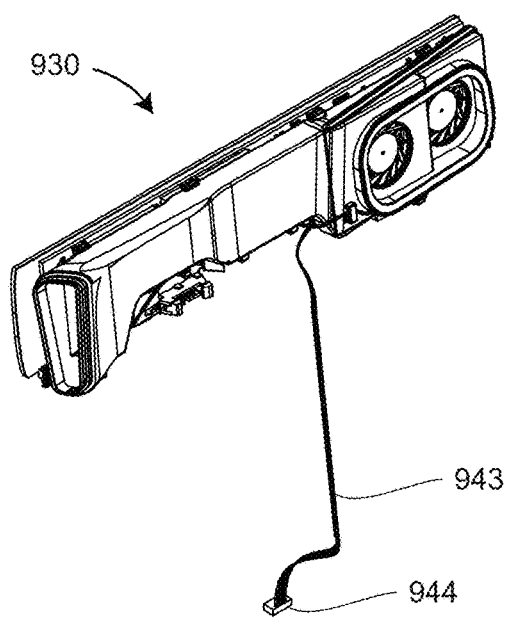
FIG. 9E is a rear perspective view of the electronics and cooling assembly according to an embodiment of the present invention.

FIGS. 9A, 9B are exploded perspective and assembled perspective views of rear assembly 340. In an embodiment, the rear assembly 340 includes electronics-cooler assembly 930, rear cover assembly 910, and Ethernet cable 60. FIGS. 9C, 9D, 9E are exploded front perspective, exploded rear perspective, and assembled rear perspective views, respectively, of the electronics-cooler assembly 930. In an embodiment, the electronics-cooler assembly 930 includes a front panel assembly 932, an FPGA-electronics board assembly 938, a duct assembly 950, and a fan assembly 980. In an embodiment, the FPGA electronics board assembly 938 includes circuit board 940, standoffs 941, field-programmable gate array (FPGA) chip 942, cable 943, and connector 944, as well as other electrical components. In an embodiment, the electronics board assembly 938 further provides one or more temperature sensors that monitor the temperature of the interior of the scanner 10. The electronics-cooler assembly 930 further includes duct assembly 950, which includes openings 952, 954 to accept heat sinks 960, 962, respectively. The heat sinks 960, 962 are thermally, but not electrically, connected by gap-filling pads 964 to electrical components on the circuit board 940, especially FPGA 942 and DC-to-DC converter components. Front panel assembly 932 includes a front panel 934 having slots 936 that pass over large electrical components on the circuit board 940.

Fasteners 958 pass through holes 935 and standoffs 941 before attaching to threaded standoffs 956 on the duct assembly 950. Tightening of the fasteners 958 allows for the thermal gap fillers 964 to remain firmly pressed against the heat sinks 960, 962. In an embodiment, the front panel 934 provides electromagnetic shielding for electrical components on the circuit board 940. The front panel 934 also provides thermal shielding of the remaining interior of the scanner 10 from heat generated by electrical components on the circuit board 940.

Figure 9F:
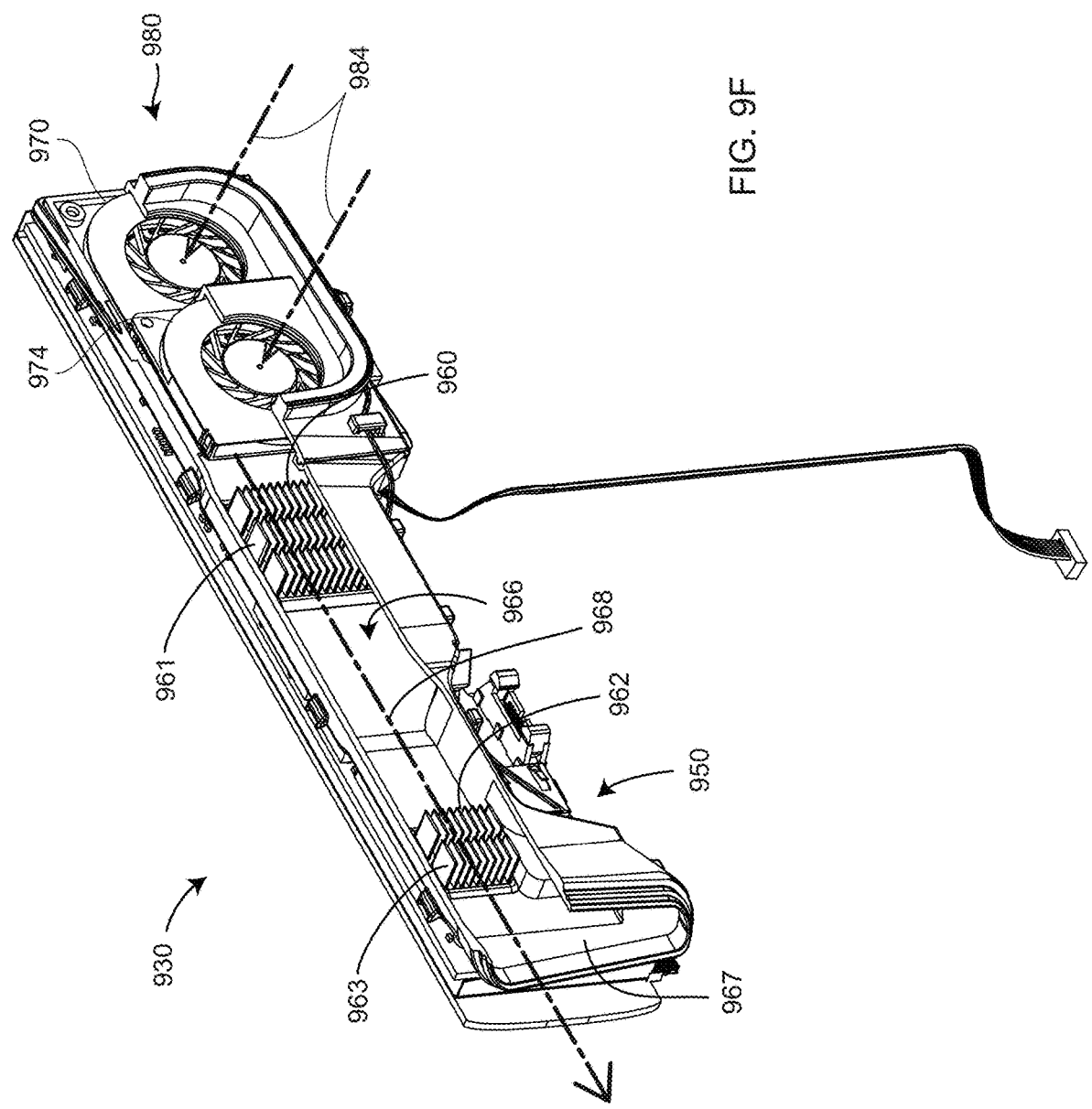
FIG. 9F is a cutaway view of the electronics and cooling assembly according to an embodiment of the present invention.

The duct assembly 950 includes the threaded standoffs 956, the openings 952, 954, and an internal channel 966 through which air is directed over fins of the heat sinks 960, 962 and expelled out of the duct assembly 950 through the duct exit port 967, as shown in cutaway view of the electronics-cooler assembly 930 of FIG. 9F. The fan assembly 980 includes an outer fan 974, a fan cover 975, an inner fan 970, and a fan cover 976. The perforated rear cover 220 (FIG. 2) of the rear assembly 340 fits over the electronics-cooler assembly 930. The fans 970, 974 rotate in such a direction as to draw air 984 in through the perforations in the perforated rear cover 220. The drawn-in air 984 passes along a path 968 in the internal channel 966 and passes out of the exit port 967. Although the exit port 967 is open to the outside environment, the duct assembly 950 has a water-tight and dust-tight seal with respect to the rest of the scanner 10. In an embodiment, the drawn-in air passes over fins 961 in heat sink 960 and over fins 963 in heat sink 962. One type of fin, illustrated by the fins 961, 963, include flat elements surrounded by air. An advantage of a finned heat-sink structure is that it enables a relatively large transfer of heat from the hot fins to the surrounding cooler air blown over the fins and expelled through the exit port 967.

FIG. 9G is a rear view of the duct assembly 950 and the fan assembly 980. Section views A-A and B-B are shown in FIGS. 9I and 9H, respectively. The two fans 970, 974 are radial fans, also known as centrifugal fans. This type of fan receives air in an input direction and propels it in a direction perpendicular to the input direction, in this case, along the direction 968. By stacking the two radial fans 970, 974, air may be propelled to fill the internal channel 966 in a smooth flow that efficiently removes heat from the heat sinks 960, 962 without causing vibration. In the cross-section A-A of FIG. 9I, the two fans 970, 974 can be seen behind the heat sink 960 to fill the region containing the fins of the large heat sink 960, thereby providing efficient and effective cooling of the largest heat generators on the circuit board 940. In the cross-section B-B of FIG. 9H, a small gap is left around the heat sink 962 to preserve the nearly laminar flow of the air along the path 968.

Figure 10:
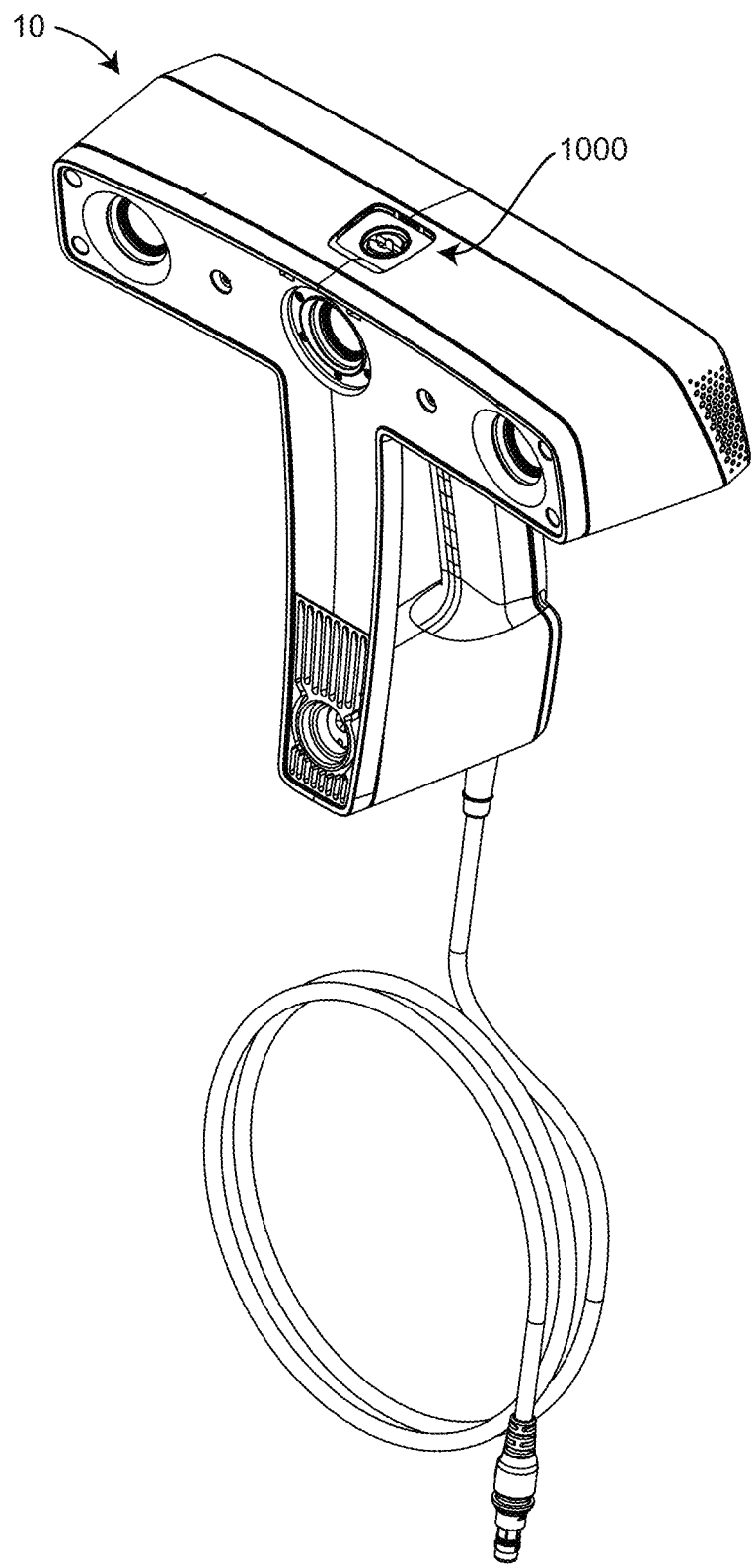
FIG. 10 is a front perspective view of the 3D triangulation scanner showing the accessory interface according to an embodiment of the present invention.

FIG. 10 is similar to FIG. 1 except that the cap 12 (FIG. 1) has been removed to reveal the accessory interface 1000. In an embodiment, the accessory interface 1000 is a threaded hole that accepts a variety of accessories. In an embodiment, the threaded hole is UNC-¼ inch, which is to say, a Unified National Coarse (UNC) screw having a diameter of ¼ inch with 20 threads per inch. In other embodiments, metric threads are used. The method of attaching the threaded hole to the carrying structure assembly 330 is shown in FIGS. 3, 4A. In an embodiment, the accessory interface 1000 includes an interface plate 408 and screws 412 as shown in FIG. 4A. In another embodiment shown in FIGS. 6A, 6B, the accessory interface is attached to the top of an aluminum upper subassembly 600.

In embodiments, several types of accessories are attached to the accessory interface 1000. Such devices include but are not limited to: a color camera, a laser line generator, a mobile phone, an inertial measurement unit (IMU), a global positioning system (GPS), a robot arm, a target, and a projector. In an embodiment, the accessory color camera provides high-resolution color images that are used to colorize the 3D scan data provided by the scanner 10 or to add annotation data to displayed images.

In an embodiment, the laser line generator is attached to the accessory interface 1000. In an embodiment, the laser line generator produces a line of laser light that is imaged by the built-in registration camera 30 (FIG. 1) to add line scanning functionality to the scanner 10. In an embodiment, the laser line is projected in a plane that intersects the cameras 20, 30, 40 in FIG. 1. The pattern of the projected line light as captured by the two-dimensional array of the registration camera 30 is used by a processor to perform triangulation calculations that give the 3D coordinates of object points intersected by the line of light. In another embodiment, the cameras 20, 40 are further used to image the projected line of light.

In an embodiment, a mobile computing device, such as a cellular telephone for example, is added to the accessory interface 1000. Sensors within the mobile computing device such as the GPS, IMU, camera, and so forth can be used to assist in scan registration, tracking, data quality, augmented reality, and so forth. An alternative method of using a mobile computing device with the scanner 10 is described in reference to FIGS. 12A, 12B.

In embodiments, dedicated sensors such as an IMU or a GPS are attached to the accessory interface 1000. Such sensors may have more accuracy or capability than those sensors found in a mobile computing device. In another embodiment, the scanner 10 is attached to a robot by the accessory interface 1000. In this case, the scanner 10 may be used to measure 3D coordinates at locations accessed by the robotic system.

In an embodiment, a target is added to the accessory interface 1000 to make the Freestyle recognizable or trackable by other devices. For example, the target might be a retroreflector such as a cube-corner retroreflector, possibly embedded in a spherically mounted retroreflector. In this case, the target could be tracked by a laser tracker, for example. In another embodiment, the target is a six-DOF probe that is tracked by a six-DOF tracker in six degrees-of-freedom, thereby enabling the pose of the scanner 10 to be determined during movement of the probe. In other examples, the position of a target is determined by a camera system, such as a stereo camera system, for example. For the case in which there are several scanners in an environment, the target may provide a recognizable code that identifies the scanner 10. The target may also provide a way for a given target to be identified in the scan of a second scanner, allowing for easier registration.

In an embodiment, a projector is added to the accessory interface 1000. In an embodiment, the added projector emits patterns of light that provide additional information. For example, the projector may project computer aided design (CAD) data of known objects.

Figure 11:
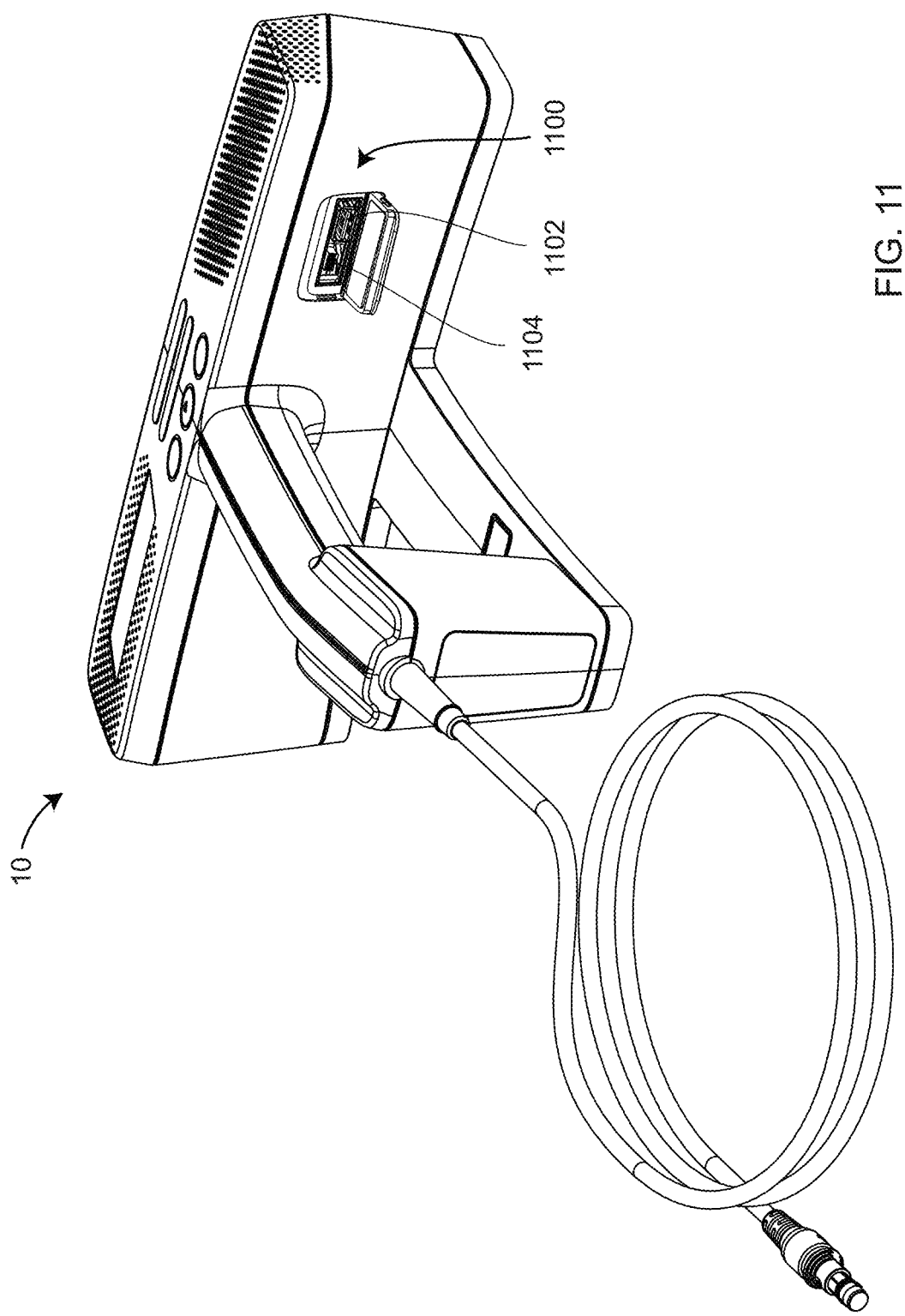
FIG. 11 is a perspective view of the underside of the 3D triangulation scanner showing a USB and automation interface according to an embodiment of the present invention.

FIG. 11 is an perspective view of a scanner 10 showing a "USB and automation interface" 1100 in an open position. In an embodiment, the USB and automation interface 10 includes a Universal Serial Bus (USB) female connector 1102. The USB is an industry standard maintained by the USB Implementer's Forum. The USB is designed to provide power as well as data communications. In most cases, the accessories attached to accessory interface 1000 are either connected with a USB cable to the USB female port 1102 or they are connected to the scanner system 1720 by wireless communication as illustrated in FIG. 17B.

Figure 12B:
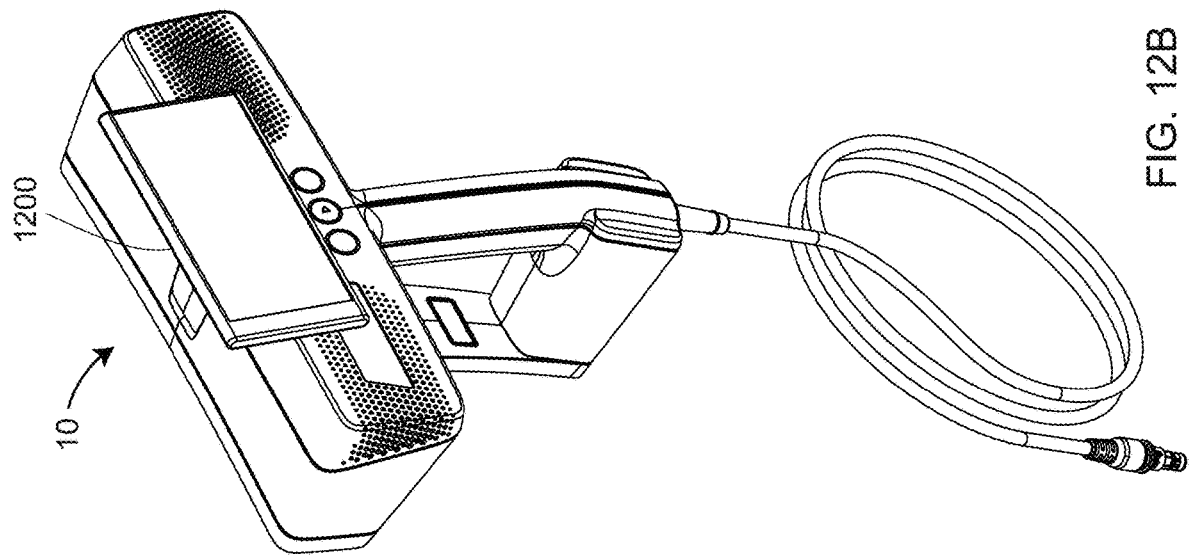
FIGS. 12A, 12B are rear perspective exploded and rear perspective assembled views of the 3D triangulation scanner showing a mobile phone attached to the 3D triangulation scanner according to an embodiment of the present invention.
Figure 12A:
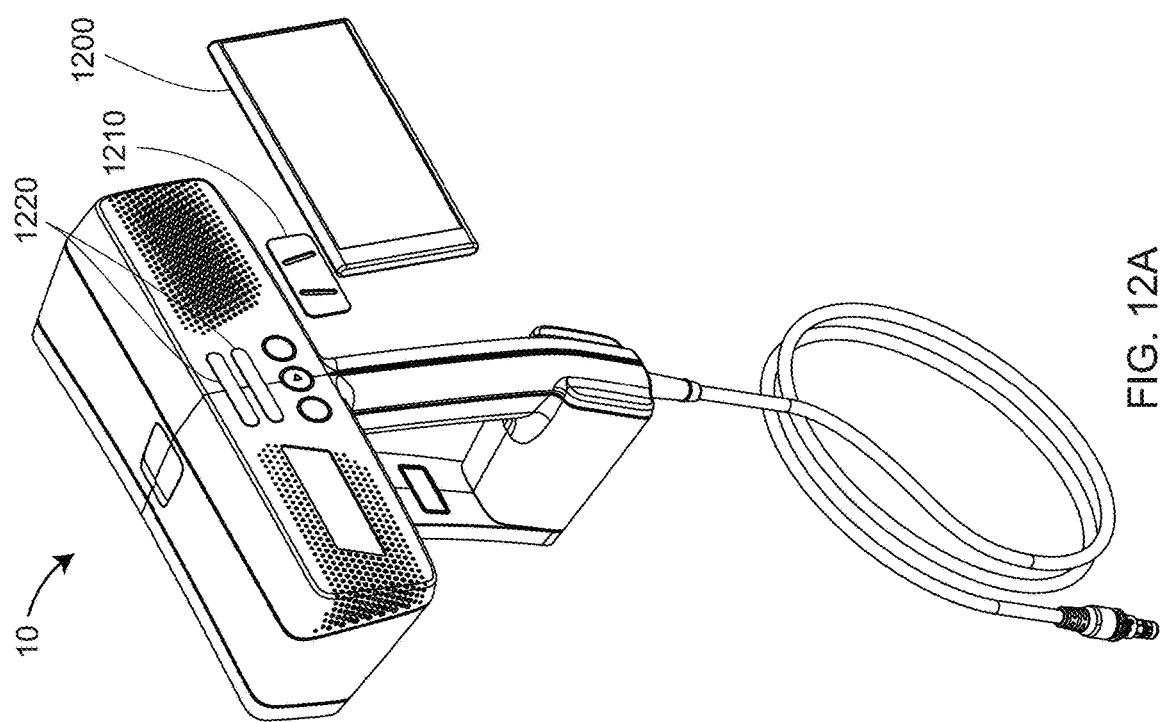

FIGS. 12A, 12B are a perspective exploded view and a perspective assembled view, respectively, of a scanner 10 and a display or mobile computing device 1200, which in an embodiment is a mobile computing device, such as a cellular telephone having a microprocessor, sometimes referred to as a smart phone for example. In other embodiments, the mobile computing device may be another type of general purpose portable computing device such as a personal digital assistant or a tablet computer for example that has been configured to operate with the scanner 10. In an embodiment, the mobile computing device 1200 is held by a metallic adapter plate 1210 to magnets (not shown) placed beneath rubber strips 1220. The display device provides display and computing functionality, including a user interface (UI), which in an embodiment is responsive to touch. In an embodiment, the display device 1200 further includes a rear-facing color camera which may supplement the visual information provided by the registration camera 30, for example, by capturing 2D color still images. In an embodiment, such still images are synchronized with time stamps to the objects captured in 3D by the scanner 10.

Figure 12C:
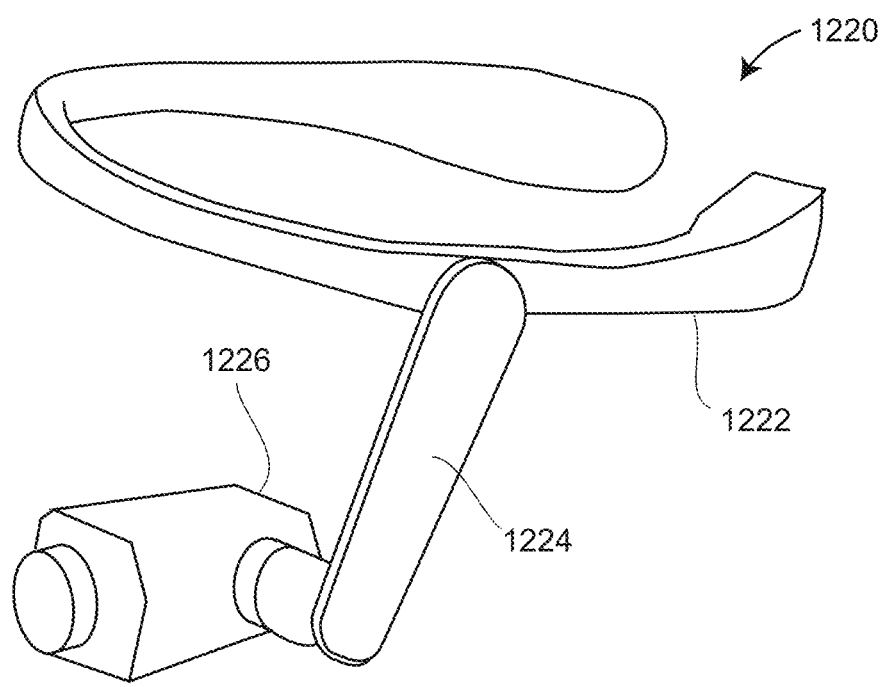
FIGS. 12C, 12D are data glasses of a first type and data glasses of a second type according to an embodiment of the present invention.

Although the mobile computing device 1200 is conveniently attached to the body of the scanner 10, in an embodiment, the mobile computing device 1200 is instead held by hand. In a further embodiment, illustrated in FIGS. 12C, 12D, data glasses are used in place of a mobile computing device display to provide a continuously updated 3D point cloud image. In an embodiment, data glasses 1220 provide an operator with the view that would be displayed on the mobile computing device 1200 were the mobile computing device used. In an embodiment, the data glasses 1220 include a headband 1222, an extension element 1224, and a display unit 1226. In an embodiment, the data glasses 1220 include a high-definition multimedia interface (HDMI) implemented according to Electronics Industries Alliance (EIA)/Consumer Electronics Association (CEA)-861 standards. In an embodiment, an operator has a direct view of the objects being measured with both eyes, while also enabled to monitor the determined 3D image on the display unit 1226. An example of data glasses similar to those illustrated in FIG. 12C is the AirScouter Head Mounted Display manufactured by Brother International Corporation, with headquarters in Bridgewater, N.J.

Figure 12D:
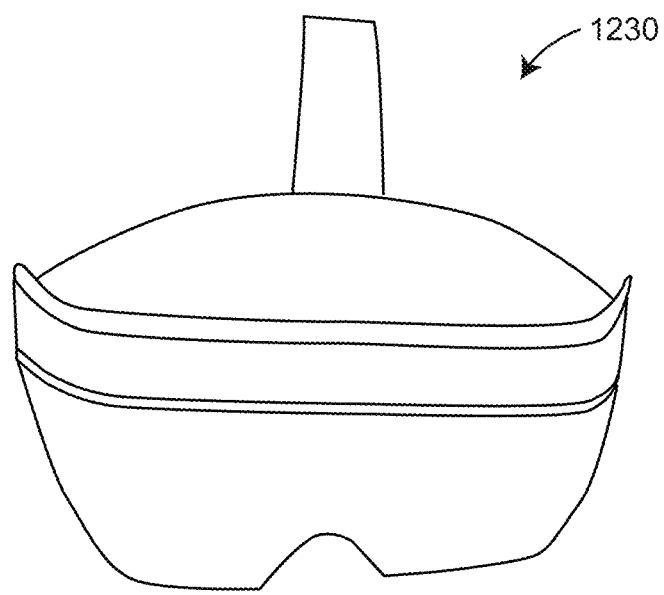

In an embodiment, the data glasses 1230 of FIG. 12D enable an operator to view local surroundings while, at the same time, superimposing a digital representation over the local surroundings. The digital superposition may be obtained using a number of different methods. In one approach, a projector is used to project the digital pattern onto the glasses, which is captured by one or both eyes. At the same time, light from the surroundings passes through the glasses and is seen by the viewer. In another approach, the glasses are digital glasses that capture the surroundings with a camera, which might be a high dynamic range (HDR) camera in some cases.

Figure 13A:
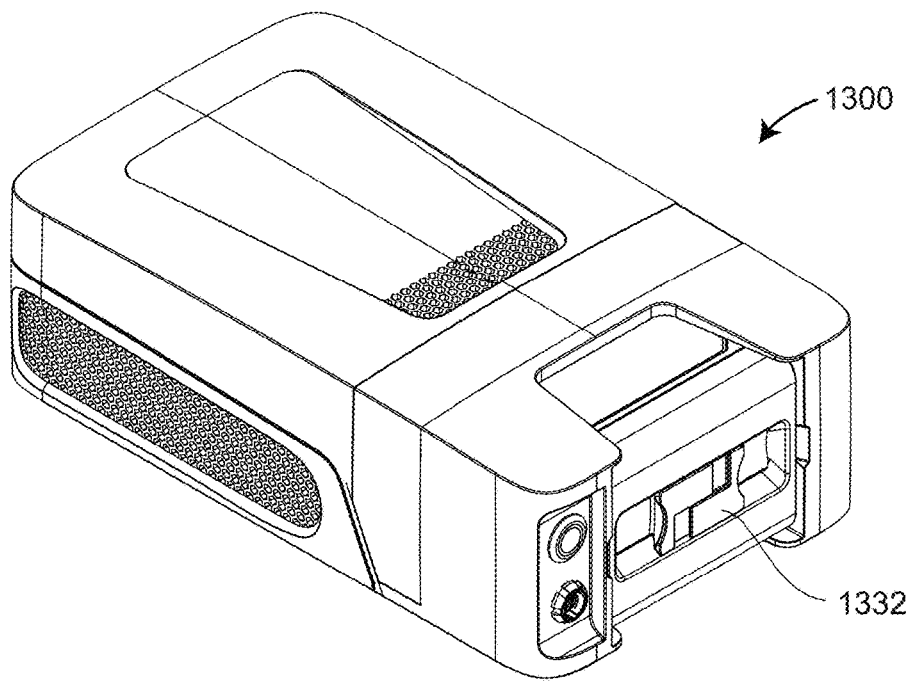
FIGS. 13A, 13B, 13C are front perspective, front exploded perspective, and rear perspective views of a mobile personal computer (PC) according to an embodiment of the present invention.
Figure 13B:
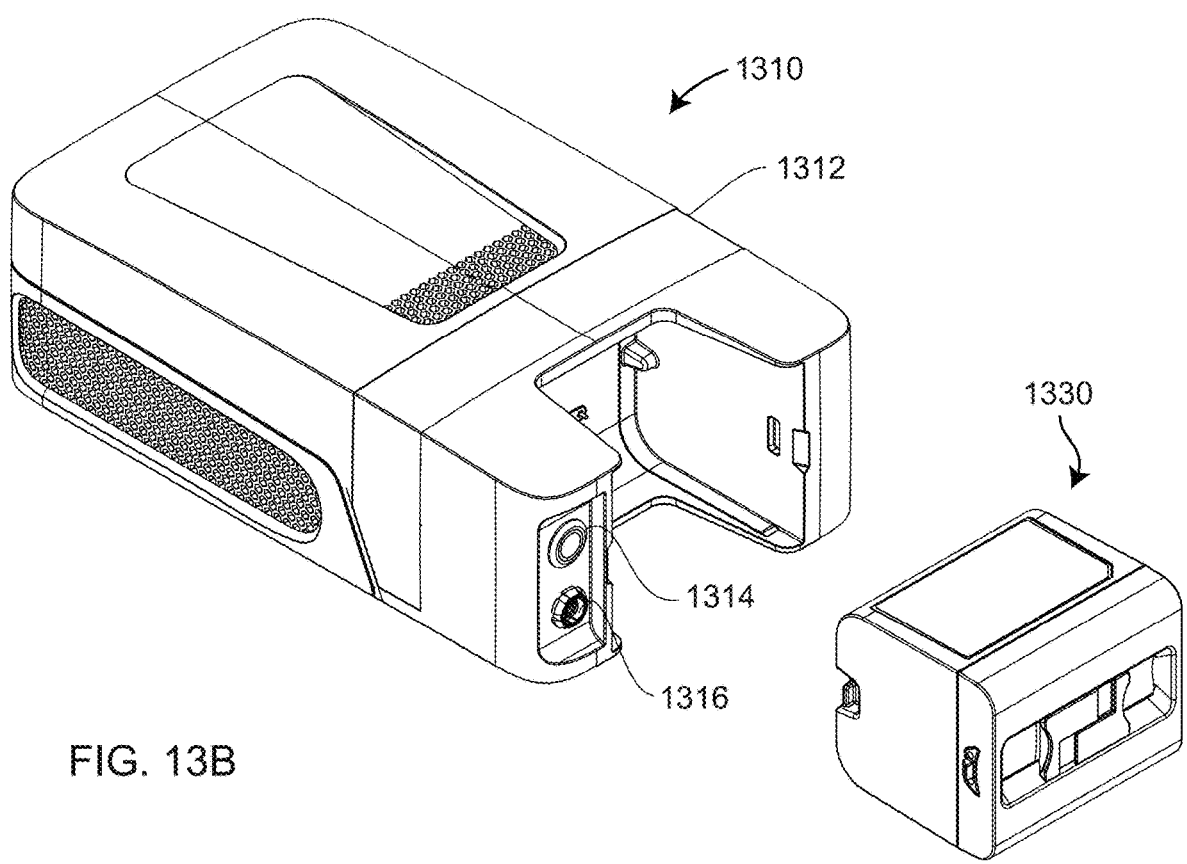
Figure 13C:
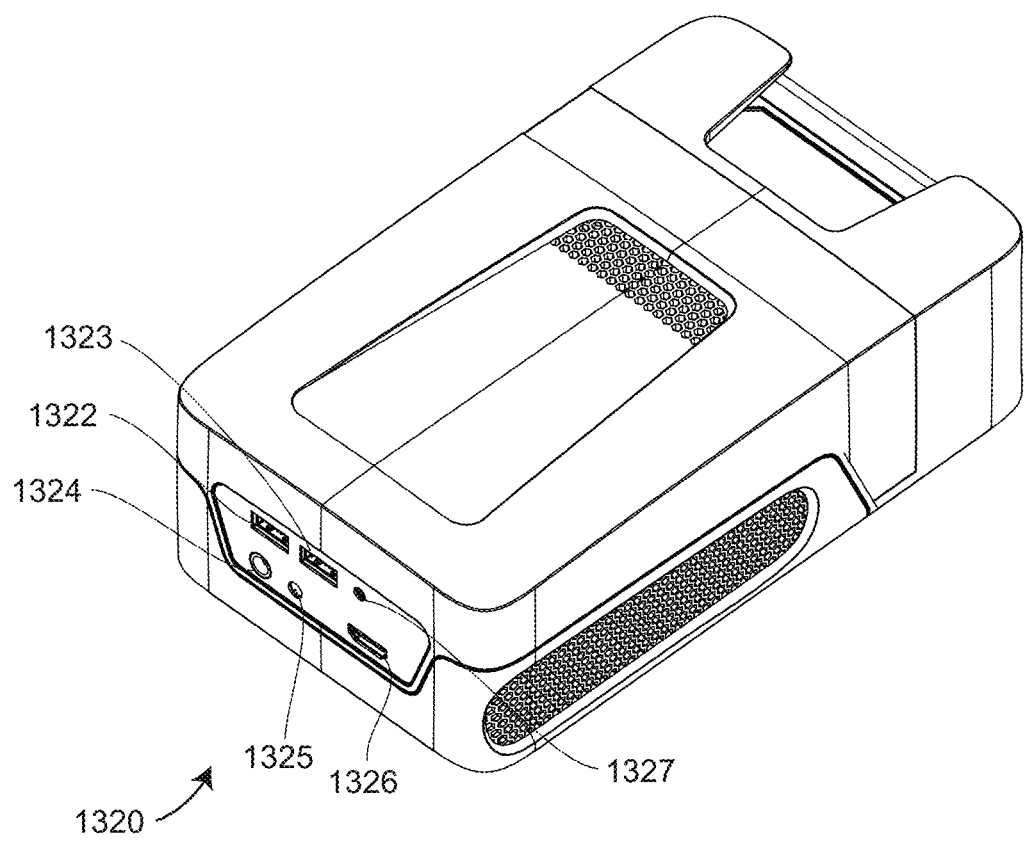

FIGS. 13A, 13B, 13C are perspective views of a mobile personal computer (PC) 1300 in a front perspective view, a front exploded perspective view, and a rear perspective view, respectively. In an embodiment, the mobile PC 1300 includes a computing unit 1310 and a battery 1330. In an embodiment, the computing unit 1310 includes a body 1312, a power on-off button 1314, and connector 1316 that accepts the Ethernet cable 60. Ethernet is a family of computer networking technologies. It was first standardized in 1985 as IEEE 802.3. In an embodiment, the female Ethernet port 1104 supports 1 gigabit per second, often referred to as Gigabit Ethernet. The battery 1330 includes a lock mechanism 1332 that may be squeezed inward to remove the battery from the body 1312. FIG. 13C shows a rear panel 1320 that includes a first USB port 1322, a second USB port 1323, a connector 1324 that accepts a cable from a battery-charger device, an LED 1325, a high-definition multimedia interface (HDMI) port 1326. HDMI is an implementation of the EIA/CEA-861 standards, and an audio jack 1327. In an embodiment, the measurement results and user interface (UI) may be viewed in a web browser on the display connected to the mobile PC 1300 by the HDMI port 1326.

Figure 14:
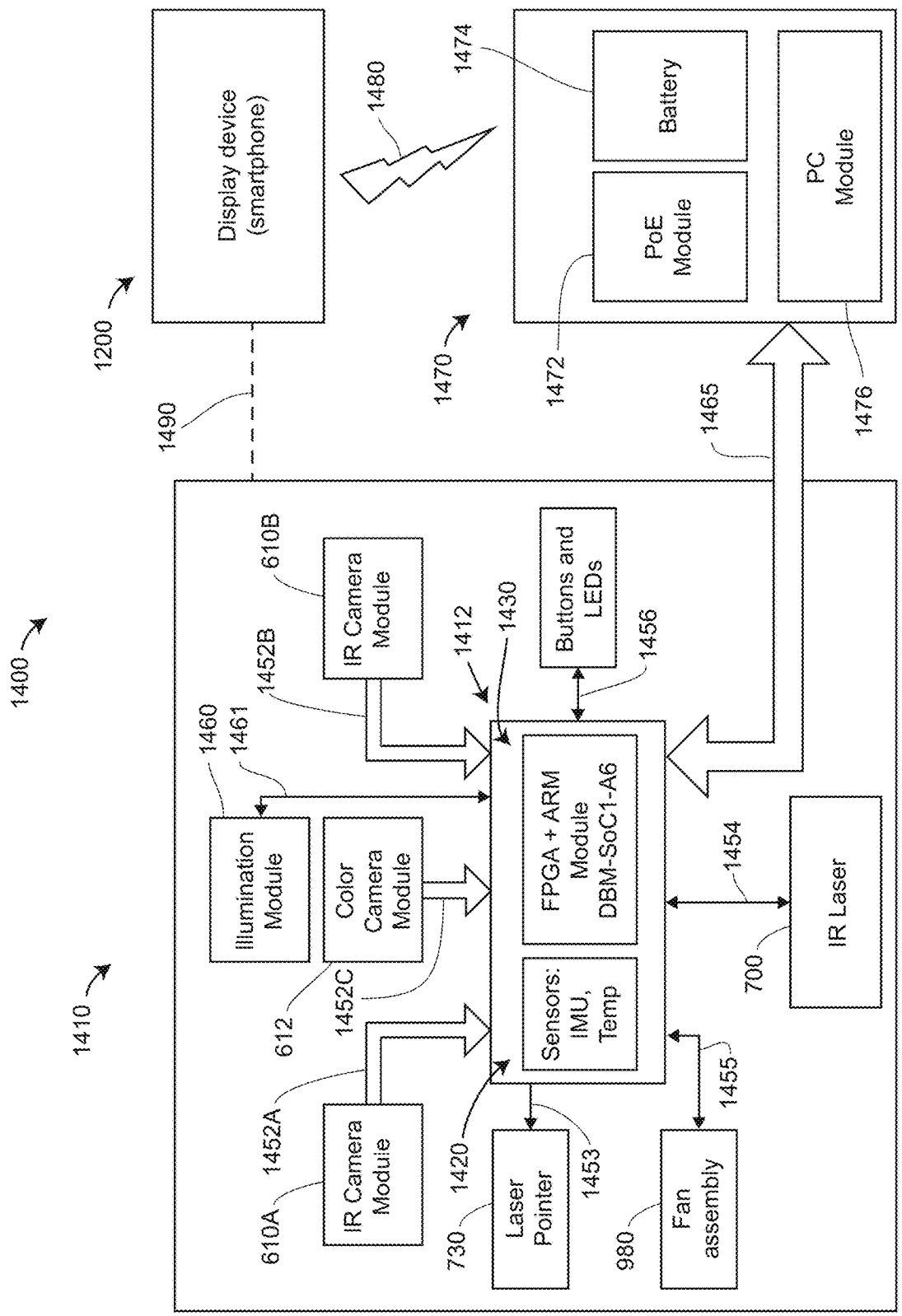
FIGS. 14, 15 are block diagrams of electronics coupled to the triangulation scanner according to an embodiment of the present invention.
Figure 15:
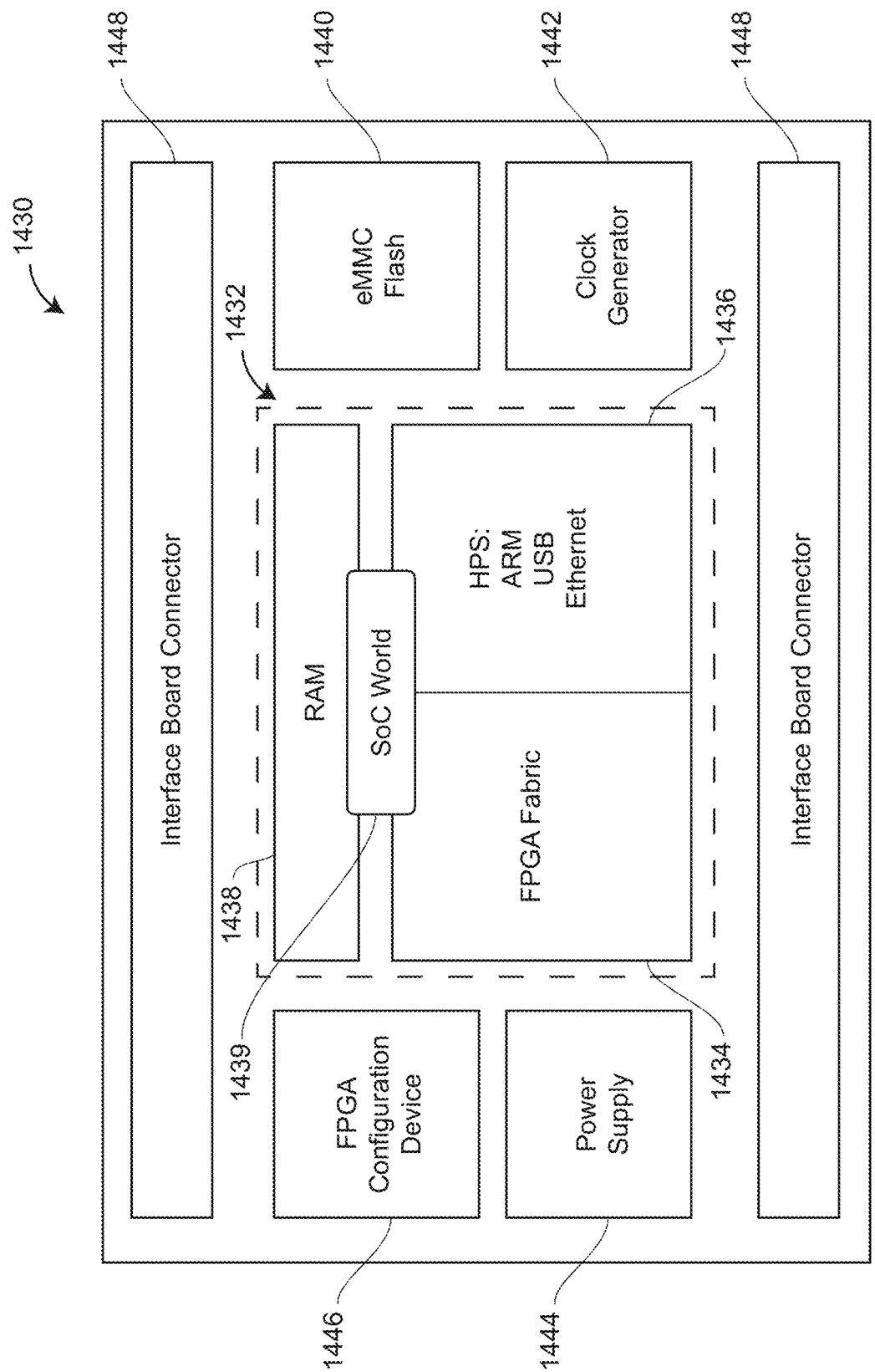

FIG. 14 is a block diagram of system electronics 1400 that in an embodiment is included in the scanner system 10. In an embodiment, the electronics 1400 includes electronics 1410 within the handheld scanner 10, electronics 1470 within the mobile PC 1300, electronics within the mobile computing device 1200, electronics within other electronic devices such as accessories that attach to the accessory interface 1000, and electronics such as external computers that cooperate with the scanner system electronics 1400. In an embodiment, the electronics 1410 includes a circuit baseboard 1412 that includes a sensor collection 1420 and a computing module 1430, which is further shown in FIG. 15. In an embodiment, the sensor collection 1420 includes an IMU and one or more temperature sensors. In an embodiment, the computing module 1430 includes a system-on-a-chip (SoC) field programmable gate array (FPGA) 1432. In an embodiment, the SoC FPGA 1432 is a Cyclone V SoC FPGA that includes dual 800 MHz Cortex A9 cores, which are Advanced RISC Machine (ARM) devices. The Cyclone V SoC FPGA is manufactured by Intel Corporation, with headquarters in Santa Clara, Calif. FIG. 15 represents the SoC FPGA 1432 in block diagram form as including FPGA fabric 1434, a Hard Processor System (HPS) 1436, and random access memory (RAM) 1438 tied together in the SoC 1439. In an embodiment, the HPS 1436 provides peripheral functions such as Gigabit Ethernet and USB. In an embodiment, the computing module 1430 further includes an embedded MultiMedia Card (eMMC) 1440 having flash memory, a clock generator 1442, a power supply 1444, an FPGA configuration device 1446, and interface board connectors 1448 for electrical communication with the rest of the system.

Signals from the infrared (IR) cameras 610A, 610B and the registration camera 612 are fed from the camera boards 510 through ribbon cables 516 to connectors 945 (FIG. 9C). Image signals 1452A, 1452B, 1452C from the ribbon cables 516 are processed by the computing module 1430. In an embodiment, the computing module 1430 provides a signal 1453 that initiates emission of light from the laser pointer 730. A TE control circuit communicates with the TE cooler within the infrared laser 700 through a bidirectional signal line 1454. In an embodiment, the TE control circuit is included within the SoC FPGA 1432. In another embodiment, the TE control circuit is a separate circuit on the baseboard 1412. A control line 1455 sends a signal to the fan assembly 980 to set the speed of the fans. In an embodiment, the controlled speed is based at least in part on the temperature as measured by temperature sensors within the sensor unit 1420. In an embodiment, the baseboard 1412 receives and sends signals to buttons 210, 211, 212 and their LEDs through the signal line 1456. In an embodiment, the baseboard 1412 sends over a line 1461 a signal to an illumination module 1460 that causes white light from the LEDs 842 to be turned on or off.

In an embodiment, bidirectional communication between the electronics 1410 and the electronics 1470 is enabled by Ethernet communications link 1465. In an embodiment, the Ethernet link is provided by the cable 60. In an embodiment, the cable 60 attaches to the mobile PC 1300 through the connector 1316 shown in FIG. 13B. The Ethernet communications link 1465 is further operable to provide or transfer power to the electronics 1410 through the user of a custom Power over Ethernet (PoE) module 1472 coupled to the battery 1474. In an embodiment, the mobile PC 1470 further includes a PC module 1476, which in an embodiment is an Intel® Next Unit of Computing (NUC) processor. The NUC is manufactured by Intel Corporation, with headquarters in Santa Clara, Calif. In an embodiment, the mobile PC 1470 is configured to be portable, such as by attaching to a belt and carried around the waist or shoulder of an operator.

Figure 16:
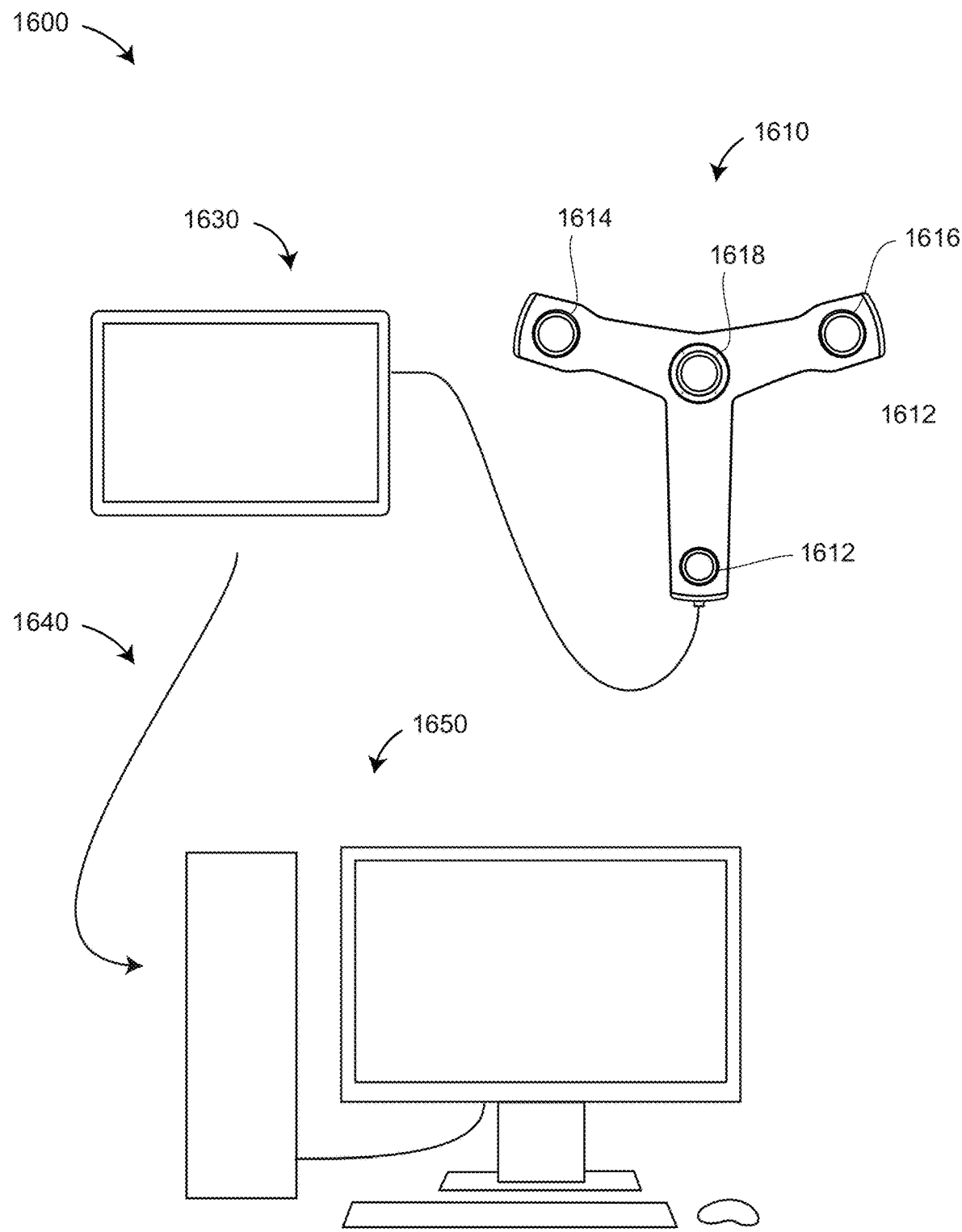
FIG. 16 is a schematic representation of a prior art handheld scanner and processing system.

FIG. 16 illustrates a prior-art scanner system 1600 for measuring 3D coordinates of an object. Included in the system is a 3D scanner 1610 and an accessory computer tablet 1630. In an embodiment, the 3D scanner 1610 includes a projector 1612, a first camera 1614, a second camera 1616, and a registration camera 1618. The accessory computer tablet 1630 performs real-time processing of scan data, as well as post-processing of scan data. In an embodiment, the computer 1630 has the capability of performing more complex application functions such as registering of multiple completed scans. In most cases, the relatively challenging requirements of application functions has led to those applications being performed on a workstation 1650. In an embodiment, data 1640 is transferred to the workstation 1650 using a removable flash memory card such as a microSD card.

In an embodiment, the display for the scanner system is provided by a mobile computing device, such as a cellular telephone with a microprocessor or smart phone for example. In an embodiment illustrated in FIGS. 12A, 12B, the mobile computing device 1200 is attached to the rear of the scanner 10. The display 1200 may obtain image data from the electronics 1470 of the mobile PC in either of two ways.

Figure 17A:
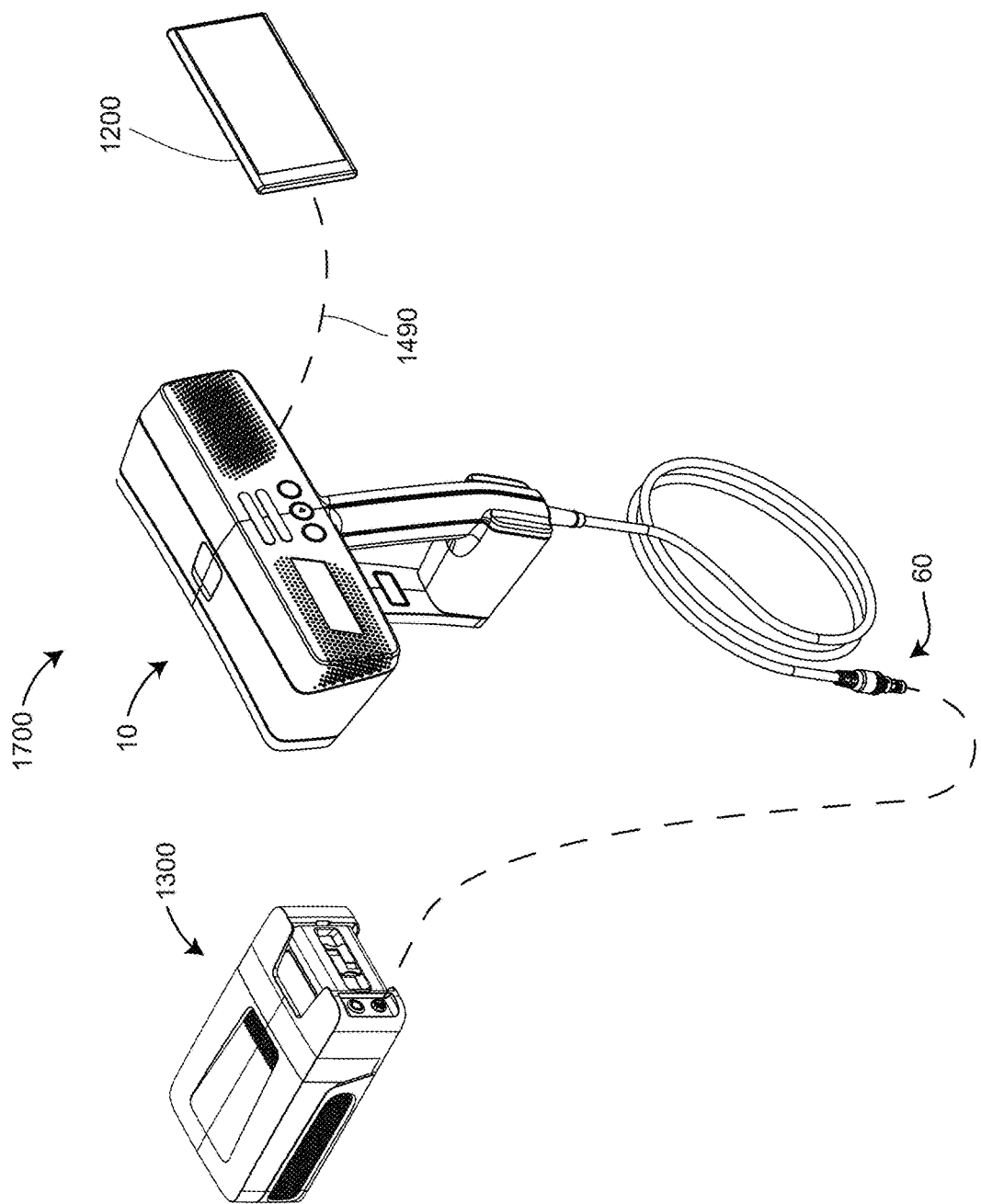
FIG. 17A illustrates a method of interconnecting a mobile PC with a mobile display using USB tethering according to an embodiment of the present invention.

In a first way 1700 illustrated schematically in FIG. 17A, communication between the display device 1200 and the mobile PC 1300 is by cable. A USB cable connects the mobile phone to the scanner 10, for example, through a USB cable 1490 (FIGS. 14, 17A) to the USB port 1102 (FIG. 11). Using USB tethering, the mobile display 1200 is connected to the mobile PC 1300 by the Ethernet cable 60 that provides Ethernet link 1465.

In a second way 1720 illustrated schematically in FIG. 17B, communication between the display device 1200 and the mobile PC 1300 is by wireless communication 1480 such as by Wi-Fi 802.11 ac. Wi-Fi 802.11 ac is a wireless networking standard in the IEEE 802.11 family developed in the IEEE Standards Association and marketed under the brand name Wi-Fi, a trademark of the Wi-Fi Alliance. Wi-Fi 802.11 ac provides high throughput in wireless local area networks (WLANS) on the 5 GHz band. It provides at least 1 gigabit per second of multi-station throughput and at least 500 megabits per second of single-link throughput. In an embodiment, the mobile PC 1300 is a Wi-Fi access point (AP) to which the mobile computing device connects. Data is transferred from the mobile PC 1300 to the mobile computing device 1200 or from the mobile computing device 1200 to the mobile PC 1300 through the Wi-Fi connection.

Figure 17C:
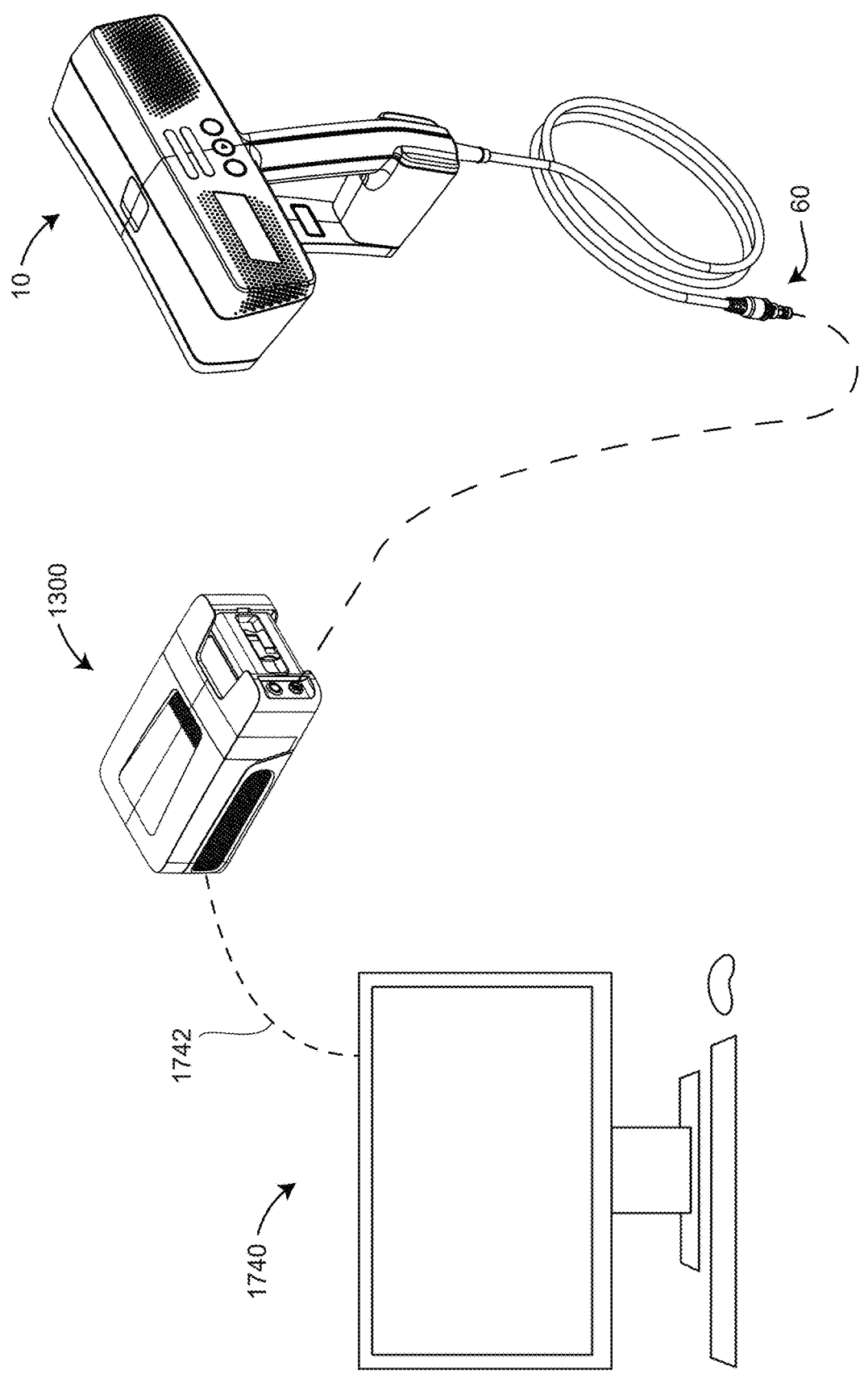
FIG. 17C illustrates a method of interconnecting a mobile PC with a workstation according to an embodiment of the present invention.

A display 1740 may also be substituted for the display 1200 as illustrated in FIG. 17C. In an embodiment, the mobile PC 1300 is connected to the display 1740 by an HDMI cable that attaches to the port 1326 of the mobile PC 1300. Measurement results may be shown on the display 1740 using a web browser.

Figure 18B:
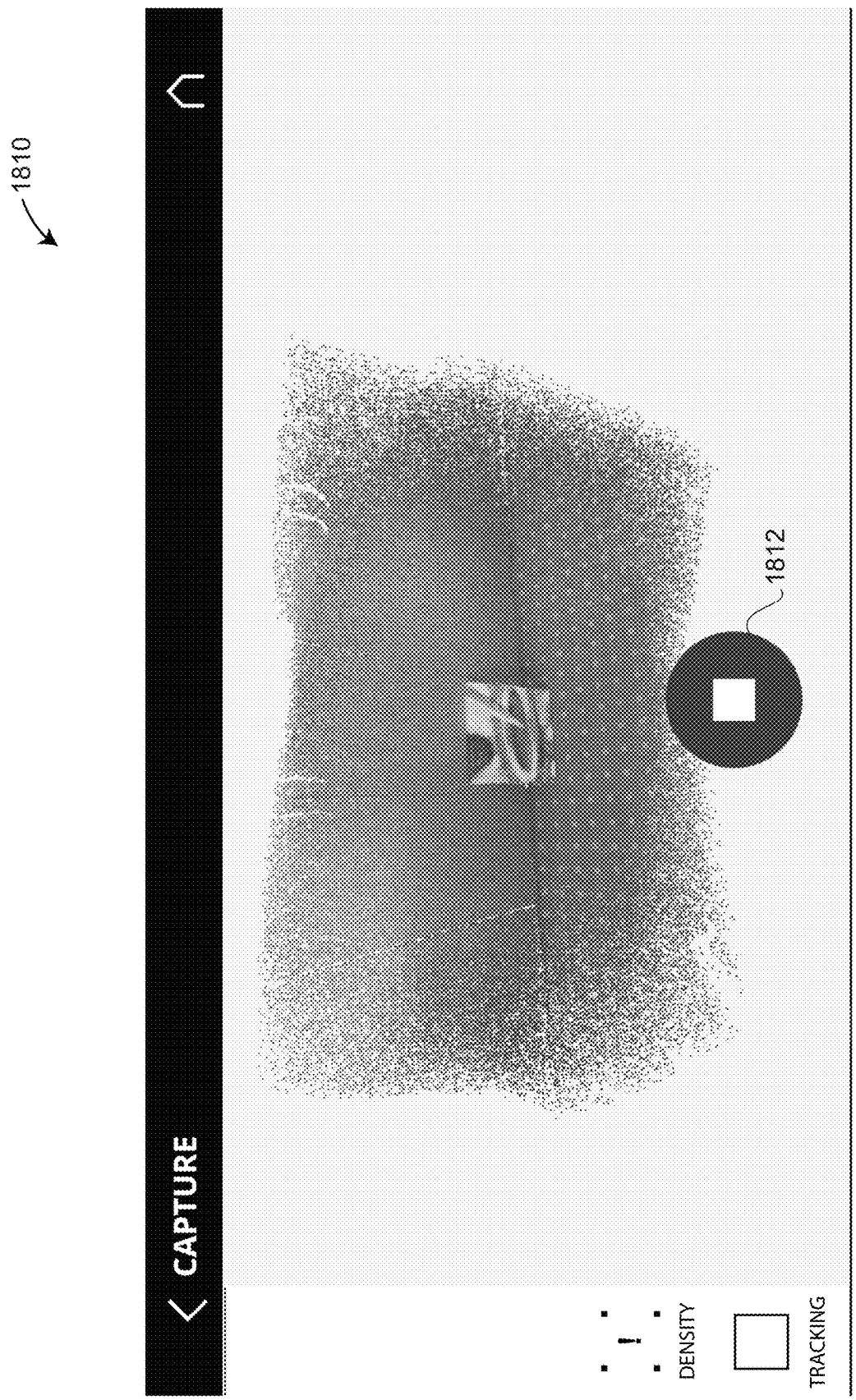
FIG. 18B illustrates a display updated in real time during a measurement by a scanner according to an embodiment of the present invention.

In an embodiment, the mobile computing device provides not only scan results but also a user interface (UI) offering a menu of choices of operation of the scanner system. In this way, the UI provided on the mobile computing device 1200 contains a combination of functionality needed to display collected 3D data and to make selections on the UI to carry out a variety of additional functions such as would be possible with stand-alone application software. FIG. 18A shows an exemplary top level menu 1800 that includes several icons. In an embodiment, pressing the "arrow" icon 1801 causes a 3D measurement to be started, with the resulting 3D data collected and displayed on the mobile computing device 1200 as the measurement progresses. Exemplary 3D data collected during a measurement is shown in FIG. 18B. In this figure, a large button 1812 is present that may be pressed to stop the measurement. In an embodiment, a portion of the captured scan data is presented on the display. As the measurement proceeds the center of the collected scan data moves with the scanner to assist the user in determining whether the desired regions have been fully scanned.

Referring back to the embodiment illustrated in FIG. 18A, the top menu level includes a "tools" icon 1802 that provides a selection of available calibrations such as on-site calibration (for example, using a calibration plate) and white-balancing calibration. In an embodiment, the top menu level further includes a "scan projects" icon 1803 that causes thumbnail size images of scans associated with scan projects to be displayed. These may be selected and viewed. Such scans may also have been obtained from different types of scanning devices. In an embodiment, pressing the "3D" icon 1804 causes collected data to be reformatted into a true 3D image display that may be rotated or translated to view the collected 3D data from a variety of perspectives.

Figure 18C:
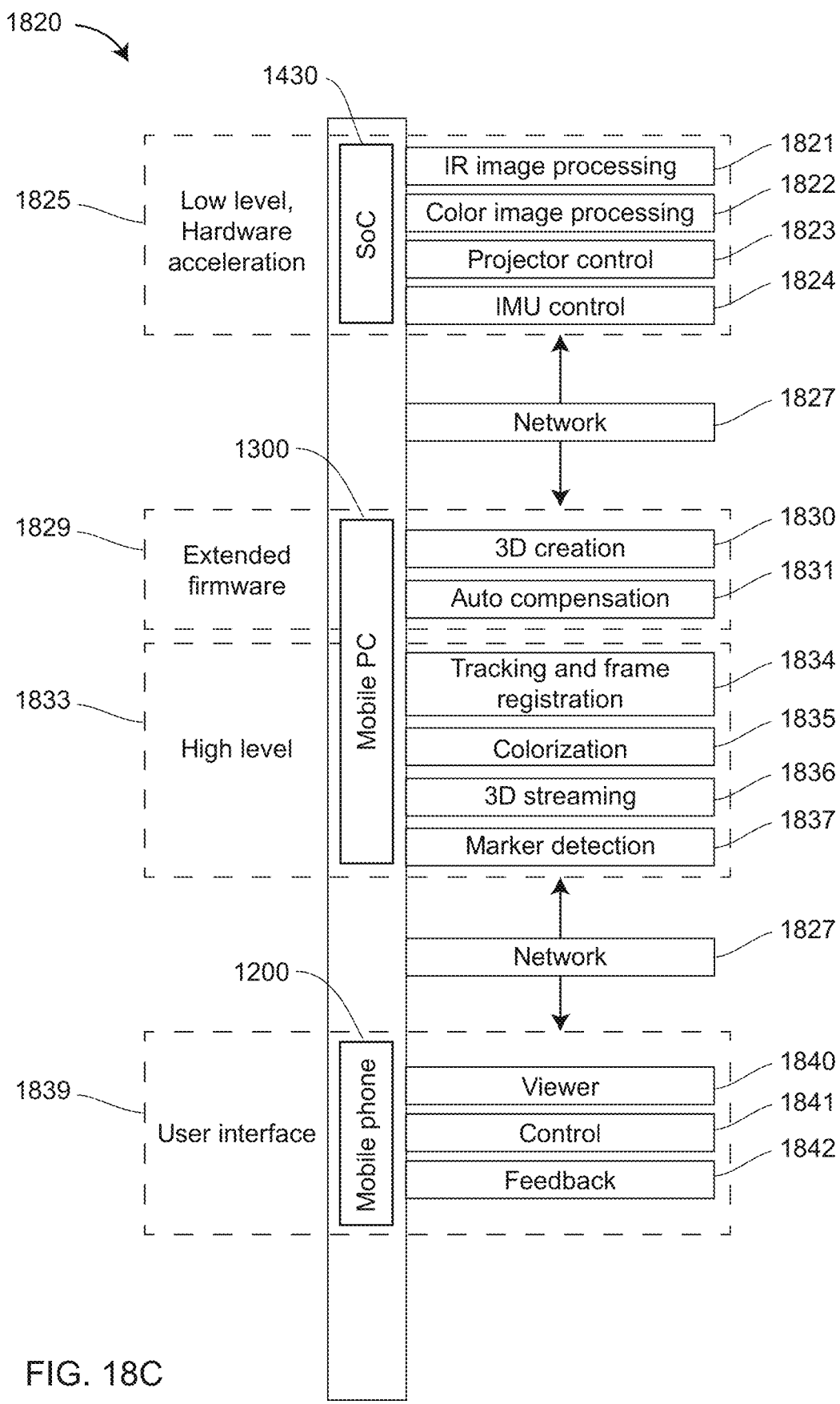
FIG. 18C illustrates processing functions performed according to an embodiment of the present invention.

FIG. 18C shows live (real-time) processing functions carried out by the SoC FPGA 1430, the mobile PC 1300, and the mobile computing device 1200 according to an embodiment. These processing functions are carried out as an operator moves the handheld scanner 10 to scan an object. In an embodiment, live processing speeds of 20 frames per second are achieved. In an embodiment, the results of live processing are displayed on a mobile computing device 1200 as in the example of FIG. 18B.

In an embodiment, during a live processing phase 1820, the SoC FPGA 1430 performs a low-level, hardware acceleration function 1825, including IR image processing 1821, color image processing 1822, projector control 1823, and IMU control 1824. In an embodiment, IR image processing 1821 includes the processing of images obtained on photosensitive arrays such as the arrays of the cameras 20, 40 in FIG. 1. Color image processing 1822 includes the processing of images obtained on the photosensitive array of a color camera such as the registration camera 30 of FIG. 1. Projector control 1823 includes providing timing signals to synchronize the projection of light patterns by a projector such as the projector 50 with image capture by cameras such as the cameras 20, 40. In an embodiment, the IMU control 1824 interfaces with an IMU that includes a three-axis inclinometer (accelerometer) and a three-axis gyroscope.

In an embodiment, the SoC FPGA 1430 is coupled to the mobile PC 1300 and the mobile computing device 1200 through a network 1827. In other embodiments of the present invention, other types of processing devices replace the SoC FPGA 1430 and other devices replace the mobile PC 1300 and the mobile computing device 1200.

In an embodiment, during the live processing phase 1820, the mobile PC 1300 serves an extended-firmware function 1829 that includes 3D creation 1830 and auto compensation 1831. In an embodiment, 3D creation 1830 includes the creation of 3D coordinates by identifying correspondences in left and right camera images and by performing triangulation calculations to obtain 3D coordinates. In an embodiment, 3D creation 1830 further includes locating image features such as spots to sub-pixel precision. In an embodiment, 3D creation 1830 further includes setting the exposure times for IR cameras. In an embodiment, auto compensation 1831 includes verifying that projected and imaged features (such as projected spots) are consistent with the requirements of epipolar geometry as explained in reference to FIG. 22. If inconsistencies are observed, scanner parameters are changed as needed to make the observations consistent. The process of regularly adjusting parameters to minimize inconsistencies is referred to as auto compensation.

During the live processing phase 1820, the mobile PC 1300 further serves a high-level function 1833 that includes tracking and frame registration 1834, colorization 1835, 3D streaming 1836, and marker detection 1837. In an embodiment, tracking and frame registration 1834 is carried out by recognizing common features of a scene in successive frames and then registering those successive frames in a common 3D frame of reference based on those common features. This registration procedure further results in the proper registration of 3D coordinates obtained from camera images such as from the cameras 20, 40. Examples of methods that might be used to identify features include scale-invariant feature transform (SIFT), edge detection, blob detection, to name only a few of the available types. In an embodiment, the features are identified on color images obtained by a registration camera such as the camera 30 in FIG. 1. Colorization 1835 refers to the application of color obtained from a color image to 3D coordinates, which may be obtained for example using an IR projector and IR cameras. 3D streaming 1836 includes the sending of colorized 3D data to a display such as the display on the mobile phone 1300. Marker detection 1837 refers to the detecting of markers intentionally placed in a scene to assist in rapid registration of multiple scans. There are two main types of registrations performed by the scanner system. The first type of registration is "tracking and frame registration" 1834 described herein above. This type of registration is performed rapidly as the handheld scanner 10 is moved to scan an object. The second main type of registration is the "registration of multiple scans," which typically involves completing a first scan and then moving the handheld scanner 10 to a different location to begin a new scan. When the second scan is completed, the two scans are registered together, typically by using common features observed in each of the two scans. One fast and easy way to perform such a scan is to provide markers that may be recognized and quickly matched in each of the two scans. A convenient type of marker is the coded marker, which may be quickly recognized and distinguished from other coded markers based on their different patterns. In marker detection 1837, identified markers may be used for live tracking and registration immediately after detection.

In an embodiment, during the live processing phase 1820, the mobile computing device 1200 serves a user-interface function 1839 that includes viewer 1840, control 1841, and feedback 1842. In an embodiment, the viewer function 1840 includes displaying image data indicating visually regions that have been scanned, for example, as illustrated in FIG. 18B. The control function 1841 includes providing user information to the system, for example, by making user selections on a user interface such as the interface of FIG. 18A. The feedback function 1842 includes providing information to the user, for example, when an error condition is present or when an action (such as calibration) needs to be performed. Such feedback may also be provided graphically, for example, as a scan is being taken.

Figure 18D:
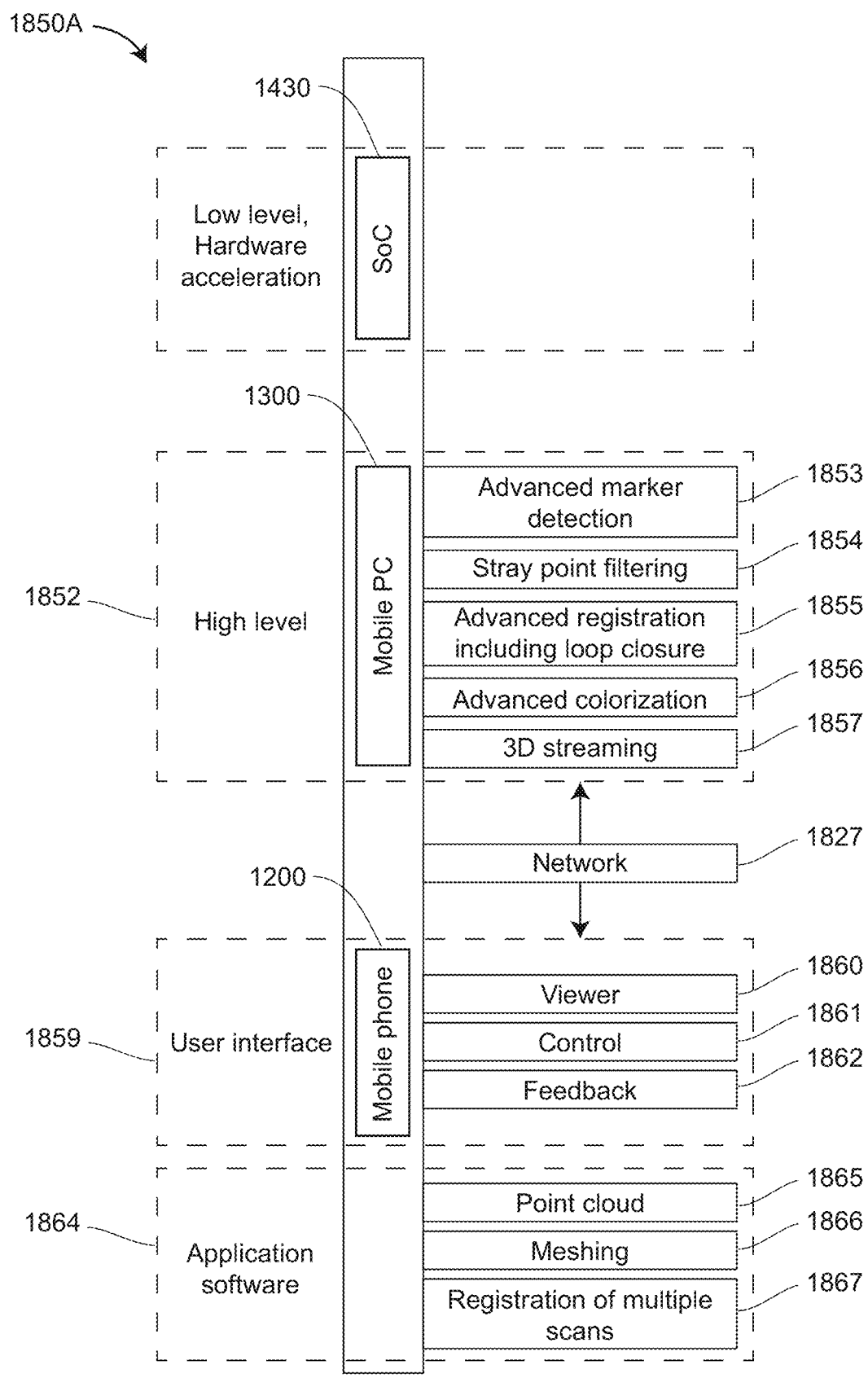
FIG. 18D illustrates post-processing functions performed assistance of a processor in a scanner.

FIG. 18D shows post-processing functions 1850A carried out by the mobile PC 1300 and the mobile computing device 1200 without assistance of the SoC FPGA 1430. Post-processing without the assistance of a processor such as the SoC FPGA 1430 is known in the prior art. It is described here to provide a comparison to FIG. 18E, which shows post-processing functions 1850B carried out with the assistance of the SoC FPGA 1430 or other processor according to an embodiment.

In an embodiment, during the post-processing phase 1850A, the mobile PC 1300 serves a high-level function 1852 that includes advanced marker detection 1853, stray point filtering 1854, advanced registration including loop closure 1855, advanced colorization 1856, and 3D streaming 1857. In an embodiment, advanced marker detection 1853 includes identifying features of particular markers that enable different markers to be distinguished. In an embodiment, stray point filtering 1854 removes 3D points that are determined to be off the surface of the scanned object. In an embodiment, advanced registration including loop closure 1855 includes additional registration functions. One such advanced registration feature is loop closure, which causes registration to be carried out based on a matching of features after the handheld scanner has been moved completely or substantially-completely around an object so that it again scans a region a second time. In an embodiment, advanced colorization 1856 includes adjusting colors to balance colors as seen in different directions, for example, as seen in a direction facing a brightly illuminated region and in a direction facing a darkly illuminated region. In an embodiment, 3D streaming 1857 streams the post-processed 3D images to the display on the mobile phone 1200 or other device.

In the post-processing phase 1850A, application software 1864 provides further processing functions including point cloud functions 1865, meshing 1866, and registration of multiple scans 1867. An example of such application software is SCENE software manufactured by FARO Technologies, with headquarters in Lake Mary, Fla. In an embodiment, the point cloud functions 1865 include those functions performed to put the collected 3D points into a voxel structure. It further includes such functions as providing of clipping boxes for the 3D data points in the point cloud. In an embodiment, meshing 1866 includes generating a polygonal or polyhedral mesh that approximates the scanned geometric surface. The registration of multiple scans 1867 is the placing of multiple scans into a common coordinate system, as described herein above.

Figure 18E:
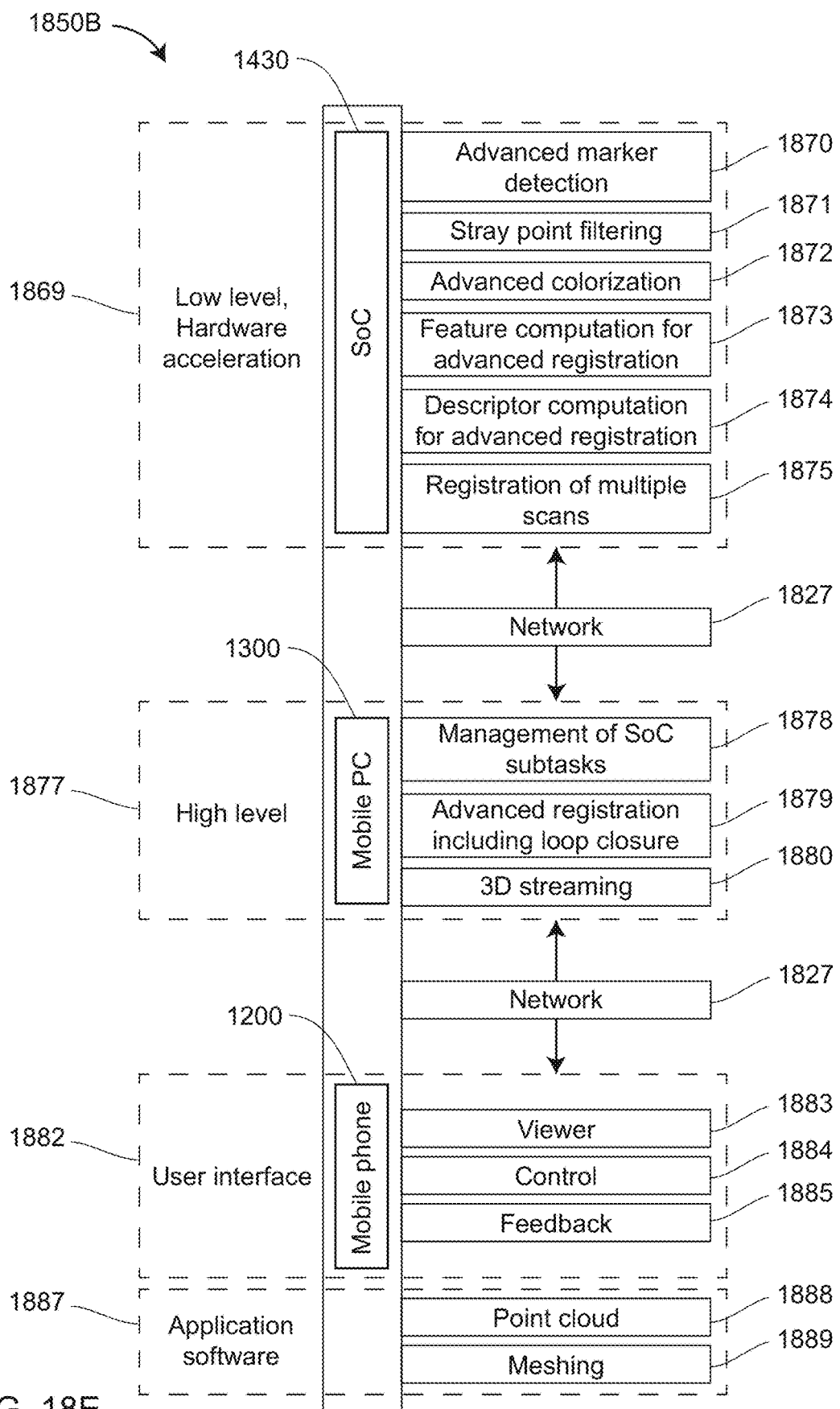
FIG. 18E illustrates post-processing functions performed according to an embodiment of the present invention.

FIG. 18E shows post-processing functions 1850B carried out by the mobile PC 1300 and the mobile phone 1200 with assistance of the SoC FPGA 1430 according to an embodiment. In other embodiments, other processors are used in place of SoC FPGA 1430.

In an embodiment, during the post-processing phase 1850B, the SoC FPGA 1430 performs advanced marker detection 1870, stray point filtering 1871, advanced colorization 1872, featured computation for advanced registration 1873, descriptor computation for advanced registration 1874, and registration of multiple scans 1875. In an embodiment, advanced marker detection 1870 is moved from the mobile PC 1300 (as indicated by the reference number 1853 in FIG. 18D) to the SoC FPGA 1430 in FIG. 18E. In an embodiment, the SoC FPGA 1430 compresses the image obtained from the color registration camera. It further finds in the color image candidate feature points and computes feature descriptors for these feature points used in registration and tracking. The SoC FPGA 1430 also manages exposure time control for the color registration camera and the IR cameras. In an embodiment, exposure control happens during live processing.

By providing the scanner 10 with a powerful processor such as the SoC FPGA 1430, co-processing of many functions are possible, thereby speeding up post-processing of data. In an embodiment, stray point filter 1871 is moved from the mobile PC 1300 in FIG. 18D to the SoC FPGA 1430 in FIG. 18E. In an embodiment, advanced colorization 1872 is moved from the mobile PC 1300 in FIG. 18D to the SoC FPGA 1430 in FIG. 18E. In an embodiment, the feature computation for advanced registration 1873 and the descriptor computation for advanced registration 1874 are both moved to the SoC FPGA 1430 in FIG. 18E from "Advanced registration including loop closure" (element number 1855 in FIG. 18D) from the mobile PC 1300. In an embodiment, the registration of multiple scans 1875 performed by the SoC FPGA 1430 was previously only performed in application software 1864, as shown in the element 1867 of FIG. 1850A. The new functionality provided by the use of the SoC FPGA 1430 or other processor in FIG. 18E provides faster and more complete processing of scan data than available in prior art approaches such as that shown in FIG. 18D.

In an embodiment, during the post-processing phase 1850B, the mobile PC 1300 serves a high-level function 1877 that includes management of SoC subtasks 1878, advanced registration including loop closure 1879, and 3D streaming 1880. As in the case of live processing 1820 and post-processing 1850A, the mobile phone 1200 serves a user-interface function 1882 that includes viewer 1883, control 1884, and feedback 1885.

In the post-processing phase 1850B, application software 1887 provides further processing functions including point cloud functions 1888 and meshing 1889, which are same as the functions 1865, 1866, respectively, in FIG. 18D. Although the SoC FPGA 1430 provides registration of multiple scans 1875, the application software 1887 may provide additional ways to register multiple scans. For example, in an embodiment, a cloud-to-cloud method of registration of multiple scans 1875 is more efficiently performed on the SoC FPGA 1430, while a top-view, target-based registration is more efficiently performed on the mobile PC 1300 or other workstation. In an embodiment, the user may select the desired type of registration. The appropriate processing device 1430 or 1300 is then automatically selected to perform the registration of multiple scans.

Figure 19:
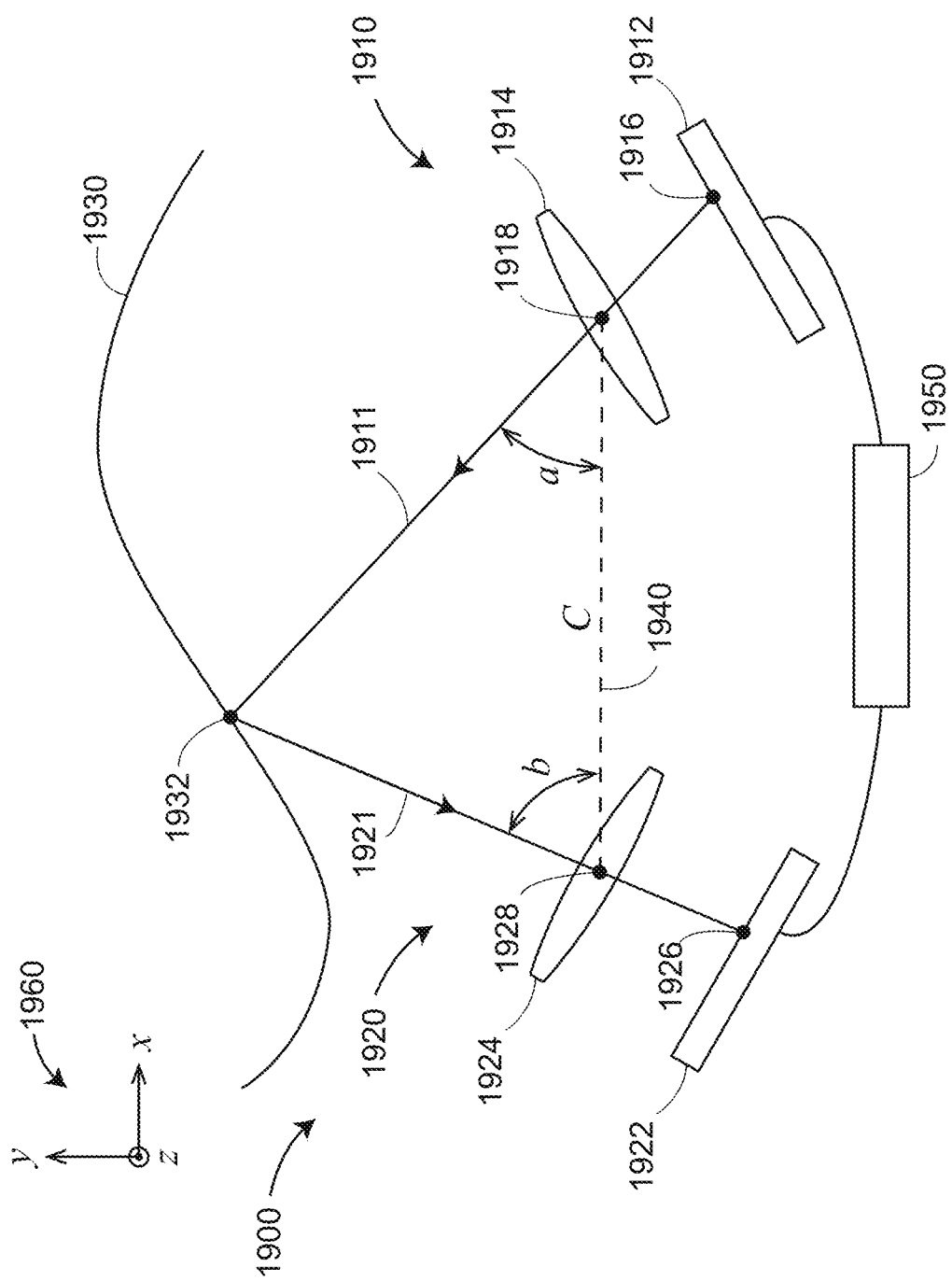
FIG. 19 is a schematic representation of a triangulation scanner having a projector and a camera according to an embodiment.

FIG. 19 shows a triangulation scanner (3D imager) 1900 that projects a pattern of light over an area on a surface 1930. The scanner 1900, which has a frame of reference 1960, includes a projector 1910 and a camera 1920. In an embodiment, the projector 1910 includes an illuminated projector pattern generator 1912, a projector lens 1914, and a perspective center 1918 through which a ray of light 1911 emerges. The ray of light 1911 emerges from a corrected point 1916 having a corrected position on the pattern generator 1912. In an embodiment, the point 1916 has been corrected to account for aberrations of the projector, including aberrations of the lens 1914, in order to cause the ray to pass through the perspective center 1918, thereby simplifying triangulation calculations. In an embodiment, the pattern generator 1912 includes a light source that sends a beam of light through a DOE. For example, the light source might be the infrared laser 700 and the DOE might be the DOE 713. A beam of light from the infrared laser 700 passes through the DOE, which diffracts the light into a diverging pattern such as a diverging grid of spots. In an embodiment, one of the projected rays of light 1911 has an angle corresponding to the angle a in FIG. 19. In another embodiment, the pattern generator 1912 includes a light source and a digital micromirror device (DMD). In other embodiments, other types of pattern generators 1912 are used.

The ray of light 1911 intersects the surface 1930 in a point 1932, which is reflected (scattered) off the surface and sent through the camera lens 1924 to create a clear image of the pattern on the surface 1930 of a photosensitive array 1922. The light from the point 1932 passes in a ray 1921 through the camera perspective center 1928 to form an image spot at the corrected point 1926. The position of the image spot is mathematically adjusted to correct for aberrations of the camera lens. A correspondence is obtained between the point 1926 on the photosensitive array 1922 and the point 1916 on the illuminated projector pattern generator 1912. As explained herein below, the correspondence may be obtained by using a coded or an uncoded pattern of projected light. Once the correspondence is known, the angles a and b in FIG. 19 may be determined. The baseline 1940, which is a line segment drawn between the perspective centers 1918 and 1928, has a length C. Knowing the angles a, b and the length C, all the angles and side lengths of the triangle 1928-1932-1918 may be determined. Digital image information is transmitted to a processor 1950, which determines 3D coordinates of the surface 1930. The processor 1950 may also instruct the illuminated pattern generator 1912 to generate an appropriate pattern.

Figure 20A:
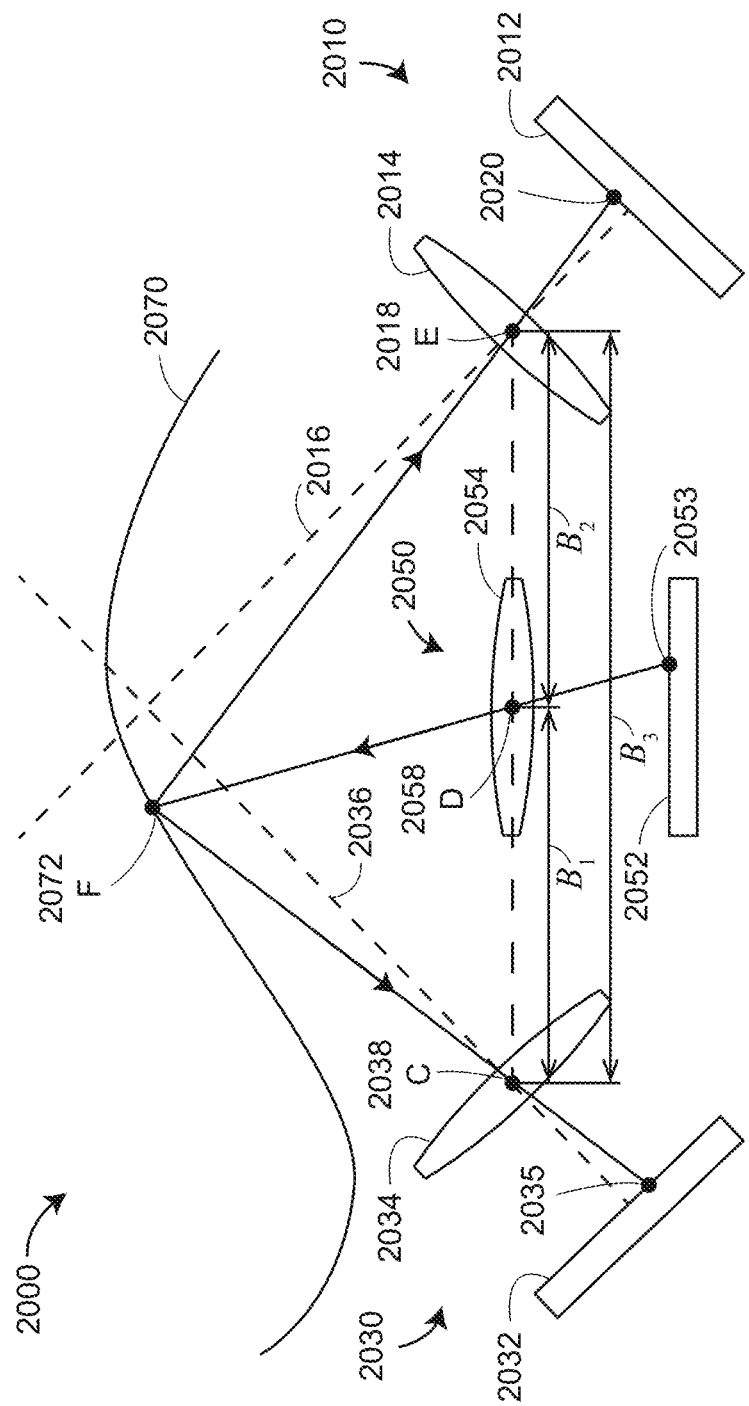
FIG. 20A is a schematic representation of a triangulation scanner having a projector and two cameras according to an embodiment of the present invention.

FIG. 20A shows a structured light triangulation scanner 2000 having a projector 2050, a first camera 2010, and a second camera 2030. The projector 2050 creates a pattern of light on a pattern generator 2052, which it projects from a corrected point 2053 of the pattern through a perspective center 2058 (point D) of the lens 2054 onto an object surface 2070 at a point 2072 (point F). In an embodiment, the pattern generator is a DOE that projects a pattern based on principles of diffractive optics. In other embodiments, other types of pattern generators are used. The point 2072 is imaged by the first camera 2010 by receiving a ray of light from the point 2072 through a perspective center 2018 (point E) of a lens 2014 onto the surface of a photosensitive array 2012 of the camera as a corrected point 2020. The point 2020 is corrected in the read-out data by applying a correction factor to remove the effects of lens aberrations. The point 2072 is likewise imaged by the second camera 2030 by receiving a ray of light from the point 2072 through a perspective center 2038 (point C) of the lens 2034 onto the surface of a photosensitive array 2032 of the second camera as a corrected point 2035. It should be understood that any reference to a lens in this document is understood to mean any possible combination of lens elements and apertures.

Figure 20B:
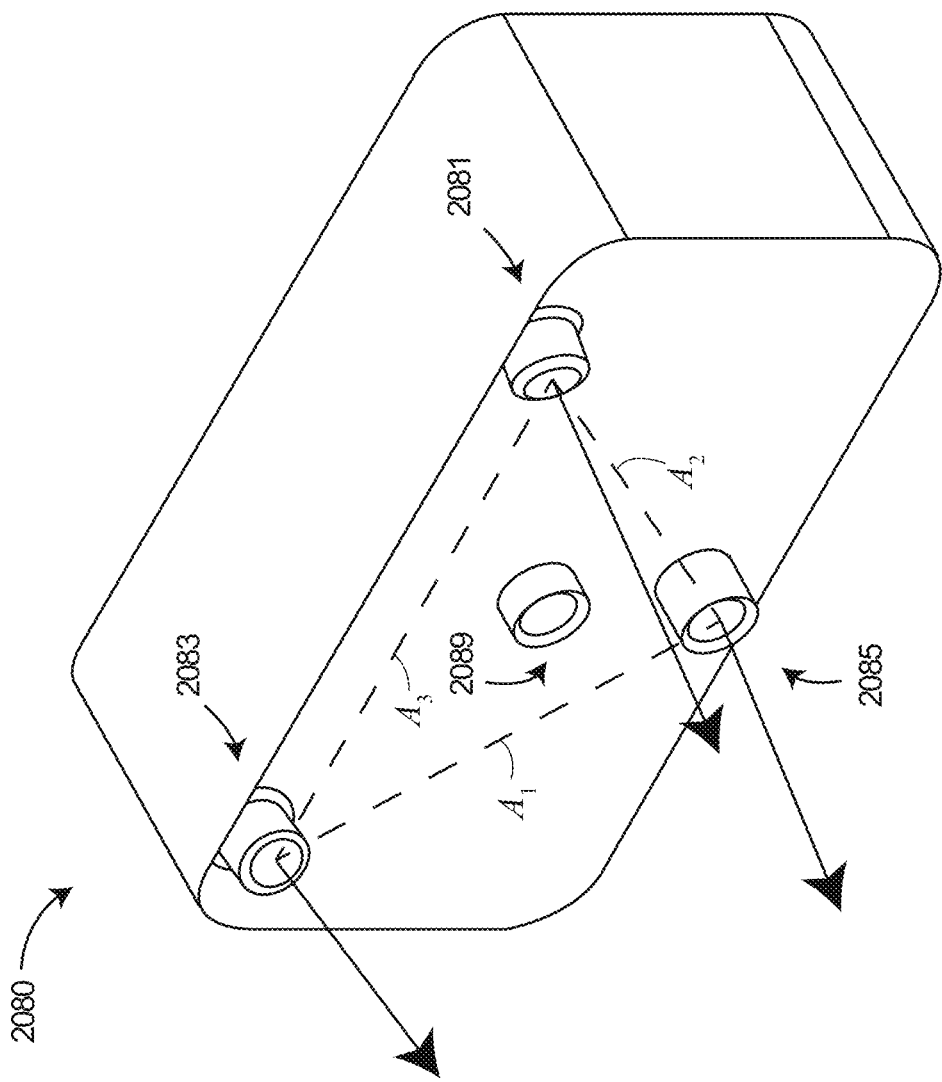
FIG. 20B is a perspective view of a triangulation scanner having a projector, two triangulation cameras, and a registration camera according to an embodiment of the present invention.

FIG. 20B shows 3D imager 2080 having two cameras 2081, 2083 and a projector 2085 arranged in a triangle $A_1$-$A_2$-$A_3$. In an embodiment, the 3D imager 2080 of FIG. 20B further includes a camera 2089 that may be used to provide color (texture) information for incorporation into the 3D image. In addition, the camera 2089 may be used to register multiple 3D images through the use of videogrammetry. This triangular arrangement provides additional information beyond that available for two cameras and a projector arranged in a straight line as illustrated in FIG. 20A. The additional information may be understood in reference to FIG. 21, which explains the concept of epipolar constraints, and FIG. 22, which explains how epipolar constraints are advantageously applied to the triangular arrangement of the 3D imager 2080. In an embodiment, the elements 2081, 2083, 2085, 2089 in FIG. 20B correspond to the elements 40, 20, 50, 30 in FIG. 1.

Figure 21:
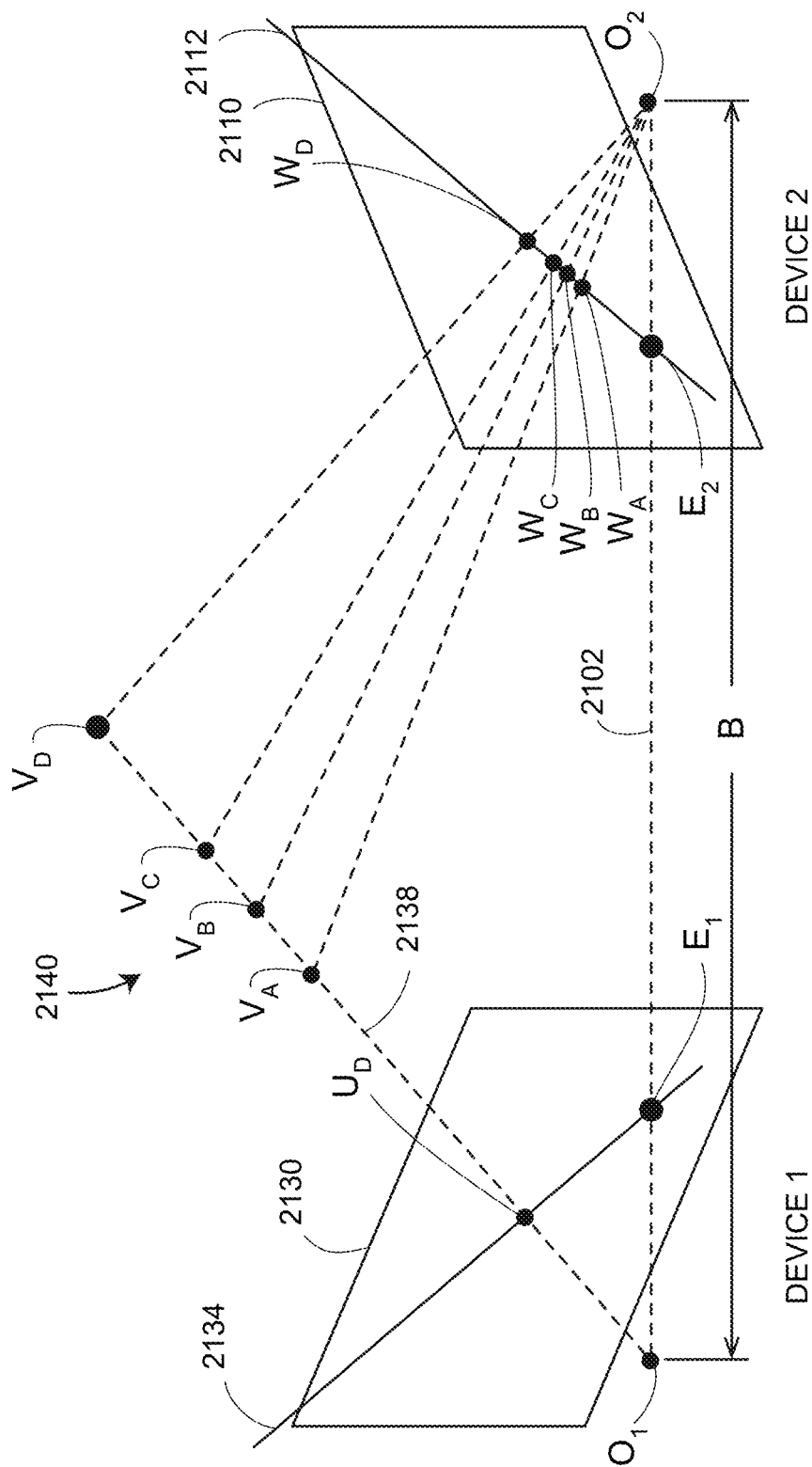
FIG. 21 is a schematic representation illustrating epipolar terminology.

In FIG. 21, a 3D triangulation instrument 2140 includes a device 1 and a device 2 on the left and right sides, respectively. Device 1 and device 2 may be two cameras or device 1 and device 2 may be one camera and one projector. Each of the two devices, whether a camera or a projector, has a perspective center, $O_1$ and $O_2$, and a reference plane, 2130 or 2110. The perspective centers are separated by a baseline distance B, which is the length of the line 2102 between $O_1$ and $O_2$. The perspective centers $O_1$, $O_2$ are points through which rays of light may be considered to travel, either to or from a point on an object. These rays of light either emerge from an illuminated projector pattern or impinge on a photosensitive array.

In FIG. 21, a device 1 has a perspective center $O_1$ and a reference plane 2130, where the reference plane 2130 is, for the purpose of analysis, equivalent to an image plane of the object point $O_1$ 2130. In other words, the reference plane 2130 is a projection of the image plane about the perspective center $O_1$. A device 2 has a perspective center $O_2$ and a reference plane 2110. A line 2102 drawn between the perspective centers $O_1$ and $O_2$ crosses the planes 2130 and 2110 at the epipole points $E_1$, $E_2$, respectively. Consider a point $U_D$ on the plane 2130. If device 1 is a camera, an object point that produces the point $U_D$ on the reference plane 2130 (which is equivalent to a corresponding point on the image) must lie on the line 2138. The object point might be, for example, one of the points $V_A$, $V_B$, $V_C$, or $V_D$. These four object points correspond to the points $W_A$, $W_B$, $W_C$, $W_D$, respectively, on the reference plane 2110 of device 2. This is true whether device 2 is a camera or a projector. It is also true that the four points lie on a straight line 2112 in the plane 2110. This line, which is the line of intersection of the reference plane 2110 with the plane of $O_1$-$O_2$-$U_D$, is referred to as the epipolar line 2112. It follows that any epipolar line on the reference plane 2110 passes through the epipole $E_2$. Just as there is an epipolar line on the reference plane 2110 of device 2 for any point $U_D$ on the reference plane of device 1, there is also an epipolar line 2134 on the reference plane 2130 of device 1 for any point on the reference plane 2110 of device 2.

Figure 22:
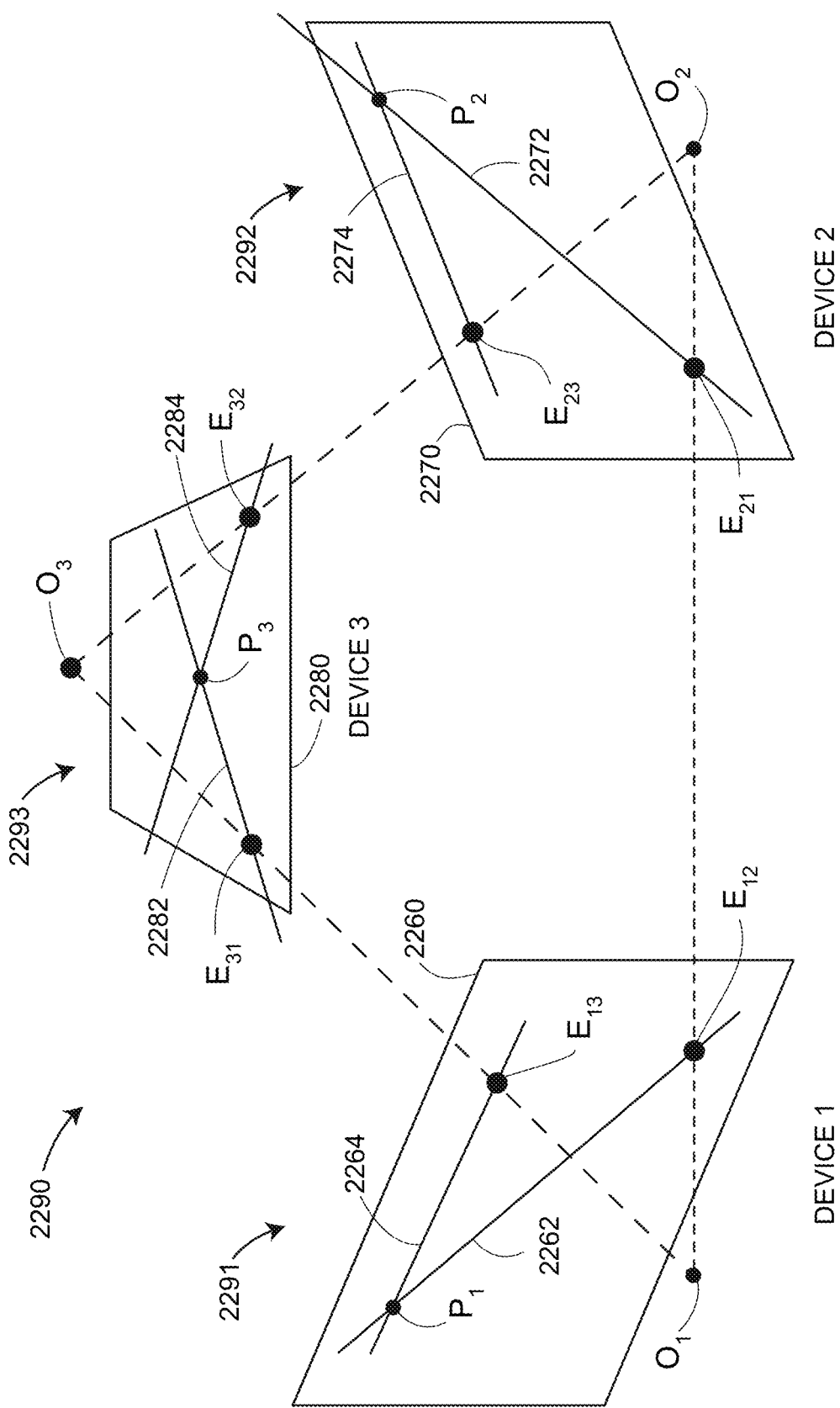
FIG. 22 is a schematic representation illustrating how epipolar relations may be advantageously used in when two cameras and a projector are placed in a triangular shape according to an embodiment of the present invention.

FIG. 22 illustrates the epipolar relationships for a 3D imager 2290 corresponding to 3D imager 2080 of FIG. 20B in which two cameras and one projector are arranged in a triangular pattern. In general, the device 1, device 2, and device 3 may be any combination of cameras and projectors as long as at least one of the devices is a camera. Each of the three devices 2291, 2292, 2293 has a perspective center $O_1$, $O_2$, $O_3$, respectively, and a reference plane 2260, 2270, and 2280, respectively. Each pair of devices has a pair of epipoles. Device 1 and device 2 have epipoles $E_{12}$, $E_{21}$ on the planes 2260, 2270, respectively. Device 1 and device 3 have epipoles $E_{13}$, $E_{31}$, respectively on the planes 2260, 2280, respectively. Device 2 and device 3 have epipoles $E_{23}$, $E_{32}$ on the planes 2270, 2280, respectively. In other words, each reference plane includes two epipoles. The reference plane for device 1 includes epipoles $E_{12}$ and $E_{13}$. The reference plane for device 2 includes epipoles $E_{21}$ and $E_{23}$. The reference plane for device 3 includes epipoles $E_{31}$ and $E_{32}$.

Consider the situation of FIG. 22 in which device 3 is a projector, device 1 is a first camera, and device 2 is a second camera. Suppose that a projection point $P_3$, a first image point $P_1$, and a second image point $P_2$ are obtained in a measurement. These results can be checked for consistency in the following way.

To check the consistency of the image point $P_1$, intersect the plane $P_3$-$E_{31}$-$E_{13}$ with the reference plane 2260 to obtain the epipolar line 2264. Intersect the plane $P_2$-$E_{21}$-$E_{12}$ to obtain the epipolar line 2262. If the image point $P_1$ has been determined consistently, the observed image point $P_1$ will lie on the intersection of the calculated epipolar lines 2262 and 2264.

To check the consistency of the image point $P_2$, intersect the plane $P_3$-$E_{32}$-$E_{23}$ with the reference plane 2270 to obtain the epipolar line 2274. Intersect the plane $P_1$-$E_{12}$-$E_{21}$ to obtain the epipolar line 2272. If the image point $P_2$ has been determined consistently, the observed image point $P_2$ will lie on the intersection of the calculated epipolar lines 2272 and 2274.

To check the consistency of the projection point $P_3$, intersect the plane $P_2$-$E_{23}$-$E_{32}$ with the reference plane 2280 to obtain the epipolar line 2284. Intersect the plane $P_1$-$E_{13}$-$E_{31}$ to obtain the epipolar line 2282. If the projection point $P_3$ has been determined consistently, the projection point $P_3$ will lie on the intersection of the calculated epipolar lines 2282 and 2284.

The redundancy of information provided by using a 3D imager having three devices (such as two cameras and one projector) enables a correspondence among projected points to be established even without analyzing the details of the captured images and projected pattern features. Suppose, for example, that the three devices include two cameras and one projector. Then a correspondence among projected and imaged points may be directly determined based on the mathematical constraints of the epipolar geometry. This may be seen in FIG. 22 by noting that a known position of an illuminated point on one of the reference planes 2260, 2270, 2280 automatically provides the information needed to determine the location of that point on the other two reference planes. Furthermore, once a correspondence among points has been determined on each of the three reference planes 2260, 2270, 2280, a triangulation calculation may be performed using only two of the three devices of FIG. 22. A description of such a triangulation calculation is discussed in relation to FIG. 19.

Figure 23:
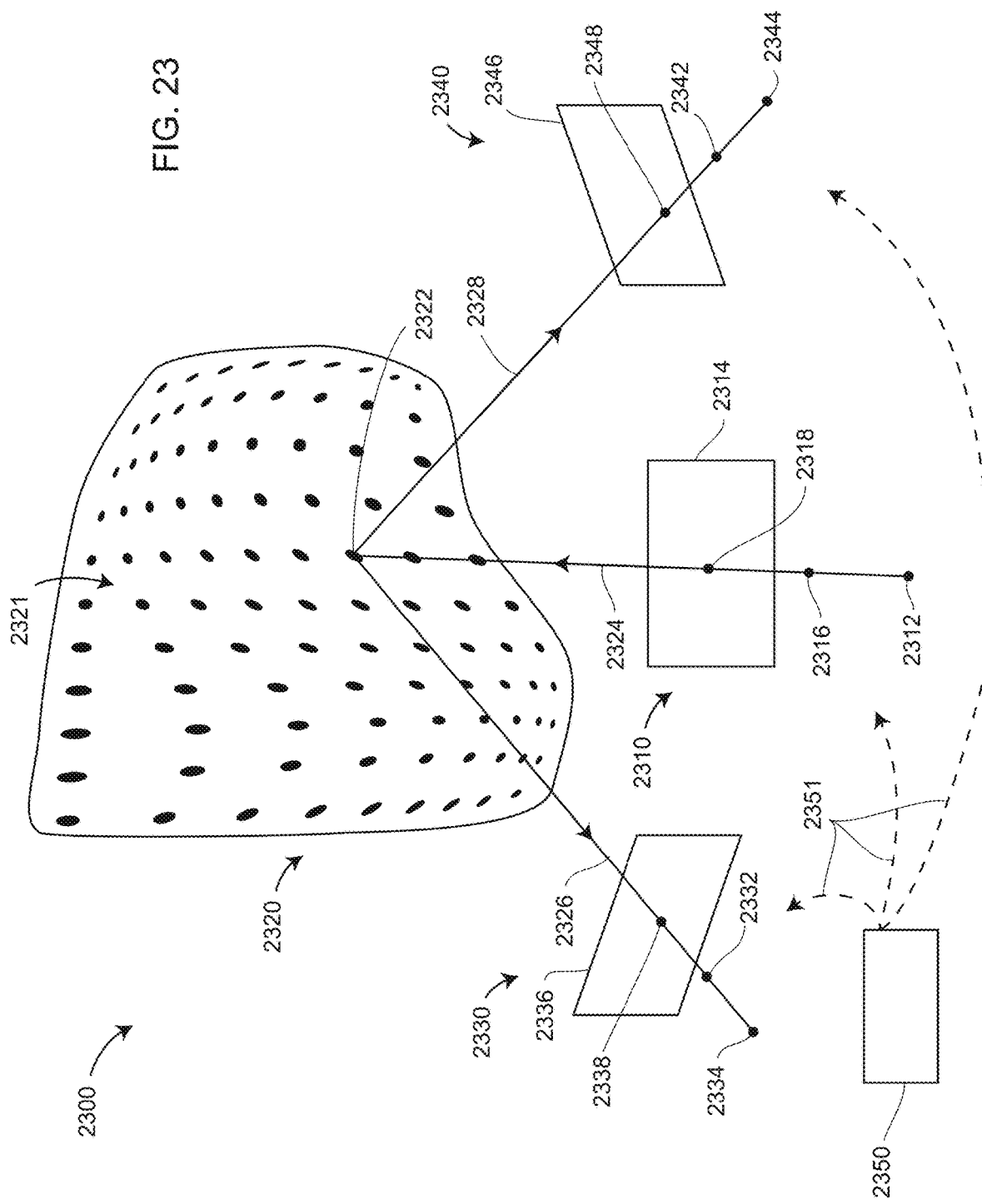
FIG. 23 illustrates a system in which 3D coordinates are determined for a grid of uncoded spots projected onto an object according to an embodiment of the present invention.

By establishing correspondence based on epipolar constraints, it is possible to determine 3D coordinates of an object surface by projecting uncoded spots of light. An example of projection of uncoded spots is illustrated in FIG. 23. In an embodiment, a projector 2310 projects a collection of identical spots of light 2321 on an object 2320. In the example shown, the surface of the object 2320 is curved in an irregular manner causing an irregular spacing of the projected spots on the surface. One of the projected points is the point 2322, projected from a projector source element 2312 and passing through the perspective center 2316 as a ray of light 2324 forms a point 2318 on the reference plane 2314.

The point or spot of light 2322 on the object 2320 is projected as a ray of light 2326 through the perspective center 2332 of a first camera 2330, resulting in a point 2334 on the image sensor of the camera 2330. The corresponding point on the reference plane 2336 is 2338. Likewise, the point or spot of light 2322 is projected as a ray of light 2328 through the perspective center 2342 of a second camera 2340, resulting in a point 2344 on the image sensor of the camera 2340. The corresponding point on the reference plane 2346 is 2348. In an embodiment, a processor 2350 is in communication with the projector 2310, first camera 2330, and second camera 2340. The processor determines a correspondence among points on the projector 2310, first camera 2330, and second camera 2340. In an embodiment, the processor 2350 performs a triangulation calculation to determine the 3D coordinates of the point 2322 on the object 2320. An advantage of a scanner 2300 having three device elements, either two cameras and one projector or one camera and two projectors, is that correspondence may be determined among projected points without matching projected feature characteristics. In other words, correspondence can be established among spots on the reference planes 2336, 2314, and 2346 even without matching particular characteristics of the spots. The use of the three devices 2310, 2330, 2340 also has the advantage of enabling identifying or correcting errors in compensation parameters by noting or determining inconsistencies in results obtained from triangulation calculations, for example, between two cameras, between the first camera and the projector, and between the second camera and the projector.

In an embodiment, the projected pattern, while still uncoded and still a grid, has two superimposed grid densities as illustrated in FIGS. 24A, 24B, 24C, 24D. FIGS. 24A, 24b show a portion of an image 2400A obtained by a photosensitive array on a first camera such as the camera 20 and a corresponding portion of an image 2400B obtained by a photosensitive array of a second camera such as the camera 40. In an embodiment, each corresponding grid of spots 2402A, 2402B having relatively low brightness is combined with a lower density grid of spots 2404A, 2404B having a relatively high brightness. In some embodiments, there is a limit to the density of the spacing of points that can be clearly matched in the images 24A, 24B based on the epipolar geometry as described herein above. By including a high density grid 2402A, 2402B with a low density grid 2404A, 2404B, the low density grid points can assist in eliminating ambiguities in closely spaced high density points 2402A, 2402B. Another advantage of the combination of brighter points in the low density grid 2404A, 2404B and dimmer points in the high density grid 2402A, 2402B is that this combination provides a higher dynamic range than would either type alone. Brighter points are detected on low-reflectivity surfaces where dimmer points might not be seen. Likewise dimmer points are detected on higher reflectivity surfaces where brighter points might be overexposed.

FIGS. 24C, 24D display a single column of grid points 2410A, 2410B for each of the two camera images, wherein each single column 2410A, 2410B includes a combination of low density grid points 2402A, 2402B and high density grid points 2404A, 2404B. A correspondence is determined for each of these grid elements, herein marked with circles. As explained above, in an embodiment, the correspondence among each of the elements in the image planes of the two cameras is determined based on epipolar geometry for three or more devices such as the devices 2310, 2330, 2340.

FIGS. 25A, 25B illustrate a further step in which, for the single columns 2410A, 2410B, rows of pixels are isolated for each of the identified spots. In an embodiment illustrated in FIG. 25A, FIG. 25B, the number of 3D points measured on the surface of an object is increased by approximately a factor of five. As described in the previous paragraph, a correspondence has been established among spots as indicated by the arrows labeled 2502, 2504, 2506. In an embodiment, a further correspondence is determined between each row of pixels in each of the corresponding spots in the left and right images. For example, in the illustration of FIGS. 25A, 25B, the corresponding spots indicated by the arrow 2502 have three corresponding pixel rows, which can be labeled as rows 1-3. Likewise, the corresponding spots indicated by the arrow 2504 have eight corresponding pixel rows, which can be labeled as rows 4-11. The corresponding spots indicated by the arrow 2506 have four corresponding pixel rows, which can be labeled as rows 12-15. In an embodiment, a method, embodied in a mathematical algorithm performed by a processor, is applied to determine a center of each of the identified rows 1-15. For example, in a simple case, the center of one of the rows 1-15 for each of the left and right images is based on a centroid of that row. In other embodiments, other methods are used. For example, in an embodiment, the center of pixels in a row is determined based on fitting pixel intensities to a function such as a Gaussian or a polynomial. The curves 2520 in FIGS. 25A, 25B schematically represent the selected mathematical algorithm, which as might be a function to which the pixel intensities are fitted or a mathematical algorithm (for example, an algorithm to obtain a centroid). The advantage of determining 3D coordinates for corresponding pixel rows within corresponding spots is an increase in the density of measured points on the surface of the object under test.

Figure 26B:
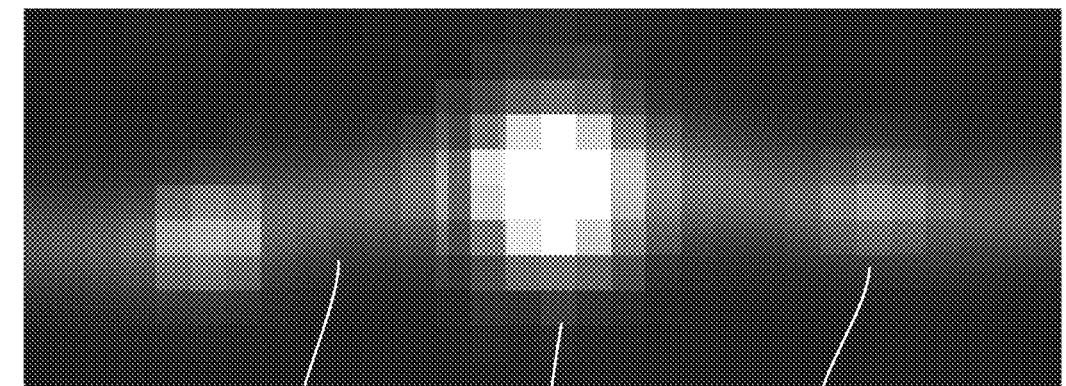
FIGS. 26A, 26B illustrate projected spots being interconnected by curves according to an embodiment of the present invention.
Figure 26A:
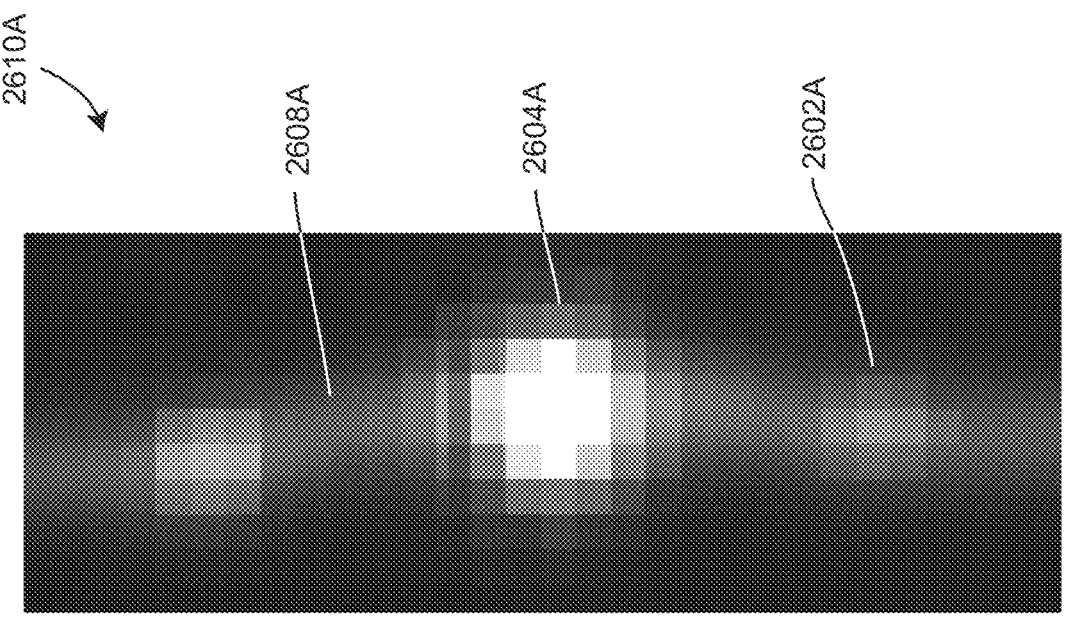

FIG. 26A displays a single column 2610A in an image from a left camera. FIG. 26B displays a single column in an image from a right camera. Each single column 2610A, 2610B includes a combination of low density grid points 2602A, 2602B, high density grid points 2604A, 2604B, and connecting lines or curves 2608A, 2608B. The images of FIGS. 26A, 26B are similar to the images of FIGS. 24C, 24D, respectively, except that FIGS. 26A, 26B further include the connecting lines or curves 2608A, 2608B.

FIGS. 27A, 27B illustrate a further step in which, for the single columns 2710A, 2710B, rows of pixels are isolated not only for corresponding spots but also for connecting lines or curves 2608A, 2608B illustrated in FIG. 26A and FIG. 26B. In an embodiment illustrated in FIG. 27A, FIG. 27B, the number of 3D points measured on the surface of an object is increased by approximately a factor of ten relative to that obtained using the corresponding pairs of spots 2702, 2704, 2706. For example, in the illustration of FIGS. 27A, 27B, the corresponding spots indicated by the arrow 2708, representing pairs of connecting lines or curves 2608A, 2608B, have 15 corresponding pixel rows, which can be labeled as rows 1-4, 8-10, 20-23. Likewise, the corresponding spots indicated by the arrow 2502 have three corresponding pixel rows, which can be labeled as rows 5-7. The corresponding spots indicated by the arrow 2504 have nine corresponding pixel rows, which can be labeled as rows 11-19. The corresponding spots indicated by the arrow 2506 have four corresponding pixel rows, which can be labeled as rows 24-27. In an embodiment, a method is applied to determine a center of each of the identified rows 1-30. For example, in a simple case, the center of one of the rows 1-30 for each of the left and right images is based on a centroid of that row. In other embodiments, other methods are used. For example, in an embodiment, the center of pixels in a row is determined based on fitting pixel intensities to a function such as a Gaussian or a polynomial. The curves 2720 in FIGS. 27A, 27B schematically represent the selected method, which as might be a function to which the pixel intensities are fitted or a method (for example, an algorithm to obtain a centroid). The advantage of determining 3D coordinates for corresponding pixel rows both for corresponding spots and for connecting lines or curves is a further increase in the density of measured points on the surface of the object under test.

One challenge faced by triangulation scanners is determining 3D coordinates for sharp edges. For the case of projected patterns having projection elements spaced relatively far apart, the projected pattern may not intersect edges of the object under test. A way to assist in determining sharp edges is to project a pattern that includes lines.

Figure 28B:
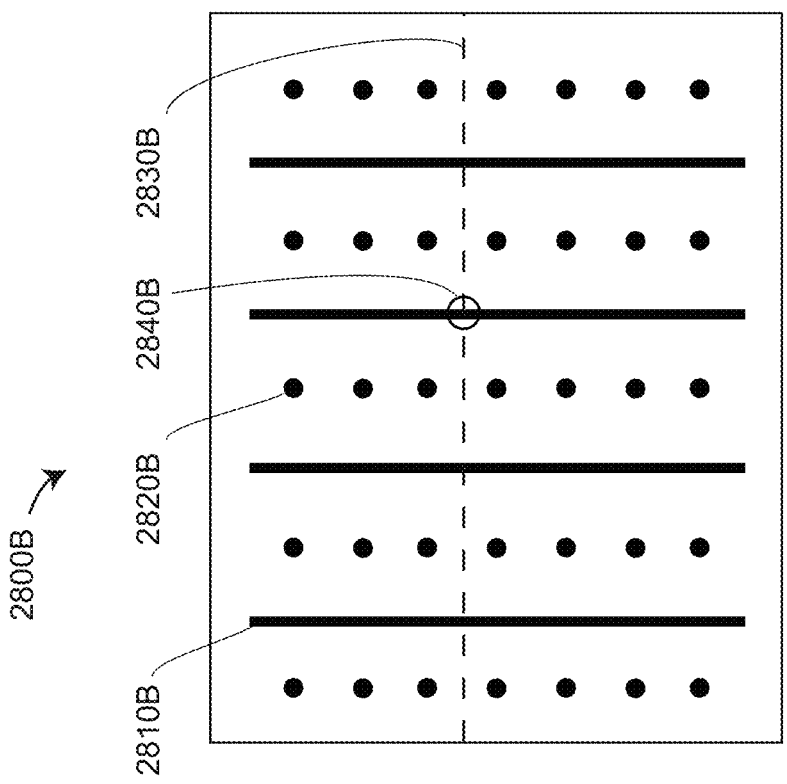
FIGS. 28A, 28B illustrate a method for increasing the resolution of scan data and obtaining improved 3D coordinates of sharp edges by evaluating pixel rows for a combination of projected spots and lines according to an embodiment of the present invention.
Figure 28A:
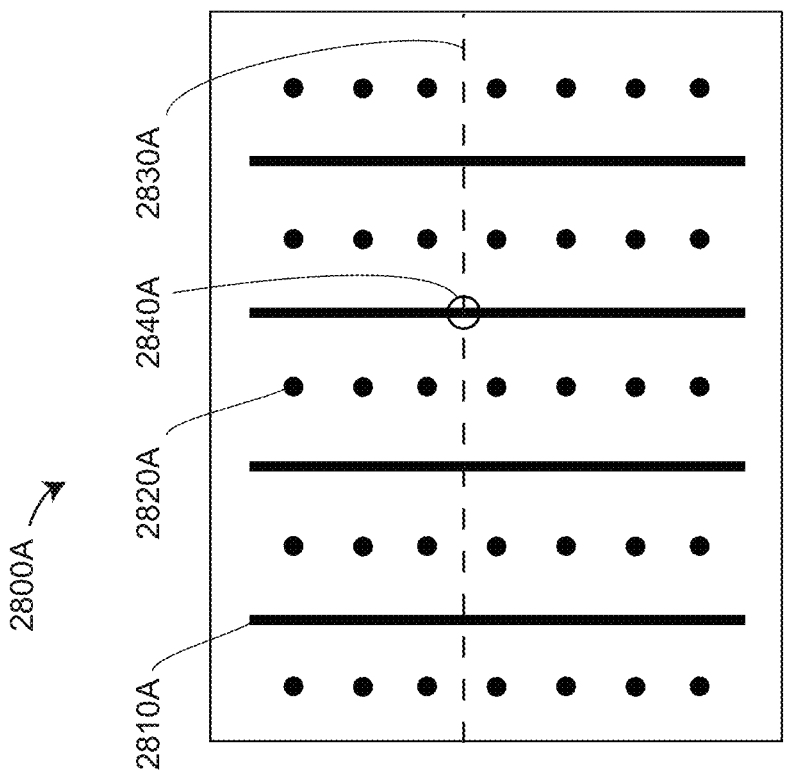

In an embodiment, a pattern having a collection of alternating dots and lines is projected onto an object. In an embodiment, FIG. 28A shows the resulting image 2800A obtained by the left camera, and FIG. 28B shows the resulting image 2800B obtained by the right camera. The dots and lines are indicated by the reference numbers 2820A, 2810A in the left image and by the reference numbers 2820B, 2810B in the right image. A dashed line 2830A is drawn on the image of FIG. 28A to indicate a particular row of the photosensitive array of the left camera. A point of intersection of this row with one of the lines 2810A is indicated by the reference number 2840A. Likewise, a dashed line 2830B is drawn on the image of FIG. 28B to indicate a particular row of the photosensitive array of the right camera. The point of intersection of the row with one of the lines 2810B is indicated by the reference number 2840B. The points of intersection 2840A, 2840B are both images of a single point of light projected onto an object.

If the handheld scanner is moved so that the solid lines are kept approximately perpendicular to the sharp edges of an object, the edges of the object can be easily measured, thereby providing better 3D coordinates for the sharp edges.

In an embodiment, a method is used to establish correspondences among points in the lines 2810A and points in the lines 2810B, where device 1 and device 2 in FIG. 21 are both cameras of a scanner such as the scanner 10. In an embodiment, a point in the line 2810A is analogous to the point $U_D$ in FIG. 21, and the points $W_A$, $W_B$, $W_C$, $W_D$ are exemplary corresponding points on the epipolar line 2112 of the reference plane 2110. In an embodiment, the spacing between the lines 2810B on the reference plane 2110 is large enough to enable determination of the point on the epipolar line 2112 that corresponds to the point $U_D$. Such a determination may be made, for example, based on a determination of the position of the spots 2820A, 2820B and the distance to the spots, which in an embodiment are determined according to the method described above in reference to FIG. 22 and FIG. 23.

With this embodiment, the correspondence problem is solved for determining corresponding points on the solid lines 2810A, 2810B of FIGS. 28A, 28B, thereby providing the advantage in obtaining 3D coordinates for sharp edges of objects. Furthermore, the inclusion of the spots 2820A, 2820B in FIGS. 28A, 28B provides the additional advantage of enabling compensation of the scanner system to be checked for self-consistency. The values of these parameters is typically determined periodically using a calibration plate or similar method. Over time and with changes in temperature, such parameters may change. However, if the coordinates of the corresponding spots projected from the projector plane and imaged by the two cameras are not fully self-consistent, an error in the compensation parameters is indicated. One method of correcting such inconsistencies is to perform a calibration procedure using a calibration plate or similar method. Another method is to perform an optimization procedure in which the parameters are adjusted until the observed inconsistencies are reduced or minimized. In summary, a projection pattern that combines a collection of points with a collection of solid lines has advantages in improving the 3D coordinates of sharp edges. It further includes advantages in providing a way to monitor or self-correct errors in calibration parameters based on inconsistencies in observed patterns. One type of error that may be detected and corrected, based on a parameter-adjustment optimization procedure, is in the pose of the first camera, the second camera, and the projector. The term "pose" refers to a combination of position and orientation. Another type of error that may be detected and corrected, based on a parameter-adjustment optimization procedure, is in the wavelength of the projected light.

Figure 29B:
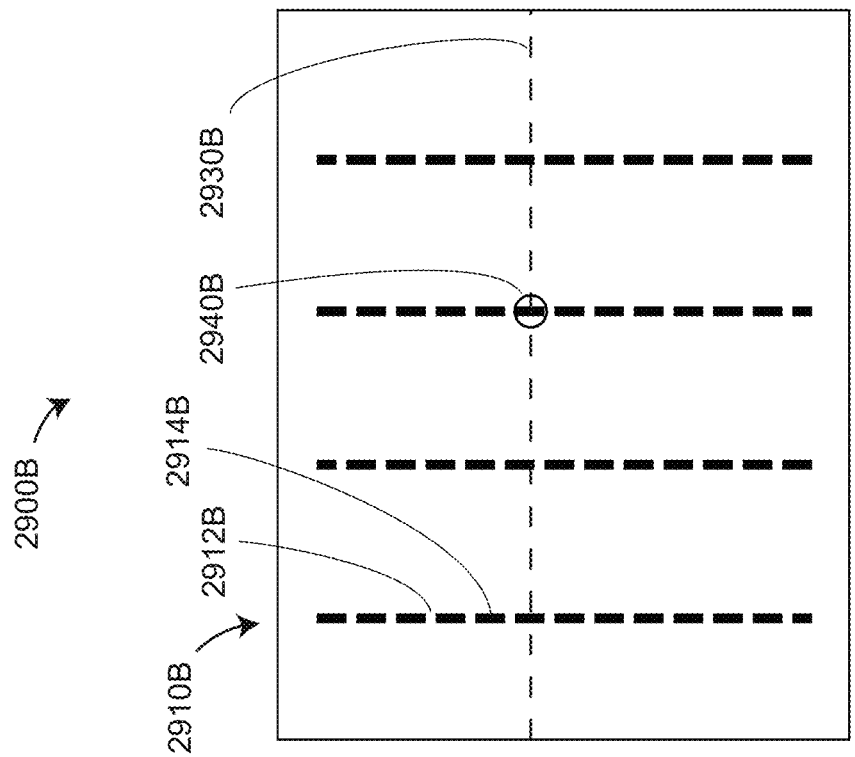
FIGS. 29A, 29B illustrate a method for increasing the resolution of scan data and obtaining improved 3D coordinates of sharp edges by evaluating pixel rows for projected dashed lines according to an embodiment of the present invention.
Figure 29A:
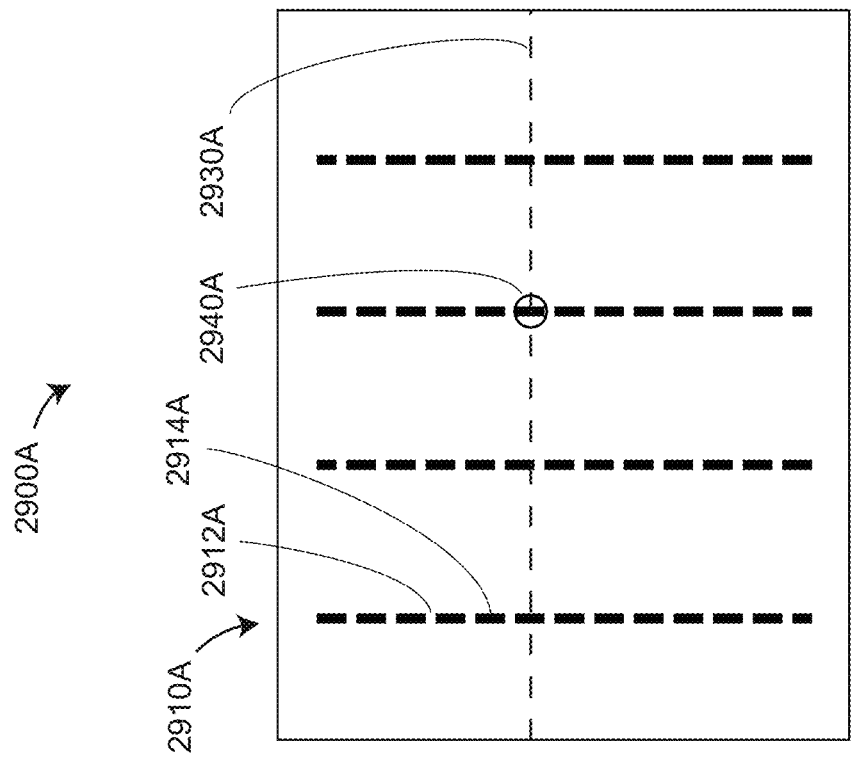

An alternative embodiment to obtain improved 3D coordinates for sharp edges while, at the same time, providing a way to monitor or self-correct errors in calibration parameters is shown in FIGS. 29A, 29B. In an embodiment, a pattern having a collection of dashed lines is projected onto an object. In an embodiment, FIG. 29A shows the image 2900A obtained by the left camera, and FIG. 29B shows the image 2900B obtained by the right camera. Each dashed line 2910A includes a collection of spaces 2912A and line segments 2914A. Likewise, each dashed line 2910B includes a collection of spaces 2912B and line segments 2914B. A dashed line 2930A is drawn on the image of FIG. 29A to indicate a particular row of the photosensitive array of the left camera. A point of intersection of this row with one of the lines 2910A is indicated by the reference number 2940A. Likewise, a dashed line 2930B is drawn on the image of FIG. 29B to indicate a particular row of the photosensitive array of the right camera. The point of intersection of the row with one of the lines 2910B is indicated by the reference number 2940B. The spots of intersection 2940A, 2940B are images of a corresponding spot of light projected onto an object.

If the handheld scanner is moved so that the dashed lines are kept approximately perpendicular to the sharp edges of an object, the edges of the object can be measured except for the case in which the edge of the object coincides with a space 2912A, 2912B in the pattern. In an embodiment, the locations of the spaces 2912A, 2912B are varied for each of the lines 2910A, 2910B to avoid this problem. An example of such variable location of spaces is illustrated in FIGS. 29A, 29B.

The method for obtaining correspondences of points on the solid portions 2914A, 2914B of the dashed lines 2910A, 2910B is the same as described above in relation to FIGS. 28A, 28B. In other words, the method described herein above to determining corresponding pairs of points on the solid lines of FIGS. 28A, 28B may be used to determine corresponding pairs of points on the dashed lines 2910, 2910B of FIGS. 29A, 29B. The method for monitoring or self-correcting errors in calibration parameters uses the spaces 2912A, 2912B in the lines 2910A, 2910B to enforce epipolar self-consistency. This is possible because the spaces are relatively compact, much like the spots 2920A, 2920B in FIG. 28A and FIG. 28B.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A handheld device comprising:
a projector operable to project a pattern of light onto an object at a plurality of different times;
a first camera operable to capture at the plurality of different times the projected pattern of light in first images;
a second camera operable to capture at the plurality of different times the projected pattern of light in second images;
a registration camera operable to capture a plurality of third images, each of the plurality of third images being captured in succession;
one or more processors operable to determine three-dimensional (3D) coordinates of points on the object based at least in part on the projected pattern, the first images, and the second images, the one or more processors being further operable to register the determined 3D coordinates based at least in part on common features extracted from the succession of third images; and
a mobile computing device operably connected to the handheld device and in communication with the one or more processors, the mobile computing device being operable to display the determined registered 3D coordinates of points, wherein the mobile computing device includes a color camera operable to capture images, including two-dimensional (2D) still images, wherein the 2D still images are synchronized with time stamps to the determined 3D coordinates of points.

2. The handheld device of claim 1 wherein the mobile computing device is further operable to provide a user interface (UI) that enables a user to instruct the handheld device to take specified actions.

3. The handheld device of claim 1 wherein the mobile computing device is removably attached to a case of the handheld device, the case being fixedly attached to the projector, the first camera, and the second camera.

4. The handheld device of claim 3 wherein the mobile computing device is removably attached to the case by a magnetic attraction between the mobile computing device and the case.

5. The handheld device of claim 1 wherein the mobile computing device is selected from the group consisting of a smart phone, a personal digital assistant, and a tablet computer.

6. The handheld device of claim 1 further comprising a mobile personal computer (PC), the mobile PC having a computing unit and a battery.

7. The handheld scanner of claim 6 wherein the battery is removable and rechargeable.

8. The handheld device of claim 6 wherein the mobile PC is operable for attachment to the user.

9. The handheld device of claim 6 wherein the mobile PC is operable to cooperate with the one or more processors to determine the registered 3D coordinates of points on the object.

10. The handheld device of claim 9 wherein the mobile PC is operable to transmit a signal of the determined registered 3D coordinates of points on the object to the mobile computing device, the signal being transmitted over at least one of an electrical cable from the mobile PC to the mobile computing device or a wireless communication channel from the mobile PC to the mobile computing device.

11. The handheld device of claim 2 wherein the UI of the mobile computing device provides access to one or more calibrations of the handheld device.

12. The handheld device of claim 2 wherein the UI of the mobile computing device provides access to a thumbnail sized images of scans associated with scan projects.

13. The handheld device of claim 2 wherein the UI of the mobile computing device causes the determined registered 3D coordinates to be reformatted into a true 3D image display that may be rotated or translated to view the collected 3D data from a variety of perspectives.

14. The handheld device of of claim 1 in which the mobile computing device displays the results of live processing, the live-processing results being provided at least once per second.

15. The handheld device of claim 2 wherein the UI includes a viewer function, a control function, and a feedback function, the viewer function displaying image data from regions that have been scanned, the control function enabling control of the handheld device through user selections, the feedback function providing information to the user.

16. The handheld scanner of claim 10 wherein the mobile PC is further operable to stream colorized 3D data to the mobile computing device, the colorized 3D data obtained from the one or more processors by applying color obtained from a color camera to the determined 3D coordinates.

* * * * *